United States Patent
Li et al.

(10) Patent No.: US 10,622,808 B2
(45) Date of Patent: Apr. 14, 2020

(54) ELECTRICAL POWER TRANSMISSION AND DISTRIBUTION EQUIPMENT EVENT SEQUENCING SYSTEM

(71) Applicant: Accenture Global Services Limited, Dublin (IE)

(72) Inventors: Ming Li, Beijing (CN); Qin Zhou, Beijing (CN); Gary Boyle, London (GB); Chandra Shekhar, Gurgaon (IN)

(73) Assignee: Accenture Global Services Limited, Dublin (IE)

( * ) Notice: Subject to any disclaimer, the term of this patent is extended or adjusted under 35 U.S.C. 154(b) by 203 days.

(21) Appl. No.: 15/752,812

(22) PCT Filed: Aug. 28, 2015

(86) PCT No.: PCT/CN2015/088421
§ 371 (c)(1),
(2) Date: Feb. 14, 2018

(87) PCT Pub. No.: WO2017/035703
PCT Pub. Date: Mar. 9, 2017

(65) Prior Publication Data
US 2019/0207388 A1  Jul. 4, 2019

(51) Int. Cl.
*G06F 11/30*  (2006.01)
*H02J 3/00*  (2006.01)
(Continued)

(52) U.S. Cl.
CPC ............ *H02J 3/00* (2013.01); *G01N 21/1702* (2013.01); *G01R 31/003* (2013.01);
(Continued)

(58) Field of Classification Search
CPC .................................................. G01N 21/1702
See application file for complete search history.

(56) References Cited

U.S. PATENT DOCUMENTS

| | | | | |
|---|---|---|---|---|
| 2005/0012395 | A1* | 1/2005 | Eckroad | H02J 3/16 307/44 |
| 2009/0231152 | A1* | 9/2009 | Tung | G06F 1/206 340/660 |
| 2010/0219808 | A1* | 9/2010 | Steckley | G01R 19/2513 324/76.77 |

FOREIGN PATENT DOCUMENTS

CN          104424086 A          3/2015

OTHER PUBLICATIONS

International Search Report and Written Opinion of the International Search Authority dated May 27, 2016 in International Application No. PCT/CN2015/088421 (English language) (9 pp.).

\* cited by examiner

*Primary Examiner* — Phuong Huynh
(74) *Attorney, Agent, or Firm* — Brinks Gilson & Lione

(57) ABSTRACT

A method and systems for developing a composite sequence for electrical power transmission and distribution equipment in a power system are provided. The system includes a sequencing generation circuitry to generate a composite sequence for electrical power transmission and distribution equipment according to a demographics sub-sequence, a utilization sub-sequence, a maintenance sub-sequence, a performance sub-sequence, a criticality sub-sequence and a condition sub-sequence. The system also includes a first sub-model to predict a future equipment sequence of the electrical power transmission and distribution equipment in the power system and a second sub-model that generates the replacement control scheme for replacing utilities assets.

24 Claims, 33 Drawing Sheets

(51) Int. Cl.
  *G06Q 50/06* (2012.01)
  *G06Q 10/00* (2012.01)
  *G06Q 10/06* (2012.01)
  *G01N 21/17* (2006.01)
  *G01R 31/00* (2006.01)
  *G05B 23/02* (2006.01)
  *H04B 3/54* (2006.01)

(52) U.S. Cl.
  CPC ......... *G05B 23/0283* (2013.01); *G06Q 10/06* (2013.01); *G06Q 10/067* (2013.01); *G06Q 10/0635* (2013.01); *G06Q 10/0639* (2013.01); *G06Q 10/06312* (2013.01); *G06Q 10/20* (2013.01); *G06Q 50/06* (2013.01); *H04B 3/54* (2013.01); *G01N 2021/1704* (2013.01); *H02J 2003/007* (2013.01)

ELECTRICAL POWER TRANSMISSION AND DISTRIBUTION EQUIPMENT EVENT SEQUENCING SYSTEM

CROSS REFERENCE

The application is a national phase application of and claims priority to the International PCT Application No. PCT/CN2015/088421, filed on Aug. 28, 2015 with the State Intellectual Property Office of China, the entirety of which is incorporated herein by reference.

FIELD OF THE TECHNOLOGY

The disclosure relates to the field of control and monitoring of electrical power transmission and distribution equipment, and more particularly, it relates to a system and method for event sequencing for electrical power transmission and distribution equipment.

BACKGROUND OF THE TECHNOLOGY

Transmission and distribution utilities are operating a large number of high-value industrial assets, which have a critical impact both for the company's operating conditions and the security of energy supply. Moreover, potential risks could greatly shorten the life of these assets which are designed to serve for a few decades. Therefore, it is desirable to perform a comprehensive assessment of utility assets, identify early risks and make the repair and replacement decisions accordingly. However, this could be a challenging task, because: (1) it is difficult to make a comprehensive evaluation of the contemporary electrical equipment using a wide range of operation, test and maintenance data; and (2) it is challenging to optimize asset repair and replacement over a long period of time considering asset performance prediction coupled with operational constraints. A system and method for event sequencing for electrical power transmission and distribution equipment in order for asset health and risk assessment and asset replacement and upgrade simulation are needed.

SUMMARY

Examples of the present disclosure provide at least a computer system and a computer-implemented method for event sequencing of electrical power transmission and distribution equipment in a power system.

In one embodiment, the present disclosure provides a system for developing a composite sequence and a replacement control scheme for electrical power transmission and distribution equipment in a power system. The system may include a memory, a display, a communication interface, circuitry in communication with the memory, the communication interface and the display. The circuitry may include a monitoring subroutine for ingesting data received from monitored electrical power transmission and distribution equipment and storing said ingested data in the memory.

The system may include a first sub-model that may be configured to develop a a further equipment sequence for the electrical power transmission and distribution equipment in the power system, where the future equipment sequence may reflect a future condition of the electrical power transmission and distribution equipment, and the first sub-model is trained by using the ingested data that are received from monitoring the electrical power transmission and distribution equipment.

The system may also include a second sub-model configured to develop a replacement control scheme according to the trained first sub-model, where the replacement control scheme may be executed to replace utilities assets comprising electrical power transmission and distribution equipment in the power system, and where the second sub-model may be constructed by using a plurality of future maintenance constraints for the electrical power transmission and distribution equipment, and where an input of the first sub-model may be updated according to the constructed second model, and the developed condition sequence and an output from the developed replacement control scheme are displayed in a user interface on the display.

In another embodiment, the present disclosure provides an event sequencing system for electrical power transmission and distribution equipment in a power system. The system may include a memory, a display, a communication interface, a sequencing database and sequencing generation circuitry. The communication interface may be configured to receive: demographics data representing an equipment parameter that correlates to a life expectancy of the electrical power transmission and distribution equipment, utilization data that is used to detect when the electrical power transmission and distribution equipment exceeds its design capability, maintenance data representing costs that are associated with maintaining the electrical power transmission and distribution equipment, performance data containing forced outages that reflect reliability of the electrical power transmission and distribution equipment, criticality data comprising a look-up table populated with the criticality data that reflect importance of the electrical power transmission and distribution equipment in the power system, and condition data comprising test result data of the electrical power transmission and distribution equipment in the power system.

The sequencing database may be configured to store the demographics data, the utilization data, the maintenance data, the performance data criticality data and the condition data from the communication interface, and the sequencing generation circuitry in communication with the sequencing database, the sequencing generation circuitry may be configured to: develop a demographics sub-sequence by using the demographics data, develop a utilization sub-sequence by using the utilization data, develop a maintenance sub-sequence by using the maintenance data, develop a performance sub-sequence by using the performance data, develop a criticality sub-sequence by using the criticality data, develop a condition sub-sequence by using the condition data, develop a composite sequence for a plurality of utilities assets comprising electrical power transmission and distribution equipment in the power system by using the demographics sub-sequence, the utilization sub-sequence, the maintenance sub-sequence, the performance sub-sequence, the criticality sub-sequence, and the condition sub-sequence, and display the composite sequence in a first user interface.

The sequencing generation circuitry may also establish a first sub-model to predict a future equipment sequence by using the composite sequence, train the first sub-model by using a subset of the demographics data, the utilization data, the maintenance data, the performance data and the criticality data, construct a second sub-model by using a plurality of future maintenance constraints, develop a replacement control scheme of utilities assets comprising the electrical power transmission and distribution equipment in the power system according to the trained first sub-model and the second sub-model, display an output of the replacement control scheme in a second user interface of the display, and update an input of the first sub-model according to the constructed second sub-model.

Furthermore, in an embodiment, the present disclosure provides an event sequencing method for electrical power transmission and distribution equipment in a power system. the event sequencing method may include: receiving, from a communication interface, demographics data representing an equipment parameter that correlates to a life expectancy of the electrical power transmission and distribution equipment; receiving, from the communication interface, utilization data that is used to detect when the electrical power transmission and distribution equipment exceeds its design capability; receiving, from the communication interface, maintenance data representing costs that are associated with maintaining the electrical power transmission and distribution equipment; receiving, from the communication interface, performance data containing forced outages that reflect reliability of the electrical power transmission and distribution equipment; receiving, from the communication interface, criticality data comprising a look-up table populated with the criticality data that reflect importance of the electrical power transmission and distribution equipment in the power system, receiving, from the communication interface, condition data comprising test result data of the electrical power transmission and distribution equipment in the power system.

The method may also include storing the demographics data, the utilization data, the maintenance data, the performance data and the criticality data and the condition data from the communication interface into a sequencing database; developing, by sequencing generation circuitry a demographics sub-sequence by using the demographics data; developing, by the sequencing generation circuitry, a utilization sub-sequence by using the utilization data; developing, by the sequencing generation circuitry, a maintenance sub-sequence by using the maintenance data; developing, by the sequencing generation circuitry, a performance sub-sequence by using the performance data; developing, by the sequencing generation circuitry, a criticality sub-sequence by using the criticality data; developing, by the sequencing generation circuitry, a condition sub-sequence by using the condition data; developing, by the sequencing generation circuitry, a composite sequence for a plurality of utilities assets comprising electrical power transmission and distribution equipment in the power system by using the demographics sub-sequence, the utilization sub-sequence, the maintenance sub-sequence, the performance sub-sequence, the criticality sub-sequence and the condition sub-sequence; and displaying, by the sequencing generation circuitry, the composite sequence in a first user interface.

The method may further include establishing, a first sub-model to predict a future equipment sequence by using the composite sequence, training the first sub-model by using a subset of the demographics data, the utilization data, the maintenance data, the performance data and the criticality data, constructing a second sub-model by using a plurality of future maintenance constraints, developing a replacement control scheme of utilities assets comprising the electrical power transmission and distribution equipment in the power system according to the trained first sub-model and the second sub-model, displaying an output of the replacement control scheme in a second user interface, and updating an input of the first sub-model according to the constructed second sub-model.

BRIEF DESCRIPTION OF THE DRAWINGS

The system and/or method may be better understood with reference to the following figures and descriptions. Non-limiting and non-exhaustive descriptions are described with reference to the following drawings. The components in the figures are not necessarily to scale, emphasis instead being placed upon illustrating principles. In the figures, like referenced numerals may refer to like parts throughout the different figures unless otherwise specified.

DETAILED DESCRIPTION OF ILLUSTRATED EXAMPLES

Figure 1:
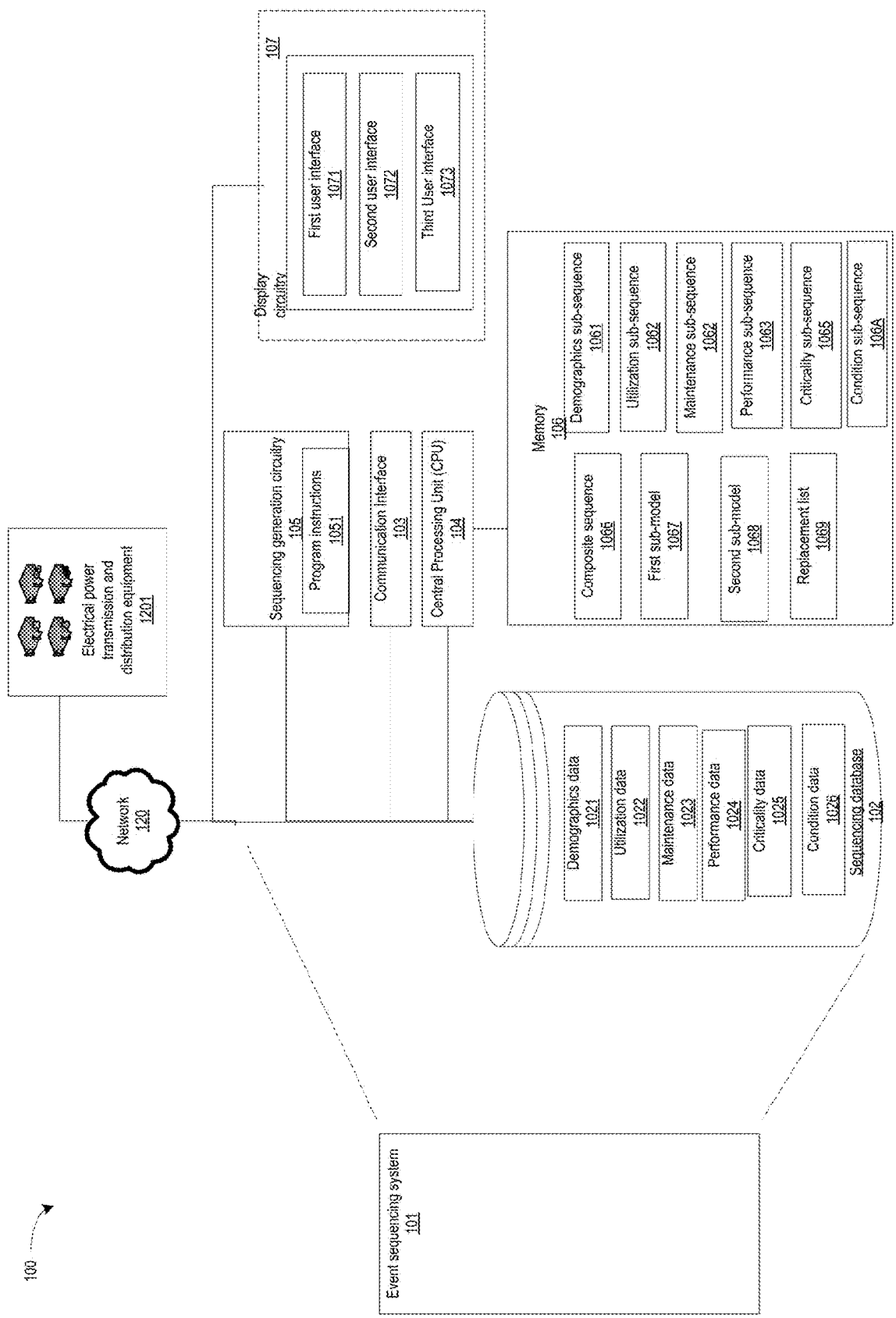
FIG. 1 shows an example system diagram that depicts the event sequencing for electrical power transmission and distribution equipment.

The purpose, technical proposal and advantages in the examples of the present disclosure will be clear and complete from the following detailed description when taken in conjunction with the appended drawings. The examples described herein are merely a part of examples of the present disclosure, not all examples. Persons skilled in the art may obtain all other examples without creative works, based on these examples.

Transmission and distribution utilities ("utilities") are operating a large number of high-value industrial assets such as electrical power transmission and distribution equipment. Such industrial assets may have a critical impact both for the company's operating conditions and the security of energy supply. Potential risks could greatly shorten the life of these assets which are designed to serve for a few decades. Therefore, it is desirable to perform a comprehensive assessment of utility assets, identify early risks and make the repair and replacement decisions accordingly.

However, the comprehensive assessment of utility assets and early risks identification to make the repair and replacement decision may be a challenging task, because: (1) Utilities may be managing huge fleets of high value assets in large geographical areas. It may be hard to evaluate the risks of the asset itself as well as the external factors, such as the loading levels and the downstream electricity users. (2) The contemporary electrical equipment may generate large volumes of data from investment, operation, test, maintenance, and customer related aspects. As such, the planning staff typically may lack sufficient knowledge and tools to carry out the complex analysis based on the enormous amounts of data. (3) Consistency and transparency may be needed in long-term asset management. However, currently many utilities may still rely on local knowledge base (such as experienced staff) to make decisions. But, differing opinions from different persons may lead to inconsistent practices. Also, experienced employees may change jobs or retire from work, and may cause knowledge loss. (4) Utilities need to increase quality of service while reducing cost when maintaining and upgrading the network. However, it may be a challenging task to optimize the investments and make data-driven decisions, considering the asset health degradation, various constraints such as financial constraints and different investment strategies.

The current disclosure provides a system and method of event sequencing for electrical power transmission and distribution equipment to provide a sequence for asset health and risk assessment and asset replacement and upgrade simulation. A set of risk factors and calculation algorithms may be designed to provide event sequencing for a comprehensive assessment of asset risk by utilizing multiple data points and tailored non-linear equations. Furthermore, the investment simulation framework may be developed for event sequencing including a first sub-model (an asset sub-model) and a second sub-model (an investment sub-model). The output of one sub-model is linked to the input of another sub-model periodically, which forms a close loop to forecast device health under a given initial condition and various constraints including financial constraints. The disclosed system and method may provide a comprehensive evaluation of asset health and identify potential risks. The disclosed system and method may also prioritize the asset replacement/upgrade plan and give better insight for long-term asset investment.

FIG. 1 shows an example system diagram that depicts the event sequencing for electrical power transmission and distribution equipment 100. As shown in FIG. 1, the event sequencing system 101 may include a communication interface 103, a sequencing database 102 and a sequencing generation circuitry 105. The event sequencing system 101 may also include one or more processors or central processing units (CPU) 104 and memory 106 that may be either transitory or non-transitory.

The communication interface 103 as shown in FIG. 1 may receive demographics data 1021, utilization data 1022, maintenance data 1023, performance data 1024, criticality data 1025 and condition data 1026. The communication interface 103 may receive data from electrical power transmission and distribution equipment 1021 via network 120. The received demographics data 1021, utilization data 1022, maintenance data 1023, performance data 1024, criticality data 1025 and condition data 1026 may be stored in sequencing database 102 as shown in FIG. 1.

Demographics data 1021 may represent an equipment parameter that may correlate to a life expectancy of the electrical power transmission and distribution equipment. Utilization data 1022 may be used to detect when the electrical power transmission and distribution equipment exceeds its designed capability. Maintenance data 1023 may represent costs that may be associated with maintaining the electrical power transmission and distribution equipment. Performance data 1024 may contain forced outages that may reflect reliability of the electrical power transmission and distribution equipment. And, criticality data 1025 may comprise a look-up table that may be populated with the criticality data that may reflect importance of the electrical power transmission and distribution equipment in the power system.

The sequencing generation circuitry 105 may be in communication with the sequencing database 102 and the display circuitry 107 that may include a first user interface 1071, a second user interface 1072 and a third user interface 1073. The sequencing generation circuitry 105 may include program instructions 1051 and the sequencing generation circuitry 105 may be in communication with CPU 104, memory 106 and sequencing database 102. The program instructions 1051 may be executed by CPU 104 and the program instructions 1051 may be may be configured to carry out the following tasks, as examples: develop a demographics sub-sequence 1061 by using the demographics data 1021, develop a utilization sub-sequence 1062 by using the utilization data 1022, develop a maintenance sub-sequence 1063 by using the maintenance data 1023, develop a performance sub-sequence 1064 by using the performance data 1024, develop a criticality sub-sequence 1065 by using the criticality data 1025 and develop a condition sub-sequence 106A by using the condition data 1026.

Furthermore, the program instructions 1051 of the sequencing generation circuitry 105 may be configured to, as further examples: develop a composite sequence 1066 for a plurality of utilities assets that may include electrical power transmission and distribution equipment 1201 in the power system by using the demographics sub-sequence 1061, the utilization sub-sequence 1062, the maintenance sub-sequence 1063, the performance sub-sequence 1064, the criticality sub-sequence 1065 and condition sub-sequence, and display the composite sequence 1066 in a first user interface 1071. However, the development of a composite sequence 1066 may only use one or more of sub-sequences. For example, a composite sequence 1066 may be developed by using demographics sub-sequence 1061, the utilization sub-sequence 1062, the maintenance sub-sequence 1063, the performance sub-sequence 1064 and the criticality sub-sequence 1065.

The program instructions 1051 of the sequencing generation circuitry 105 may also be configured to and establish a first sub-model 1067 to predict a future equipment sequence by using the composite sequence 1066, train the first sub-model 1067 by using a subset of the demographics data 1021, the utilization data 1022, the maintenance data 1023, the performance data 1024 and the criticality data 1025, and construct a second sub-model 1068 by using a plurality of future maintenance constraints, develop a replacement control scheme 1069 of utilities assets that may include the electrical power transmission and distribution equipment 1021 in the power system according to the trained first sub-model 1067 and the second sub-model 1068, display the replacement control scheme 1069 in a second user interface 1072, and update the first sub-model 1067 according to the constructed second sub-model 1068. The replacement control scheme 1069 may be a replacement control module or a replacement control circuitry.

As additional examples, the communication interface 103 may be configured to further receive condition data that may include dissolved gas data or insulation resistance data for the electrical power transmission and distribution equipment. The program instructions 1051 of the sequencing generation circuitry 105 may be further configured to develop a Duval Triangle by using the dissolved gas data and develop an insulation resistance sub-sequence by using the insulation resistance data, and further develop the composite sequence 1066 by using the Duval Triangle and the insulation resistance sub-sequence.

Figure 2:
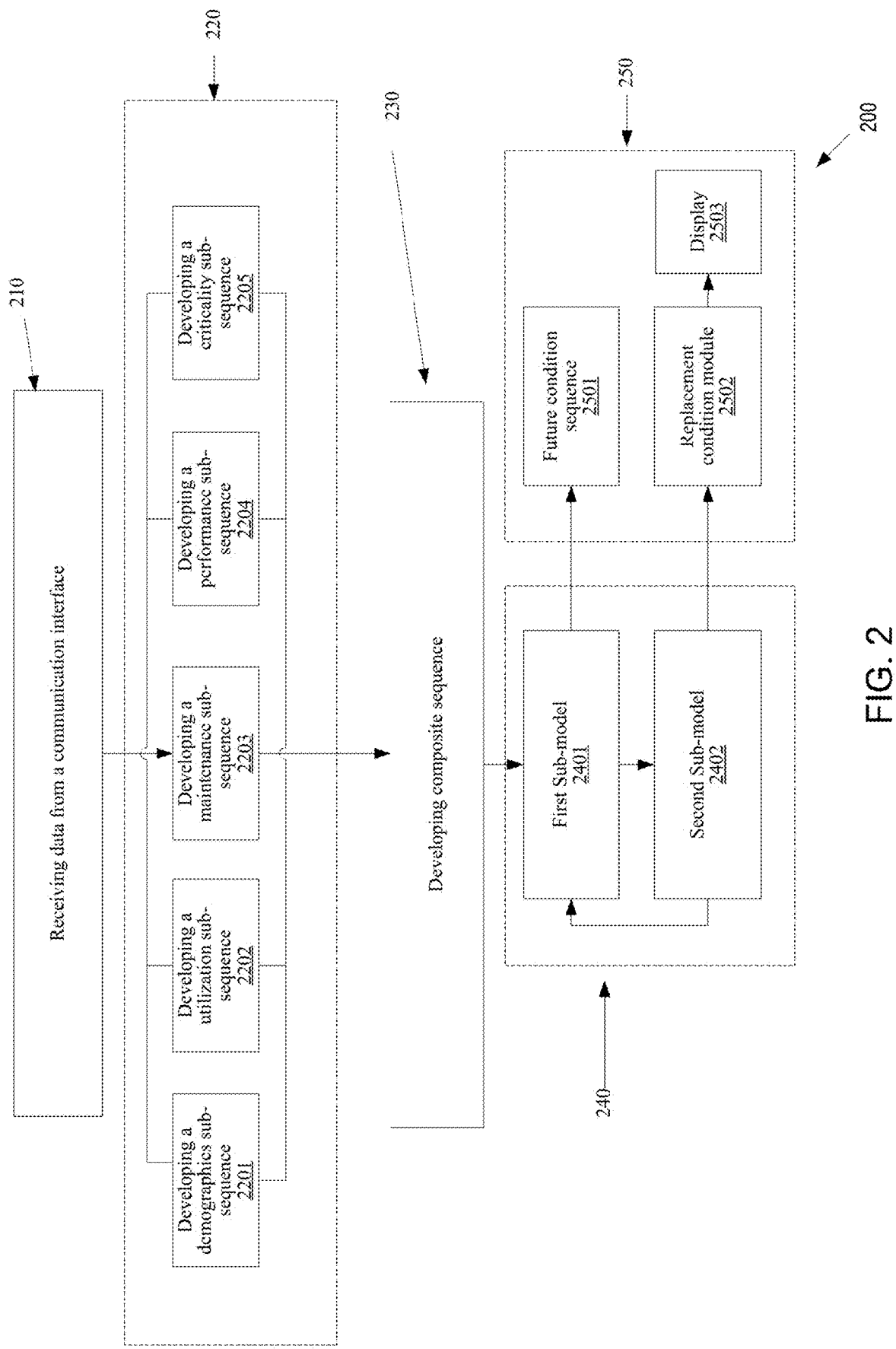
FIG. 2 illustrates an example of high level logic flow of an event sequencing method for electrical power transmission and distribution equipment.

FIG. 2 illustrates an example of logic 200 of an event sequencing method for electrical power transmission and distribution equipment. The logic may be implemented in the system 100 shown in FIG. 2, for instance, as the program instructions in the sequencing generation circuitry 105.

The logic 200 may include receiving data from a communication interface (Step 210). The receiving step 210 may include receiving from the communication interface demographics data that may represent an equipment parameter that may correlate to a life expectancy of the electrical power transmission and distribution equipment, receiving from the communication interface utilization data that may be used to detect when the electrical power transmission and distribution equipment exceeds its design capability, receiving from the communication interface maintenance data that may represent costs that may be associated with maintaining the electrical power transmission and distribution equipment, receiving from the communication interface performance data that may contain forced outages that may reflect reliability of the electrical power transmission and distribution equipment, and receiving from the communication interface criticality data that may comprise a look-up table populated with the criticality data that may reflect importance of the electrical power transmission and distribution equipment in the power system.

The logic 200 may include storing data into a sequencing database. The logic 200 may store the demographics data, the utilization data, the maintenance data, the performance data and the criticality data from the communication interface into the sequencing database.

The logic 200 may include the step of developing sub-sequences and composite sequence 220. The developing step 220 may include developing by sequencing generation circuitry a demographics sub-sequence by using the demographics data 2201, developing by the sequencing generation circuitry a utilization sub-sequence by using the utilization data 2202, developing by the sequencing generation circuitry a maintenance sub-sequence by using the maintenance data 2203, developing by the sequencing generation circuitry a performance sub-sequence by using the performance data 2204, developing by the sequencing generation circuitry a criticality sub-sequence by using the criticality data 2205.

The logic 200 may include steps for developing by the sequencing generation circuitry a composite sequence 230. The step 230 may include the step of developing the composite sequence (or composite risk index individually) for a plurality of fixed assets comprising electrical power transmission and distribution equipment in the power system by using the demographics sub-sequence, the utilization sub-sequence, the maintenance sub-sequence, the performance sub-sequence and the criticality sub-sequence, and displaying by the sequencing generation circuitry the composite sequence in a first user interface.

The logic 200 may include establishing, training and constructing sub-models 240. The establishing step 240 may include establishing a first sub-model 2401 to predict a future equipment sequence 2501 by using the composite sequence, training the first sub-model by using a subset of the demographics data, the utilization data, the maintenance data, the performance data and the criticality data. The training of the first sub-model may or may not use data received from previous steps. Step 240 may also include constructing a second sub-model 2402 by using a plurality of future maintenance constraints (not shown). The result of second sub-model 2402 may be fed back to update the input of the first sub-model 2401. The result of the updated first sub-model 2401 may further be used to update the input of the second sub-model 2402.

The logic 200 may include developing and displaying the outputs of sub-models 250. The outputs of sub-models may include a replacement control scheme 2502 and a future equipment sequence 2501. Step 250 may include developing a replacement control scheme 2502 of utilities assets that may comprises the electrical power transmission and distribution equipment in the power system according to the trained first sub-model and the second sub-model, displaying the replacement control scheme in display 2503 such as a user interface.

Further, the logic 200 may further include receiving from the communication interface condition data that may include dissolved gas data or insulation resistance data for the electrical power transmission and distribution equipment, developing a Duval Triangle by using the dissolved gas data and developing an insulation resistance sub-sequence by using the insulation resistance data, and developing the composite sequence by using the Duval Triangle and the insulation resistance sub-sequence.

As another example of the disclosed solution for an event sequencing system or method for electrical power transmission and distribution equipment in a power system, the solution may consist of two major parts: 1) the asset health and risk analytics based on risk indices; and, 2) long term model simulation including investment scenario simulation based on risk index prediction and different investment strategies.

1. Asset Health and Risk Analytics

The asset health and risk analytics may be derived with the consideration of key asset risk indices (and for developing sub-sequences of assets), including demographics, economics, condition, performance, utilization, criticality, obsolescence and Health, Safety and Environment (HS&E). The key risk indices may be aggregated to a composite risk index (and for developing a composite sequence of assets), which may be designed to draw attention to the high risk assets and populations/areas/hierarchies.

Figure 3:
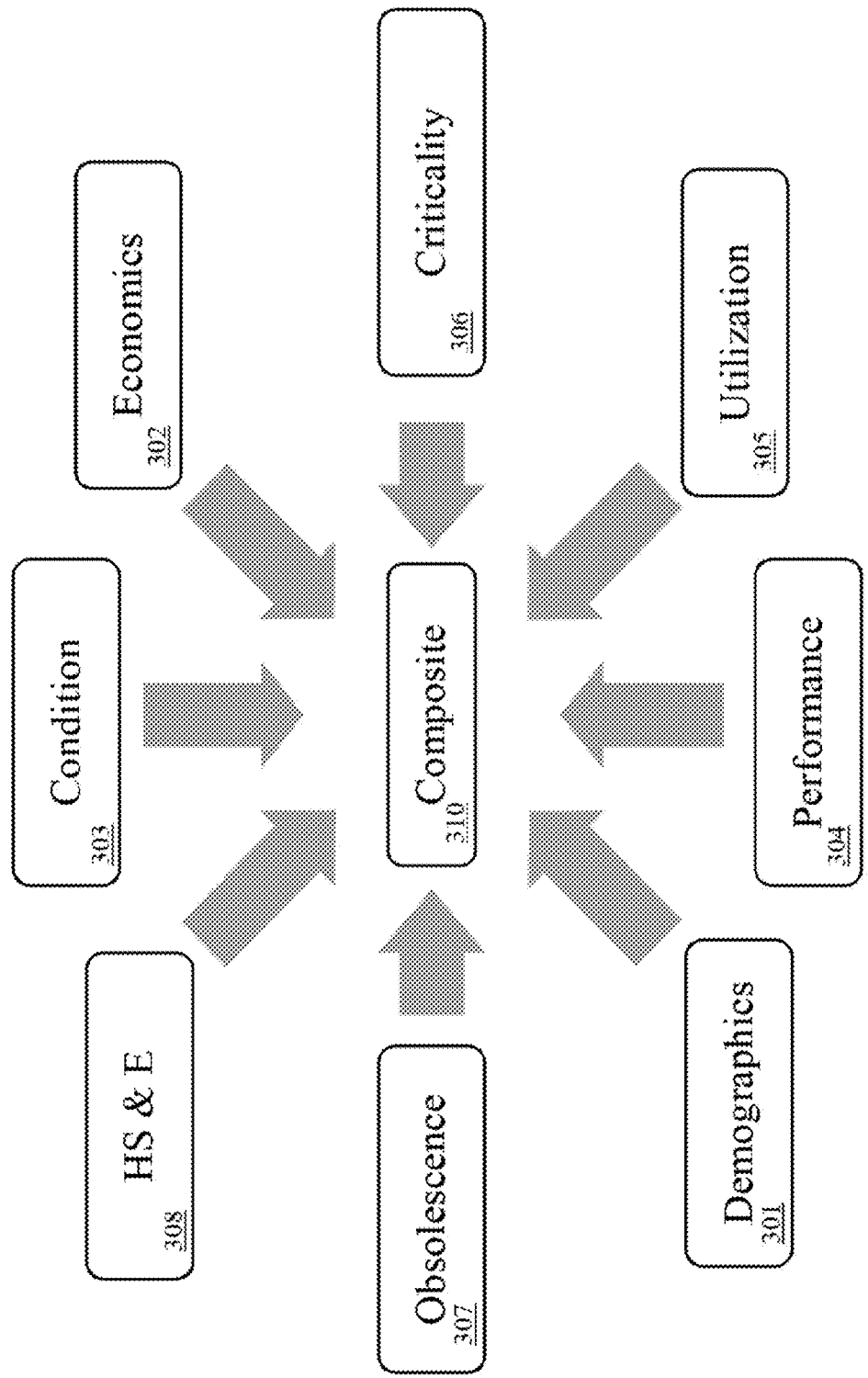
FIG. 3 illustrates an example of relationships between key risk indices and the composite index.

FIG. 3 illustrates an example of relationships between key risk indices and the composite index 300. As shown in FIG. 3, the risk indices of demographics 301, economics 302, condition 303, performance 304, utilization 305, criticality 306, obsolescence 307 and Health, Safety and Environment (HS&E) 308 may be used to develop the composite risk index 310.

Figure 4:
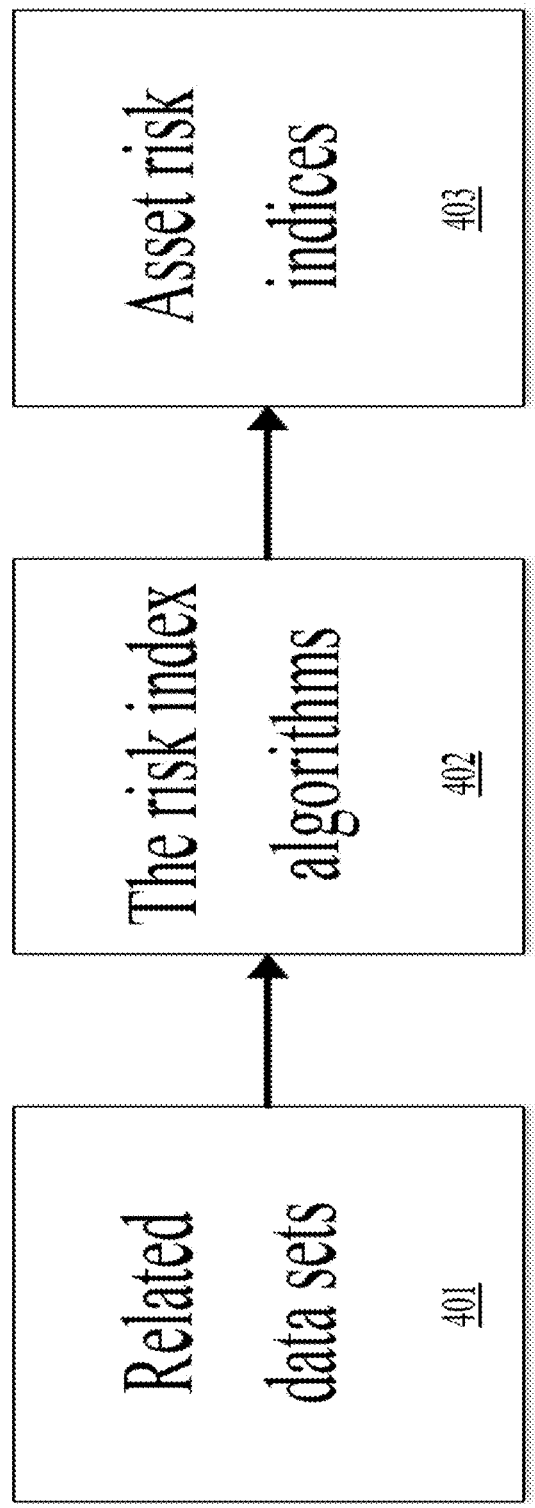
FIG. 4 illustrates an example process to develop an asset risk index.

Each asset class may have its own risk index, and different algorithms may be used for different asset classes. FIG. 4 illustrates an example process to develop an asset risk index 400. As shown in FIG. 4, related data sets 401 for the utilities assets including electrical power transmission and distribution equipment in a power system may be used to generate asset risk indices 403 by employing the risk index algorithms 402.

As an example, the 0-100 risk index may be developed by using various algorithms and related data sets for each asset class. The Risk Indices (ranging 1 to 100) may be illustrated as table 1.

TABLE 1

| Composite Index | Asset Condition Categories | Asset Risk Categories |
|---|---|---|
| >70 to 100 | Very Poor | Very high Risk |
| >50 to 70 | Poor | High Risk |
| >30 to 50 | Fair | Fair Risk |
| >15 to 30 | Good | Low Risk |
| >1 to 15 | Very Good | Very Low Risk |
| 0 | | No data |

As such, a framework may be developed to manage the risk index algorithms for different assets. The framework may be designed to be flexible and open to the end user. The framework may cover most asset classes of the lines and stations of transmission and distribution networks. A framework may be embodied as a composite index to develop a composite sequence of assets based on risks of utilities assets (sub-sequences) including electrical power transmission and distribution equipment in a power system. Table 2 shows examples of risk indices for various categories (may be called sub-sequences) and the composite index (may be called composite sequence).

2. Model Simulation

Figure 5:
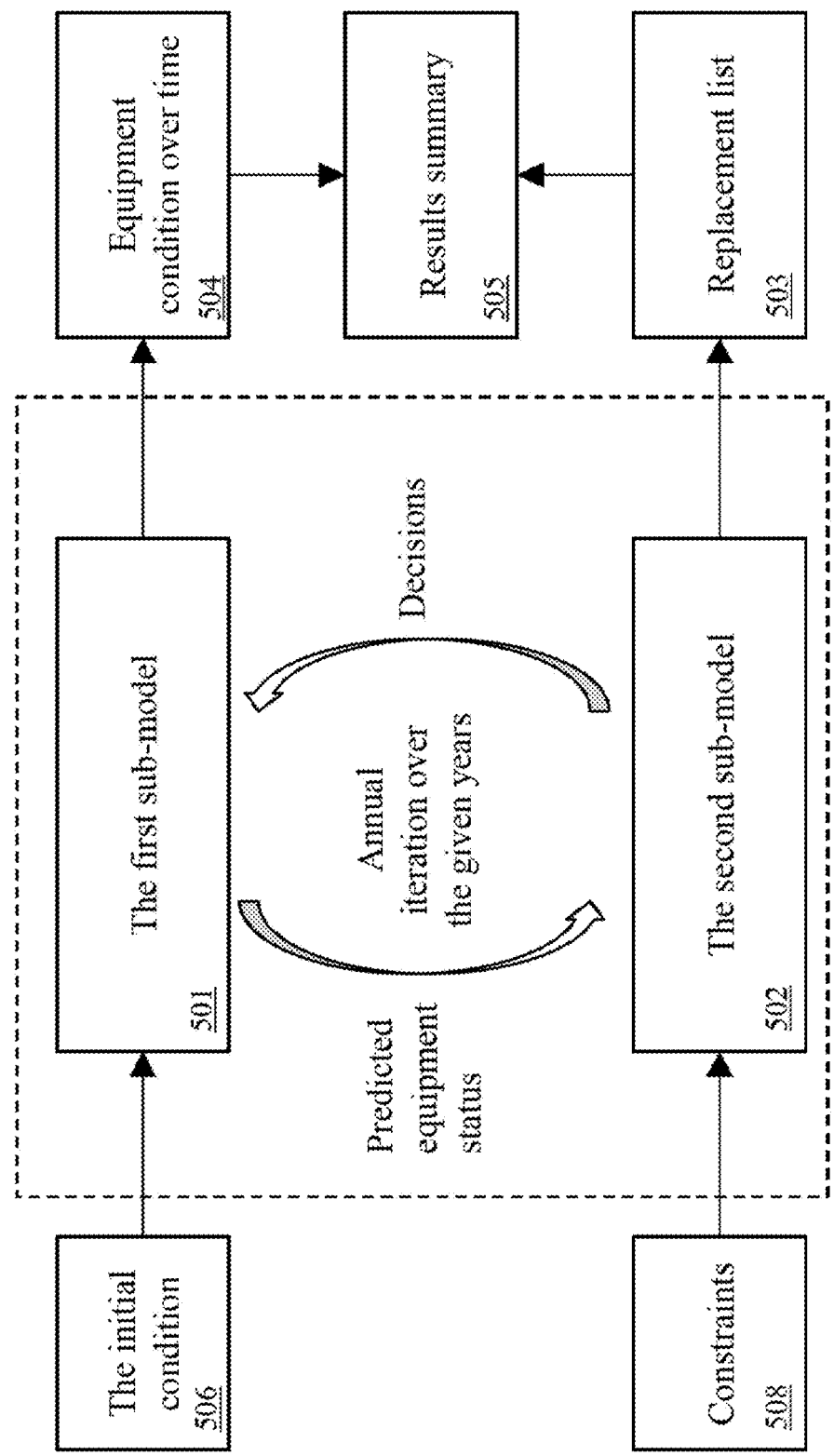
FIG. 5 shows an example of an asset simulation model.

The model simulation may be an asset investment simulation framework that may be developed to support the annual asset upgrade/replacement decision-making processes as well as give better insight into the long term planning. FIG. 5 shows an example of an asset simulation model. As shown in FIG. 5, the framework may have a first sub-model (e.g., an asset sub-model) 501 and a second sub-model (e.g., an investment sub-model) 502. The second sub-model 502 may make a strategic investment decision based on the previous asset health condition and other constraints 508. The constraints 508 may include the given quota/budget 508. The first sub-model 501, which may be trained using real data before simulation or initial condition 506, may predict the asset health condition in the next period based on previous asset health condition and the result output from the second sub-model 502. The output of the sub-models may be fed into each other periodically, yielding the simulation results over a given period of time. The second sub-model 502 may output a replacement control scheme 503 to suggest the replacements for utilities assets at a future time point. The first sub-model 501 may output as equipment condition over time 504. The equipment condition may be an asset condition to list the asset conditions for a period of time in the future for utilities assets. The results summary 505 may be generated by using both the replacement control scheme 503 and the equipment condition over time 504 as shown in FIG. 5

An embodiment of the simulation model may be a system that may develop a composite sequence and a replacement control scheme for electrical power transmission and distribution equipment in a power system. The system may include a first sub-model that may be configured to develop the composite sequence for the electrical power transmission and distribution equipment in the power system where the composite sequence may reflect a future equipment sequence of the electrical power transmission and distribution equipment. The first sub-model may be trained by using data that are associated with the electrical power transmission and distribution equipment.

The system may include a second sub-model that may be configured to develop the replacement control scheme according to the trained first sub-model where the replacement control scheme may be used to replace utilities assets including electrical power transmission and distribution equipment in the power system. The second sub-model may be constructed by using a plurality of future maintenance constraints for the electrical power transmission and distribution equipment, and the first sub-model may be updated according to the constructed second model, and the developed composite sequence and the developed replacement control scheme may be displayed in a user interface. The replacement control scheme may be a replacement control module or a replacement control circuitry.

Also, the first sub-model may be trained by using a subset of the data comprising demographics data, utilization data, maintenance data, performance data and criticality data for the electrical power transmission and distribution equip-

TABLE 2

| Asset | Condition | Demographics | Criticality | Performance | Utilization | Economics | Composite |
|---|---|---|---|---|---|---|---|
| TF 1 | 10 | 40 | 20 | 90 | 20 | 90 | 44.1 |
| TF 2 | 100 | 25 | 50 | 30 | 50 | 65 | 59.7 |
| TF 3 | 25 | 50 | 75 | 50 | 30 | 35 | 39.5 | ment. The input of the second sub-model may be further updated according to the updated first sub-model. The inputs of the first sub-model and the second sub-model may be updated iteratively.

The proposed asset health analysis may provide a comprehensive evaluation of asset health and identify potential risks. More specifically, the asset health analysis may help to: realize a more comprehensive data-driven risk assessment, increase the effectiveness of investment decisions and improve cost effectiveness in Capital spend (CapEx) and Operational spend (OpEx), and capture the knowledge, and promote consistent, transparent and collaborative decision making. In addition, the asset investment simulation may prioritize the asset replacement/upgrade plan and may give better insights for long-term asset condition based on the given investment. The asset investment simulation may also compare multiple scenarios to assess the impacts of different levels of replacement on asset population outcomes in terms of asset health.

The disclosed asset health and risk analytics may provide a framework for a comprehensive and consistent assessment of asset risks from related data sets. The framework may also be designed to be transparent and flexible (e.g. configurable algorithms, adjustable weightings, and addition/subtraction of sub-indices). Further, the disclosed asset health and risk analytics may provide a set of risk index calculation methods and algorithms, utilizing multiple related data sets and tailored non-linear equations.

The disclosed investment simulation may provide a framework including an asset sub-model and an investment sub-model. The two sub-models may form a closed loop to make periodical forecasts on asset health status under a given initial condition and constraints including financial constraints. Also, the asset sub-model may be trained using real data by supervised machine learning methods, such as generalized linear regression, smoothing models, tree related models or neutral networks.

As an example for showing asset health and risk analytics, risk index algorithms for 115 kV Step-down transformer may be used. The risk index algorithms may be used to develop sub-sequences and composite sequences for the transformers. Table 3 provides example definitions for various risk indices that may be generated for the transformers.

A composite risk index (or a composite sequence) may be generated by using various risk indices that are shown in Table 3. The composite risk index may be an aggregated compilation of key risk indices associated with an asset that would have an impact on the utility's business objectives. The composite risk index may be designed to draw attention to the high risk assets and populations/areas/hierarchies for investment planning actions. The composite risk index may be derived with the consideration of key asset risk indices, including Age and Economics, Asset Condition, Performance, Utilization, Criticality, Obsolescence (including design defects) and HS&E (Health, Safety and Environment).

Demographics risk index may be developed by using the following formula:

$RI=1$, if $X \Leftarrow EOL/2$ $RI=100*2(X-EOL/2)/EOL$, if $EOL/2<X \Leftarrow EOL$ $RI=100$, if $X>EOL$ Where,
X: asset in service year
EOL: estimated average life
RI: risk index The initial risk index may be further normalized by using a proposed algorithm. The failure rate of a transformer as the function of its age may not be really a two piecewise linear function. So a proposed formula 1 with the Risk Index as an exponential function of age may be as follows:

$$RI = 100 \times \left(1 - e^{-\left(\frac{t}{b}\right)^a}\right) \quad \text{Formula 1}$$

Where,
a: shape parameter
b: scale parameter

The shape parameter (a) and scale parameter (b) may be set as following example:

$a=5$ $b=0.75*EOL/(-\log(0.5))^{\wedge}(1/a)$

TABLE 3

| | |
|---|---|
| Demographics | Information such as an asset's age, class type, voltage, manufacturer, model etc. to enable basic understanding of the asset and prospective correlation to asset end-of-life |
| Utilization | Utilization is a means to detect when an asset exceeds its engineering/designed capability, owing to changing power system conditions and needs |
| Economics | The cost incurred by an asset above some reference level may point to technical as well as economic concerns regarding the specific asset in the group of similar assets |
| Performance | Power system reliability is affected when an asset is removed from service of the electricity system. Only forced outages are considered (i.e. excluded planned maintenance outages) |
| Criticality | Reflects the importance of the asset in the power system and client's business. Asset criticality indices in the function of the asset in the power system as well as potential business impacts |
| Condition | Detecting and quantifying long-term asset degradation. The rate of change in asset condition over time helps to identify the extent of maintenance, refurbishment, or replacement requirements |
| Health and Safety | The risk of H&S issues due to the level of low frequency noise, hazardous gas etc. beyond recommended levels generated from TX |
| Obsolescence | The risk for the asset being repaired/replaced due to critical parts no longer being available for repair |

Figure 6:
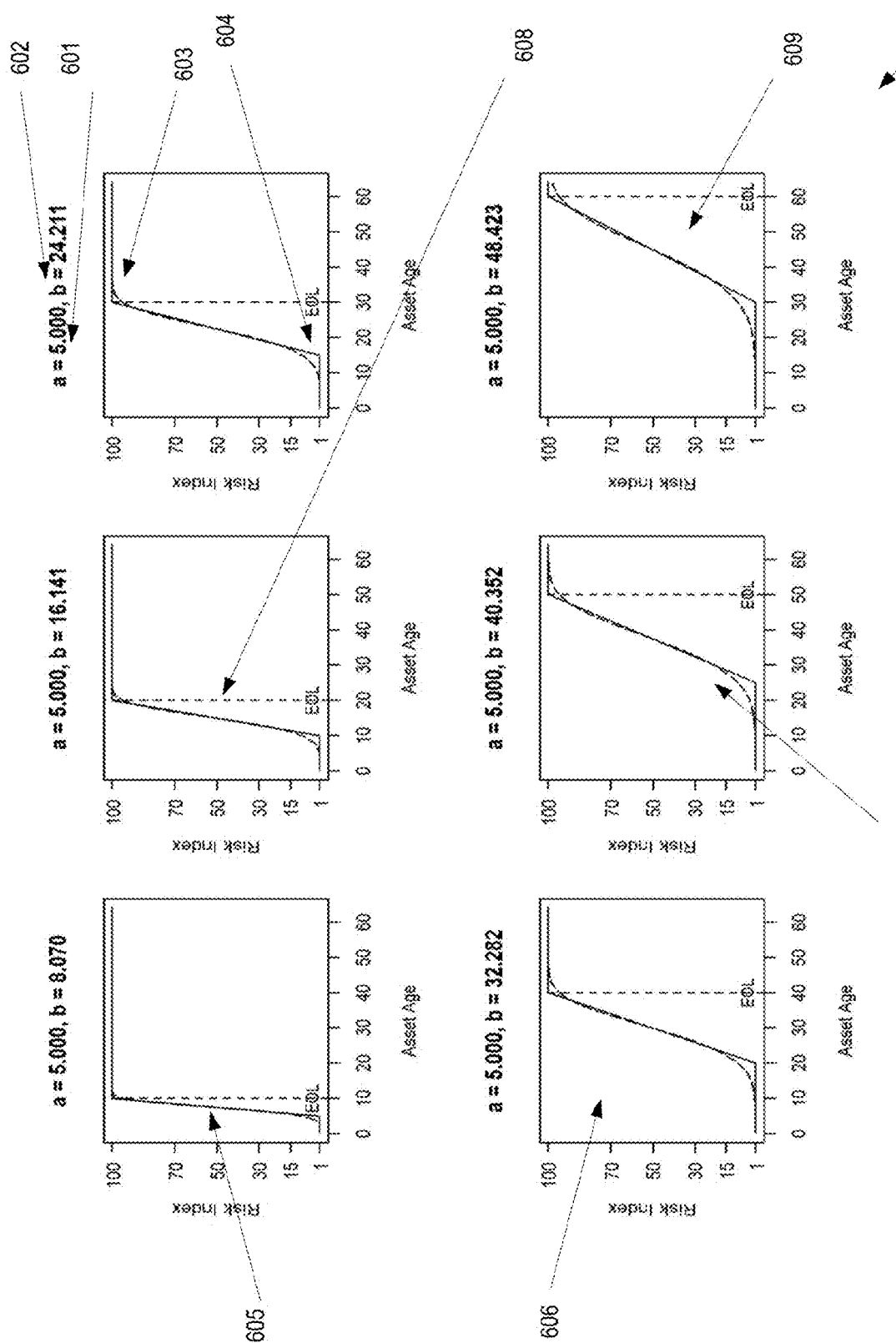
FIG. 6 illustrates an example of showing the risk indices displayed in a user interface with a constant shape parameter and different scale parameters.

FIG. 6 illustrates an example of showing the risk indices displayed in a user interface for demographics risk index 600. As shown in FIG. 6, the shape a 601 has a constant value of 5.000, the scale parameter b 602 varies, curve 605, curve 606, curve 607, curve 608, curve 609 have different value for b. According to FIG. 6, the curve 603 for the risk index and asset age may be different for different scale parameters b 602. In FIG. 6, the straight lines 604 show the result of initial algorithm and the curves 603 show the proposed algorithm.

Utilization risk index may be developed by using the selected input data. The transformer's historical heavy loading and overloading conditions may be used as the main input data for developing the utilization risk index. For example, the heavy loading may be when the load is 80%-100% of rated capacity, where 80% is a configurable parameter, with the default may be (80%-100%). The overloading condition may be the load is >100% of rated capacity.

The algorithm for developing the utilization risk index may be a piecewise function of the three conditions:
1. If no heavy or overloading happened in the past, the risk index may be in the range of [1, 30] that indicates very good or good condition for the transformers, the exact RF value will be calculated based on the historical loading values verse the rated capacity.
2. If heavy loading happened but no overloading happened in the past, the risk index may be in the range of (30, 50) which indicates Fair condition for the transformers.
3. If overloading happened in the past, the risk index may be in the range of [50, 100], which indicates Poor or Very Poor condition for the transformers.

In order to calculate the risk index for condition 2 or 3, two variables may be considered:
Smax: the maximum measured heavy or overloading value
Sa: the average measured heavy or overloading value As an example of the calculation of the risk index for overloading condition with:
A1 weight of Smax
A2 weight of Sa, A1+A2=1
Sr the rated capacity in MVA or kVA
Pi active power of ith measurement
Qi reactive power of ith measurement
Si square root of (Pi2+Qi2)
N number of measured overloading records, so i=1, 2, 3, . . . , N
Then, $$Sa = \text{Sum}(Si-Sr)/(N*Sr) \, i=1,2,3,\ldots,N \quad \text{Formula 2}$$

And, $$RF' = 100*[A1*S\max/(Sr) + A2*Sa] \quad \text{Formula 3}$$

Because risk index may be great than 100, the results may be normalized to the range of [50, 100].

In order to develop the utilization risk index, the data quality checking may be carried out on raw data received. The bad data points (extreme data) may create a potential risk of biased risk index.

The Data preparation and condition judgment may include the following steps:
1. Retrieve the input data Sr (rated capacity), Q (reactive power), P (active power)
2. If $S_r \leq 0$, then RF=0, end of algorithm.
3. Calculate a new data $S = \sqrt{Q^2 + P^2}$
4. Count the number of data points in S as N
5. Calculate $S_{max} = \max(S)$ $$S_{max} \in [0, 0.8 \times S_r) \rightarrow \text{Condition 1}$$

$$S_{max} \in [0.8 \times S_r, S_r) \rightarrow \text{Condition 2}$$

$$S_{max} \in [S_r, 100 \times S_r) \rightarrow \text{Condition 3}$$

Otherwise, RI=0, end of algorithm.
Condition 1:

$$RI = 30 \times \frac{\text{average}(S)}{S_r \times 0.8} \quad \text{Formula 4}$$

Condition 2:
1. Define $S_H$ as a subset of S, including all the measured heavy loading value
2. Count the number of data points in $S_H$ as $N_H$
3. Calculate $S_a = \text{average}(S_H)$ $$RI = 30 + 20 \times \left( A1 \times \frac{\frac{S_a}{S_r} - 0.8}{0.2} + A2 \times \frac{\frac{S_{max}}{S_r} - 0.8}{0.2} \right) \quad \text{Formula 5}$$

$$A1 = 0.7, A2 = 0.3$$

Condition 3:
1. Define $S_O$ as a subset of S, including all the measured overloading value
2. Count the number of data points in $S_O$ as $N_O$
3. Calculate $S_a = \text{average}(S_O)$ $$RI = 50 + 50 \times \left[ A1 \times \left( \frac{S_a}{S_r} - 1 \right) + A2 \times \left( \frac{S_{max}}{S_r} - 1 \right) \right] \quad \text{Formula 6}$$

$$A1 = 5, A2 = 3$$

4. If RI>100, set RI=100

Figure 7:
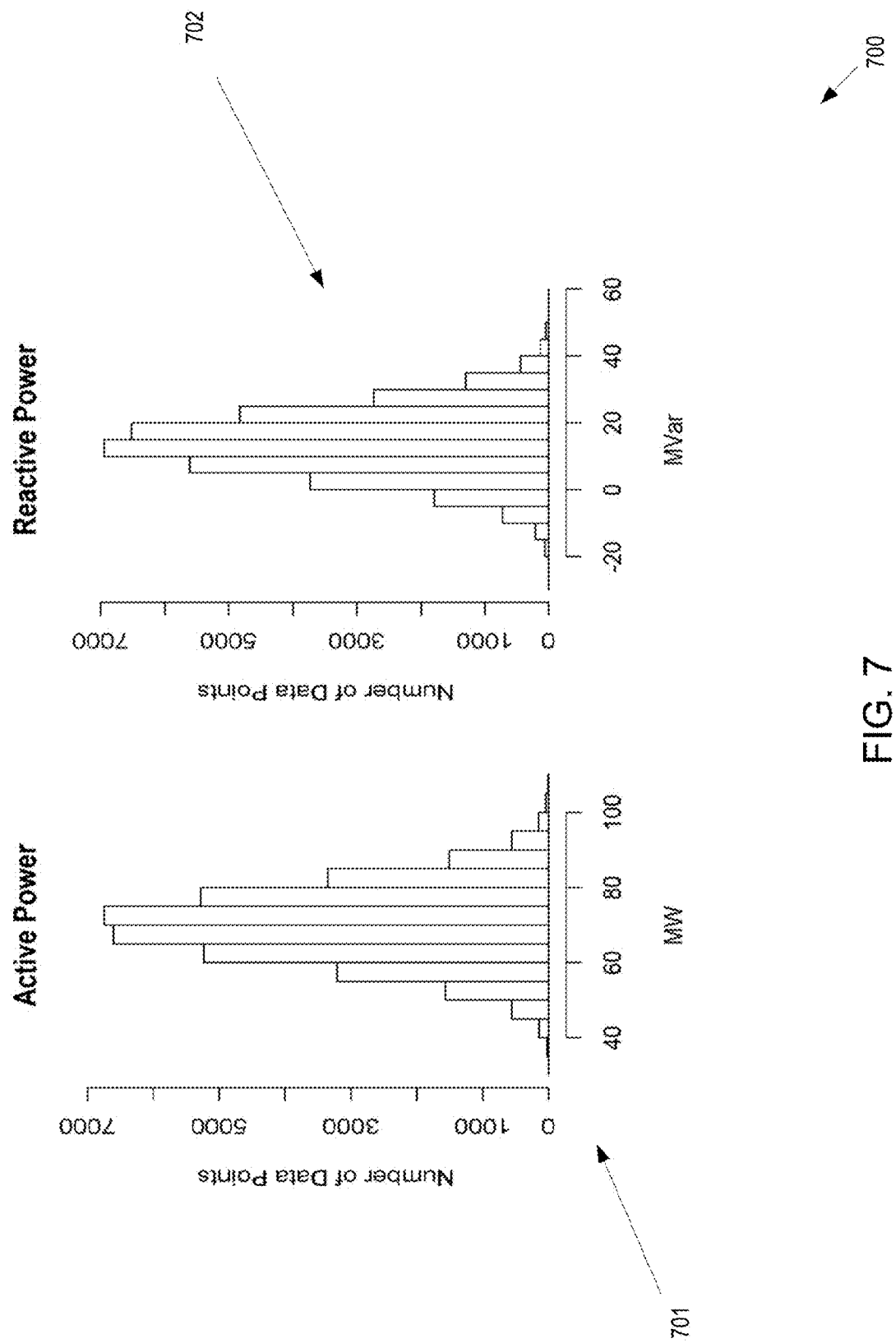
FIG. 7 shows an example of numbers of data points that illustrate active power and reactive power.
Figure 8:
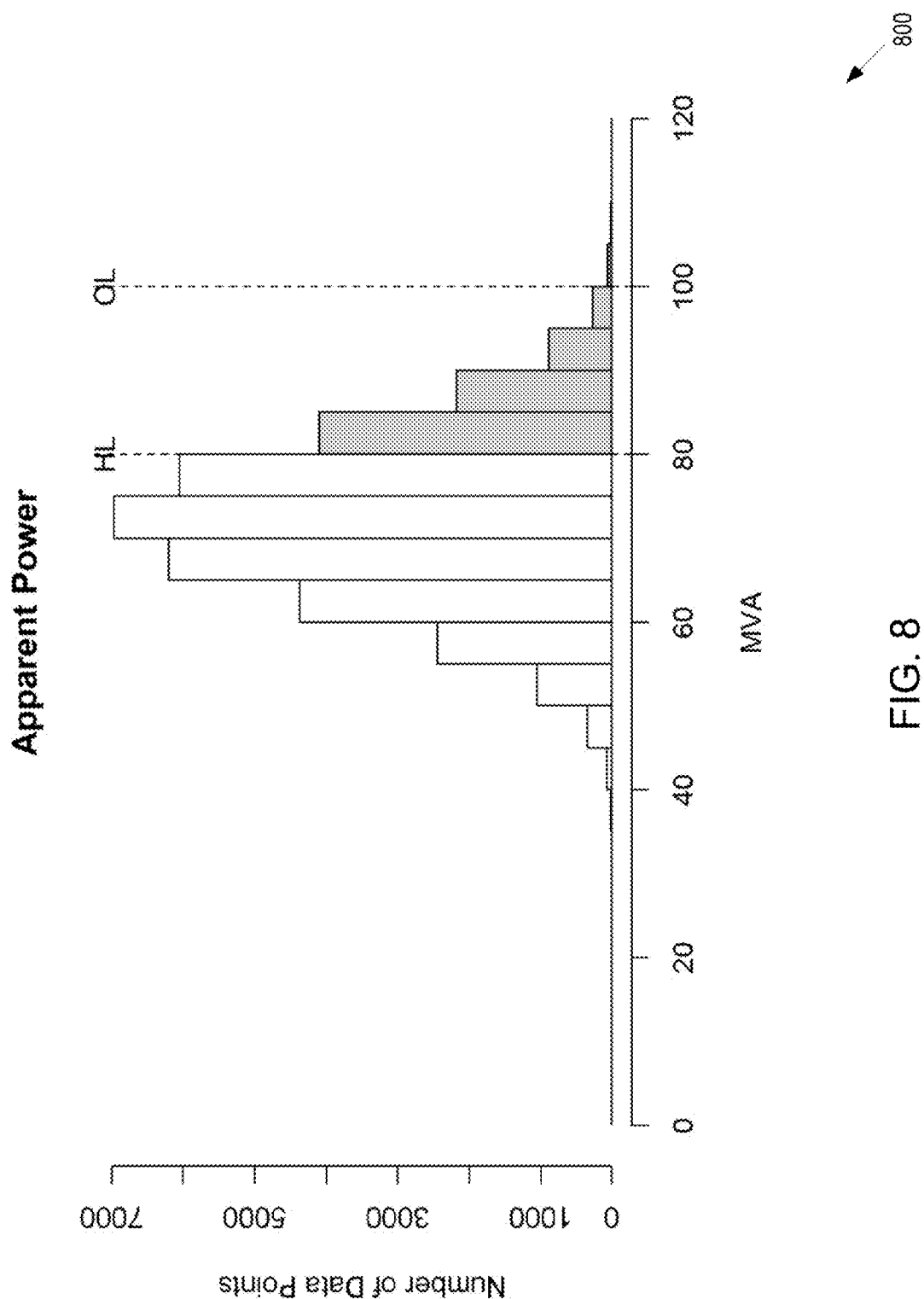
FIG. 8 shows an example of numbers of data points that illustrate apparent power.
Figure 9:
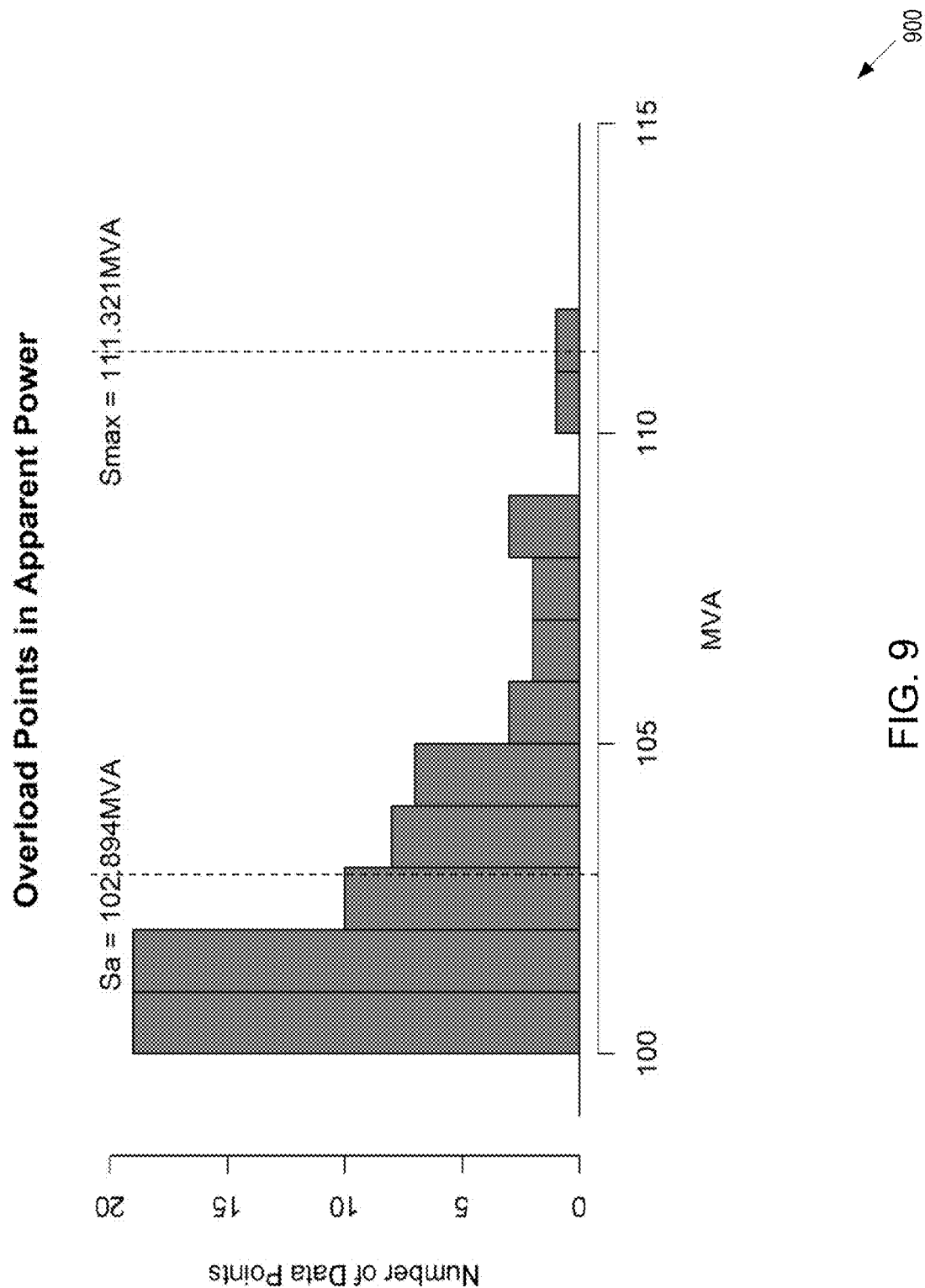
FIG. 9 shows an example of overload data points for apparent power.

FIG. 7 shows an example of the numbers of data points that illustration for active power and reactive power 700. In FIG. 7, the numbers of data pointes are shown for active power 701 and reactive power 702. FIG. 8 shows an example of numbers of data points that illustrate apparent power 800. In FIGS. 7 and 8, the rated voltage is 115 kV. After setting Sr=100 MVA and P, Q (vector, 365*24*4=35040 points) may be generated. Thus, Smax=111.32120, therefore it's in Condition 3. FIG. 9 shows an example of overload data points for apparent power 900. According to FIG. 9, RI may be derived by using: RI=50+50*(A1*(mean(So)/Sr−1)+A2*(max(So)/Sr−1))=74.2.

Figure 10:
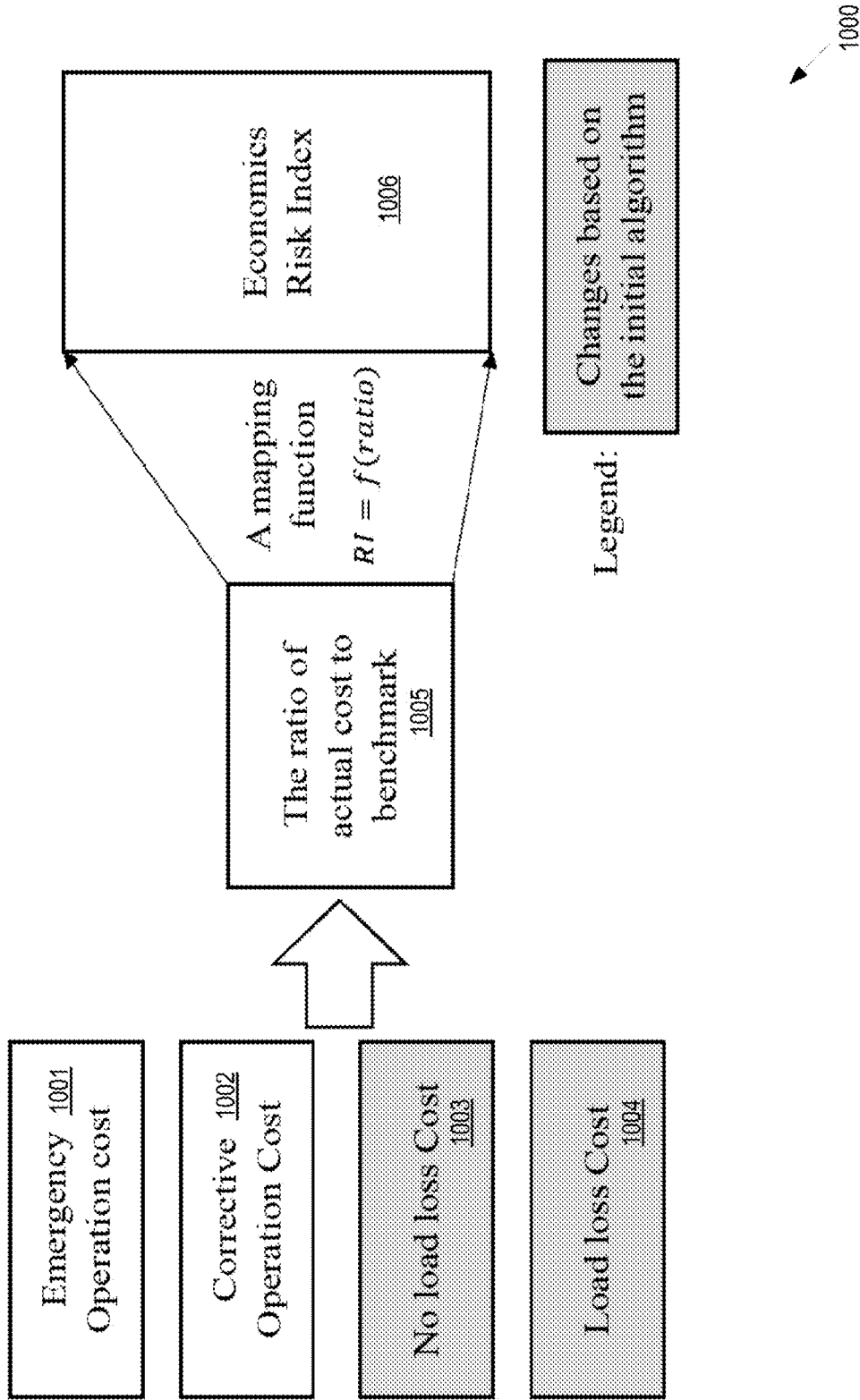
FIG. 10 shows an example of the overall structure/workflow of economics risk index.

Economics risk index may also be used to develop a maintenance sub-sequence. FIG. 10 shows an example of the overall structure/workflow of economics risk index 1000. As shown in FIG. 10, the emergency operation cost 1001 and the corrective operation 1002 may be used to develop the ratio of benchmark 1005 and eventually may be used to develop the economics risk index 1006. The cost of no-load 1003 and load losses 1004 may be added as optional factors for developing the economics risk factor 1006. Another optional step may be to calculate the Risk Index based on the ratio of the actual cost to the benchmark 1005.

The cost of energy loss may have three scenarios according to different data availability:

1) If the energy loss may be available from the meter/sensor data, the calculation may be just the sum of the annual energy loss multiplied by the electricity price for the past five years.

2) If the energy loss may be unavailable from the meter data, the losses may be determined by the transformer test results.

a. In the open circuit test, the measured $P_O$ may be very close to the no load loss, and can be used directly. The cost of no load loss is:

$$X_i^{NL} = P_0 \times T_i \times \text{Price} \quad \text{Formula 8}$$

Where,
$X_i^{NL}$: No load loss cost of year i
$T_i$: Total operation hours in year i
Price: Electricity price (USD/MWh)

b. In the short circuit test, Re (equivalent resistance) may be obtained. Then load losses may be calculated using the historical loading data of active power.

$$P_L = \left(\frac{P}{U}\right)^2 \times R_e \quad \text{Formula 9}$$

Where,
$P_L$ is the three phase load loss (MW)
P is the three phase active power (MW)
U is the rated line-to-line voltage (115 kV)
Re is the equivalent resistance (Ohm).

The cost of load loss is:

$$X_i^L = \int_{t=\text{begin of year } i}^{t=\text{end of year } i} P_L dt \times \text{Price} \quad \text{Formula 10}$$

$X_i^L$: Load loss cost of year i
Price: Electricity price (USD/MWh)

3) If both the energy loss data and test data may not be available, it's suggested not to include the energy loss in the calculation of economic risk index.

The algorithm may be expressed as:

$$\text{ratio} = \frac{\sum W_i(N_i^e X_i^e + N_i^c X_i^c + X_i^L + X_i^{NL})}{B} \quad \text{Formula 11}$$

Where,
i: is 1, 2, . . . , 5
$N_i^e$: Number of emergency operation
$N_i^c$: Number of scheduled/planned/corrective operation
$X_i^e$: Average cost of one emergency operation of year i
$X_i^c$: Average cost of one scheduled/planned/corrective operation of year i
$W_i$: Weighing index for year i, $\Sigma_{i=1}^5 W_i=1$
$X_i^L$: Load loss cost of year i
$X_i^{NL}$: No load loss cost of year i
B: Benchmark cost
ratio: The actual cost divided by the benchmark
$R_E$: Economics Risk Index After the development of economics risk factor, the risk index in range of 1-100 may be mapped. For example, the ratio to the benchmark may have a range of zero to several. The typical values may be 0.5 for very good, and 2.0 for very poor. As the range of the economics risk index is [1, 100], a function may be needed for mapping the ratio to $R_E$: $R_E = f(\text{ratio})$ The function may be a piecewise linear function, which contains a straight line for each section. The function may also be a continuous function covering the whole range of Risk Index, such as:

$$R_E = \left(\frac{100}{100-c}\right) \times \left(\frac{100}{1+e^{-a \times \text{ratio} - b}} - c\right) \quad \text{Formula 12}$$

Where,
a is the steepness of the curve
b is the shift of the curve along the x axis $$c = \left(\frac{100}{1+\exp(-b)}\right) - 1,$$

is a parameter for adjusting the $R_E$ within [1, 100]

Figure 11:
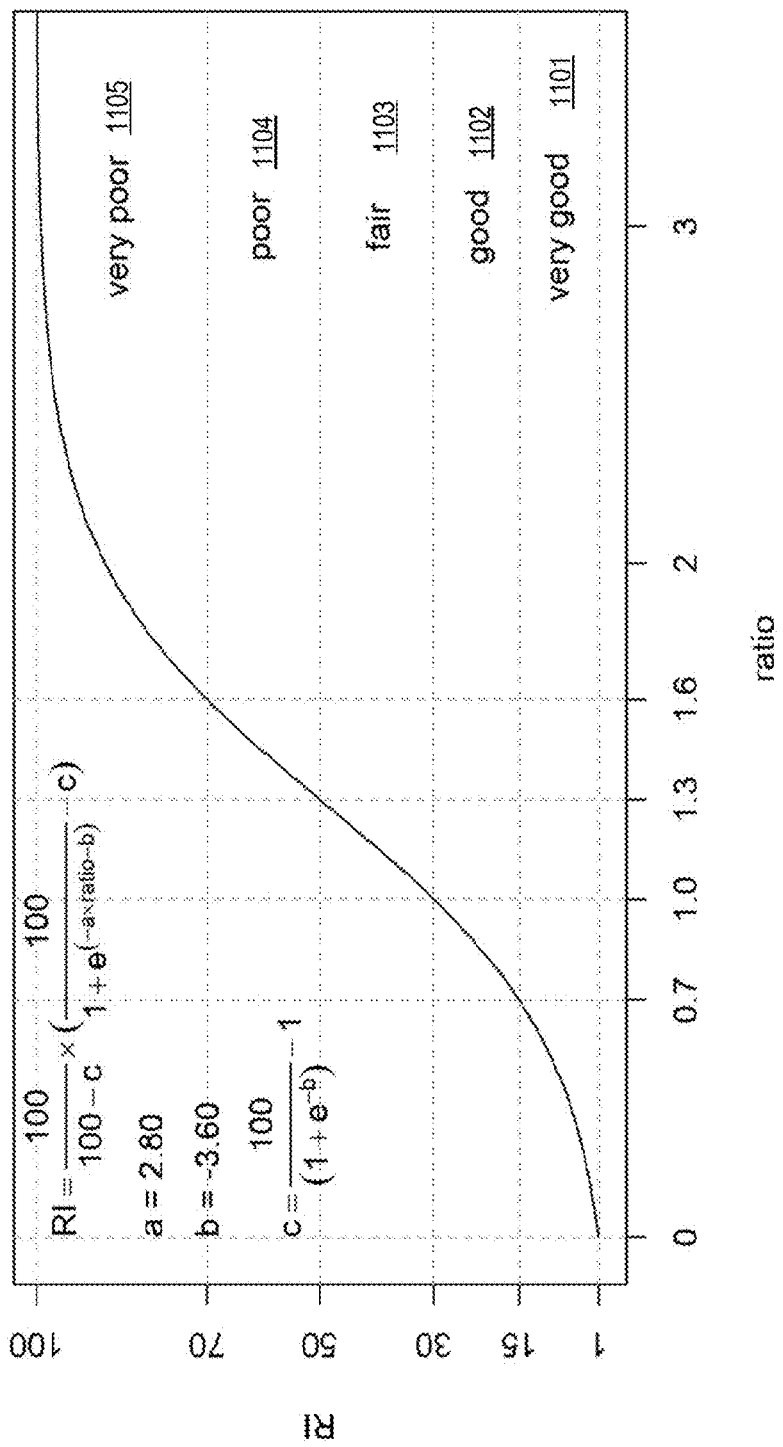
FIG. 11 show example of the curve of the continuous function for mapping economics risk index.

FIG. 11 show example of the curve of the continuous function for mapping economics risk index. As shown in FIG. 11, the mapped economics risk index may categorize the measured transformer as very good 1101, good 1102, fair 1103, poor 1104, and very poor 1105.

The performance risk index may be developed by using the proposed algorithm having a two-step procedure:

1. The calculation of the historical forced outage hours comparing to the industry average.

$$\text{ratio} = \frac{\sum W_i T_i}{B} \quad \text{Formula 13}$$

Figure 12:
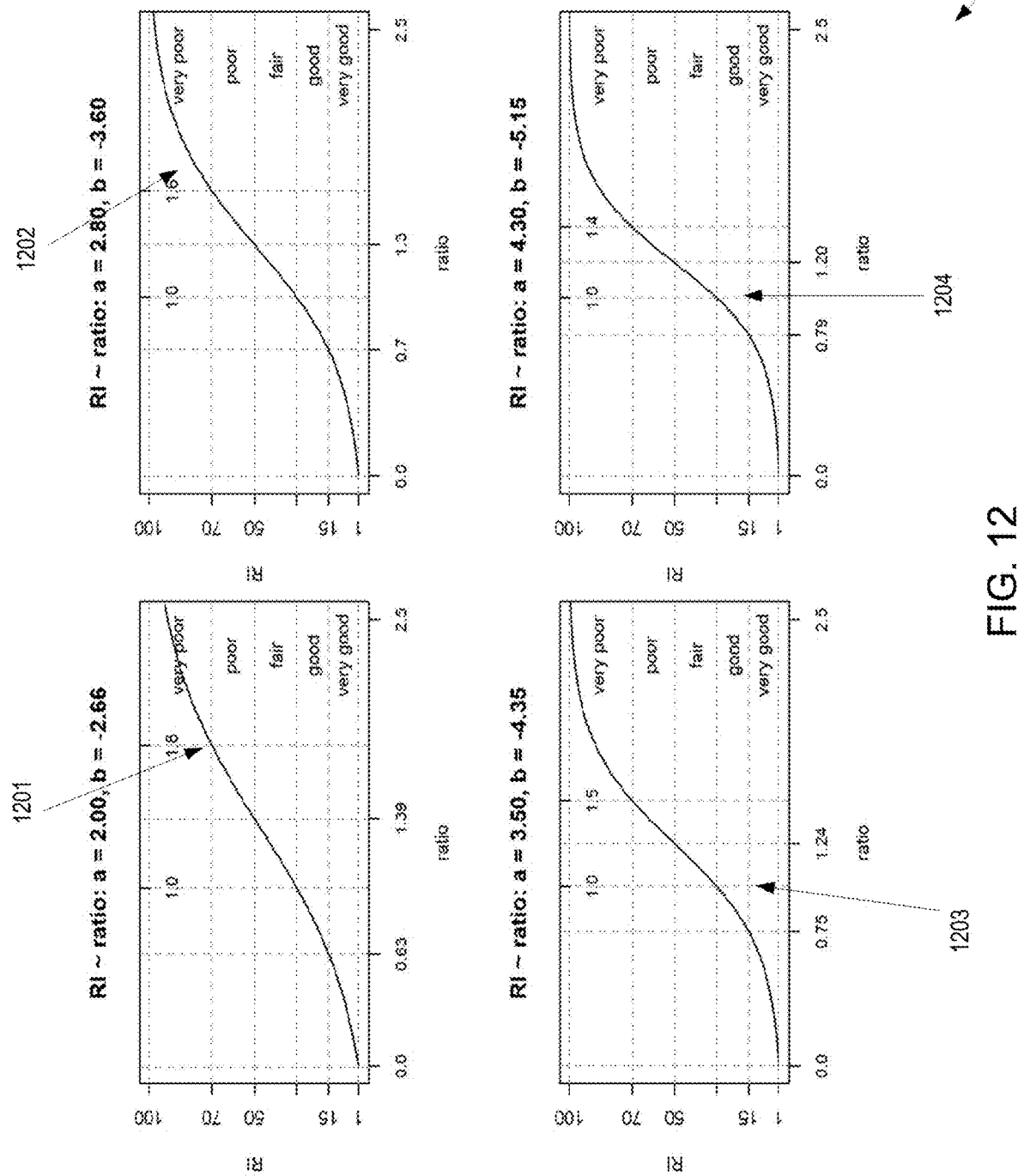
FIG. 12 shows examples of the steepness of the curve that can be changed by tuning the parameters.

Where,
i: is the year number, 1, 2, . . . , 5
$W_i$: Weighing index for year i, $\Sigma_{i=1}^5 W_i=1$, where the maximum weightage is given to the most recent year
$T_i$: Total forced outage hours in year i
B: Industrial benchmark 2. A piecewise or a continuous function may be needed to convert the performance ratio to the performance risk index. Formula 12 may also be used here. FIG. 12 shows examples of the steepness of the curve that can be changed by tuning the parameters 1200. As shown in FIG. 12, curve 1201, curve 1202, curve 1203 and curve 1204 have different value combinations for a and b. Table 4 shows examples of value combinations of a and b for very good, good, fair, poor and very poor. In practice, a user may be used to show the various curves as shown in FIG. 12. Because different users may have different needs to show the different curves to illustrate the transformer performance, the capability to show the steepness with different curves as illustrated in FIG. 12 and Table 4 may satisfy the needs for different users to show the transformer performance in user interfaces.

TABLE 4

| | Very good (1~15) | Good (15~30) | Fair (30~50) | Poor (50~70) | Very poor (70~100) | |
|---|---|---|---|---|---|---|
| a = 2, b = −2.66 | 0~0.63 | 0.63~1 | 1~1.39 | 1.39~1.8 | 1.8~∞ | ratios |
| a = 2.8, b = −3.6 | 0~0.7 | 0.7~1 | 1~1.3 | 1.3~1.6 | 1.6~∞ | |
| a = 3.5, b = −4.35 | 0~0.75 | 0.75~1 | 1~1.24 | 1.24~1.5 | 1.5~∞ | |

TABLE 4-continued

| | Very good (1~15) | Good (15~30) | Fair (30~50) | Poor (50~70) | Very poor (70~100) |
|---|---|---|---|---|---|
| a = 4.3, b = −5.15 | 0~0.79 | 0.79~1 | 1~1.2 | 1.2~1.4 | 1.4~∞ |

Figure 13:
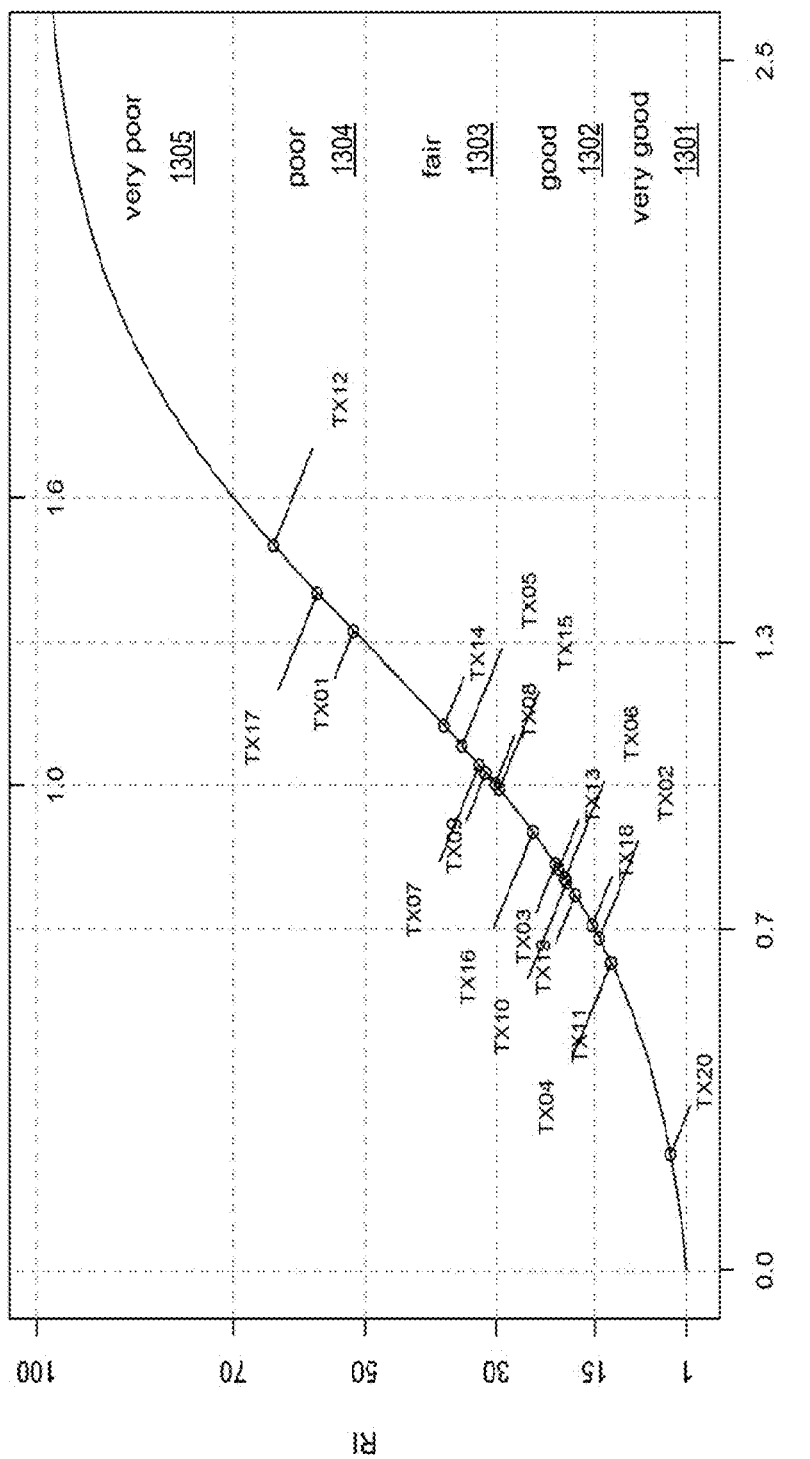
FIG. 13 illustrates the twenty (20) ratio values for twenty (20) transformers that are mapped to Risk indices.

Table 5 shows data of forced outage time per year of 20 transformers for the past 5 years. In Table 5, the Benchmark is 20 hours per transformer per year, and the values of Wi for the past 5 years are 5%, 10%, 15%, 30%, and 40%, where the maximum weightage is given to the most recent year because the most recent year may have the biggest impact to the transformer condition. The parameters used in the function for Table 5 have: a=2.8, b=−3.6. FIG. 13 illustrates the twenty (20) ratio values for twenty (20) transformers that are mapped to risk indices 1300. As shown in FIG. 13, risk index categories may be: very good 1301, good 1302, fair 1303, poor 1304 and very poor 1305.

TABLE 5

| | The Forced Outage Hours | | | | | | |
|---|---|---|---|---|---|---|---|
| TX ID | 2010 | 2011 | 2012 | 2013 | 2014 | w. avg | Ratio | Risk Index |
| TX115D00001 | 13.2 | 13.9 | 0.0 | 29.6 | 37.8 | 26.1 | 1.30 | 50.4 |
| TX115D00002 | 14.9 | 16.7 | 15.7 | 48.3 | 0.0 | 19.3 | 0.96 | 27.7 |
| TX115D00003 | 21.1 | 0.0 | 20.1 | 11.8 | 23.3 | 17.0 | 0.85 | 21.4 |
| TX115D00004 | 20.7 | 0.0 | 24.9 | 0.0 | 21.5 | 13.4 | 0.67 | 13.6 |
| TX115D00005 | 15.5 | 0.0 | 14.4 | 0.0 | 36.1 | 17.4 | 0.87 | 22.4 |
| TX115D00006 | 19.0 | 17.3 | 26.5 | 17.7 | 11.0 | 16.4 | 0.82 | 19.9 |
| TX115D00007 | 13.0 | 14.1 | 14.3 | 11.4 | 21.6 | 16.3 | 0.81 | 19.7 |
| TX115D00008 | 17.4 | 0.0 | 14.2 | 22.1 | 0.0 | 9.6 | 0.48 | 8.0 |
| TX115D00009 | 13.5 | 11.6 | 32.6 | 30.3 | 15.0 | 21.8 | 1.09 | 35.7 |
| TX115D00010 | 15.9 | 0.0 | 24.7 | 14.6 | 0.0 | 8.9 | 0.44 | 7.1 |
| TX115D00011 | 17.7 | 11.3 | 20.2 | 0.0 | 23.1 | 14.3 | 0.72 | 15.4 |
| TX115D00012 | 15.5 | 0.0 | 36.1 | 20.6 | 30.1 | 24.4 | 1.22 | 44.5 |
| TX115D00013 | 25.4 | 0.0 | 37.7 | 23.8 | 13.1 | 19.3 | 0.96 | 27.7 |
| TX115D00014 | 0.0 | 15.0 | 23.0 | 36.8 | 11.8 | 20.7 | 1.04 | 32.1 |
| TX115D00015 | 0.0 | 0.0 | 25.6 | 41.8 | 23.5 | 25.8 | 1.29 | 49.4 |
| TX115D00016 | 12.6 | 21.0 | 15.2 | 20.7 | 17.8 | 18.3 | 0.92 | 25.0 |
| TX115D00017 | 0.0 | 0.0 | 0.0 | 16.5 | 0.0 | 5.0 | 0.25 | 3.6 |
| TX115D00018 | 16.0 | 0.0 | 21.3 | 35.4 | 0.0 | 14.6 | 0.73 | 16.1 |
| TX115D00019 | 14.3 | 12.7 | 13.1 | 30.5 | 48.3 | 32.4 | 1.62 | 71.4 |
| TX115D00020 | 17.2 | 15.8 | 19.0 | 22.4 | 0.0 | 12.0 | 0.60 | 11.4 |

The criticality risk index may be developed by using input data received from a communicate interface and overall procedures. The data selected for the criticality may include four sub Risk indices: criticality of station and transformer, cost of transformer, rated capacity, and average historical loading.

Such four sub-indices may be of different types, scales and units, and the procedures may be designed to synthesize them in to the criticality risk index. For example:

1. Prepare input data and investigate/estimate the ranges of the four sub-indices;

2. Map the range of input data to the range of sub Risk Index, by one of the three methods: table look-up, linear or non-linear functions;

3. Set weightings for the four sub-indices, and calculate the Criticality Risk Index.

A look-up table for categorical/discrete data may be developed for developing the criticality risk index. For example, user data may be available on station and transformer criticality. For data importance levels, such as low/middle/high, a two-dimensional table may be made. The rows for the levels of the station and columns for levels of the transformer. Table 6 shows an example of such a two-dimensional table. The number RI in Table 6 may be configurable between 1 and 100.

TABLE 6

| | | Transformer | | |
|---|---|---|---|---|
| | | Level 1 | Level 2 | Level 3 |
| Station | Level 1 | $RI_{11}$ | $RI_{12}$ | $RI_{13}$ |
| | Level 2 | $RI_{21}$ | $RI_{22}$ | $RI_{23}$ |
| | Level 3 | $RI_{31}$ | $RI_{32}$ | $RI_{33}$ |

If the criticalities of station and transformer are given by real numbers between 0 and 1, their geometric mean may be used as input to the following linear or non-linear function to get the sub risk index:

1. Piecewise linear function

For real number such as the cost and loadings, a piecewise linear function may be used to calculate the sub risk index between 1 and 100. For example, six preset data points may be needed for a well-fit piecewise linear function. Table 7 shows an example for a piecewise linear function. In Table 7, the parameter values are configurable, and need to be determined from reference or real data.

TABLE 7

| | Risk Indices | | | | | |
|---|---|---|---|---|---|---|
| | $RI_1 = 1$ | $RI_2 = 15$ | $RI_3 = 30$ | $RI_4 = 50$ | $RI_5 = 70$ | $RI_6 = 100$ |
| Cost of transformer (k USD) | $C_1$ | $C_2$ | $C_3$ | $C_4$ | $C_5$ | $C_6$ |
| Rated Capacity (MVA) | $R_1$ | $R_2$ | $R_3$ | $R_4$ | $R_5$ | $R_6$ |
| Load index (ratio) | $L_1$ | $L_2$ | $L_3$ | $L_4$ | $L_5$ | $L_6$ |

2. Non-linear function

For the situations when pre-determining six data pairs are difficult to obtain, a non-linear function may be used as an alternative solution, which may only require any two data pairs. Table 8 shows an example of non-linear function. In Table 8, the parameter values may be configurable, and may need to be determined from reference or real data.

TABLE 8

| | Risk Indices | |
|---|---|---|
| | $RI_1$ (>1) | $RI_2$ (<100) |
| Cost of transformer (USD) | $C_1$ | $C_2$ |
| Rated Capacity (MVA) | $R_1$ | $R_2$ |
| Load index (ratio) | $L_1$ | $L_2$ |

When taking the cost for example, the non-linear function for estimating sub risk index may be:

$$RI = \frac{99}{1+e^{-k \times (Cost-C_0)}} + 1 \quad \text{Formula 14}$$

-continued

Where,  Formula 15

$$k = \frac{\ln\left(\frac{99}{RI_1-1}-1\right)-\ln\left(\frac{99}{RI_2-1}-1\right)}{C_2-C_1}$$

$$C_0 = C_1 + \frac{1}{k} \times \ln\left(\frac{99}{RI_1-1}-1\right) \quad \text{Formula 16}$$

Cost is the input cost.
RI is the sub risk index between 1 and 100.
$RI_1$ and $C_1$ is a first pair of given cost and the corresponding sub risk index.
$RI_2$ and $C_2$ is a second pair of given cost and the corresponding sub risk index.

Table 9 shows the weighted average by using weighted average to sum the four sub-index scores by weightings. And $W_1+W_2+W_3+W_4=1$. In Table 9, the parameter values may be configurable, and may need to be determined from reference or real data.

TABLE 9

| Sub Risk Indices of Criticality | Weighting |
|---|---|
| Criticality of station and transformer | $W_1$ |
| Cost of transformer | $W_2$ |
| Rated Capacity | $W_3$ |
| Load index | $W_4$ |

Two examples for developing criticality risk index are provided. In the examples, the configurable parameters may be randomly set only to illustrate the algorithm, and may need to be revised from reference or real data, and three criticality levels for the station may be: low/mid/high, and also three criticality levels for the transformer may be: low/mid/high. Table 10 shows an example of a look-up table for risk indices. As shown in Table 10, the sub risk index of a mid-level transformer in a high-level station is 55.

TABLE 10

| | | Transformer | | |
|---|---|---|---|---|
| | | Low | Mid | High |
| Station | Low | 1 | 20 | 25 |
| | Mid | 8 | 45 | 75 |
| | High | 35 | 55 | 100 |

Figure 14:
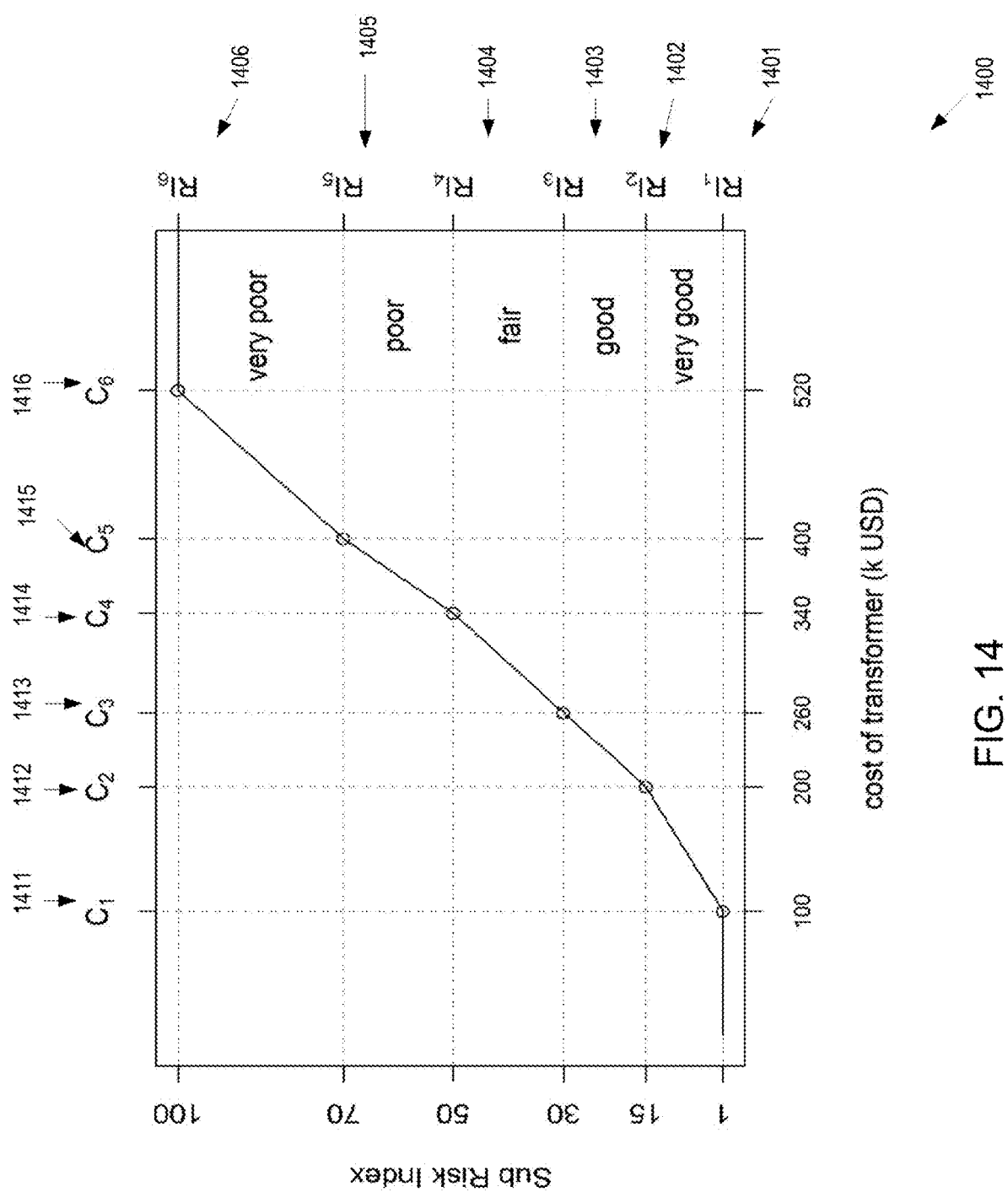
FIG. 14 shows an example for using piecewise linear function for cost criticality.

FIG. 14 shows an example for using piecewise linear function for cost criticality 1400. Table 11 shows the pre-set values for cost for FIG. 14. In FIG. 14, values from Table 11 are plotted as: $RI_1$ 1401, $RI_2$ 1402, $RI_3$ 1403, $RI_4$ 1404, $RI_5$ 1405, $RI_6$ 1406, and $C_1$ 1411, $C_2$ 1412, $C_3$ 1413, $C_4$ 1414, $C_5$ 1415 and $C_6$ 1416.

TABLE 11

| | Risk Index Scores | | | | | |
|---|---|---|---|---|---|---|
| | $RI_1$ = 1 | $RI_2$ = 15 | $RI_3$ = 30 | $RI_4$ = 50 | $RI_5$ = 70 | $RI_6$ = 100 |
| Cost of transformer (k USD) | $C_1$ = 100 | $C_2$ = 200 | $C_3$ = 260 | $C_4$ = 340 | $C_5$ = 400 | $C_6$ = 520 |

Figure 15:
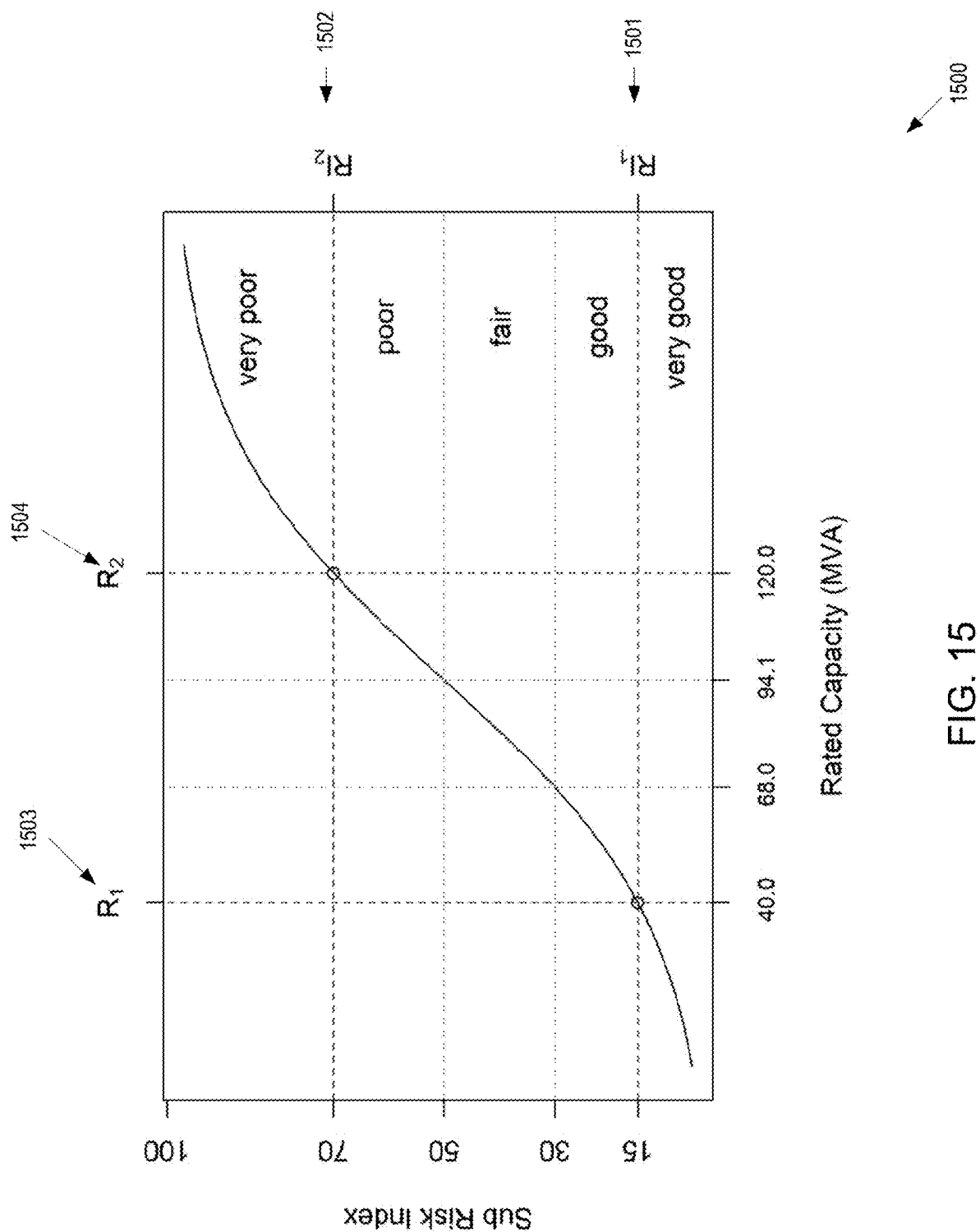
FIG. 15 shows an example for developing non-linear function for rated capacity.
Figure 16:
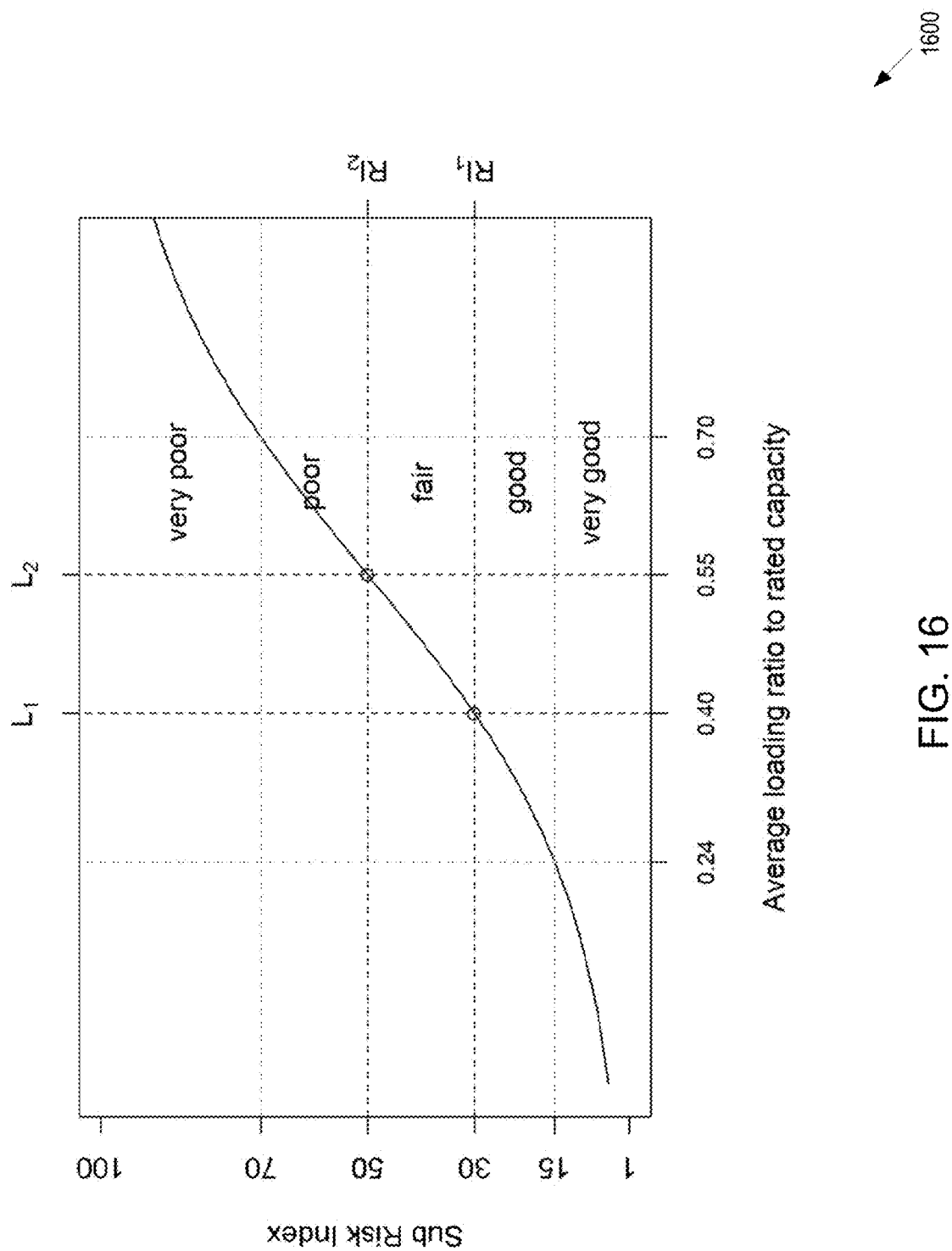
FIG. 16 shows an example of the loading sub risk indices of transformers that are calculated using the non-linear function.

FIG. 15 shows an example for developing non-linear function for rated capacity 1500. Table 12 shows the two pre-set pairs for capacities and sub-risk indices. The non-linear function may be estimated and it's plotted as shown in FIG. 15. As shown in FIG. 15, $RI_1$ 1501, $RI_2$ 1502 $R_1$ 1503 and $R_2$ 1504 from Table 12 are used to develop non-linear function. FIG. 16 shows an example of the loading sub Risk indices of transformers that are calculated using the non-linear function 1600. In FIG. 16, the loading sub Risk indices of transformers are calculated using the non-linear function shown in FIG. 15.

TABLE 12

| Risk Index Scores | $RI_1$ = 15 | $RI_2$ = 70 |
|---|---|---|
| Rated Capacity (MVA) | $R_1$ = 40 | $R_2$ = 120 |

Table 13 shows weightings for developing criticality risk index. According to the weightings, the criticality risk index may be calculated, which will be the weighted average of sub risk indices of criticality of station & transformer, cost of transformer, rated capacity and load factor.

TABLE 13

| Sub Risk Indices of Criticality | Weighting |
|---|---|
| Criticality of station and transformer | 30% |
| Cost of transformer | 20% |
| Rated Capacity | 30% |
| Load factor | 20% |

In addition to the risk indices disclosed above, a variety of methods may be used to evaluate the condition of transformer. For example, a framework of condition risk index may be developed and the algorithms for two most commonly used methods may be added as sub-indices, namely the Dissolved Gas Analysis (DGA) and Insulation Resistance (IR) test.

Besides, two other sub-indices may also be added into this framework—the number of emergency and off-plan work orders completed in the past year and the past recorded condition rating. As such, within this framework, all sub-indices may be synthesized into a comprehensive Condition Risk Index.

In addition, if a particular need arises for other methods, such as standard oil test, the particular method may be developed and may be added into the framework.

Dissolved Gas Analysis (DGA) is a method that is very sensitive and gives an early indication of incipient faults. The insulation oil used in transformer may sometimes lead to degradation of insulating transformer. Such degradation may be a long chain of complex mixture of hydrocarbon compounds. Firstly the results may be utilized to determine if the transformer is in normal condition. If not, Duval triangle method may be used to determine the severity of fault. Table 14 shows an example of condition, criteria, and sub risk index for a DGA analysis. In Table 14, μL/L (micro liter per liter) equals to ppm (part per million).

TABLE 14

| Condition | Criteria | Condition | Sub risk index |
|---|---|---|---|
| Factory condition | $H_2 < 30$ μL/L AND $C_2H_2 = 0$ AND total hydrocarbons $< 20$ μL/L | Very good | 1 |
| Normal operation condition | Exceeded factory condition AND $H_2 < 150$ μL/L AND $C_2H_2 < 5$ μL/L AND total hydrocarbons $< 150$ μL/L | Good | (1, 30) |
| Slight fault and fault condition | Exceeded normal operation condition Use Duval Triangle method to determine the fault severity. | Fair, poor, or very Poor | [30, 100] |

In normal operation condition, the Sub risk index of DGA may be determined by assuming a linear relationship between the gas and the sub risk index:

$$RI_{DGA} = \max(R_H, R_C, R_T) \times 29 + 1 \quad \text{Formula 17}$$

$$R_H = \frac{(H_2 - 30)}{150 - 30}$$

$$R_C = \frac{C_2H_2}{5}$$

$$R_T = \frac{(THC - 20)}{150 - 20}$$

Where,
$RI_{DGA}$: is the sub Risk Index score
$R_H$, $R_C$, $R_T$: are the ratios of $H_2$, $C_2H_2$ and total hydrocarbons within the thresholds of normal operating condition level
$H_2$: $H_2$ test result in ppm
$C_2H_2$: $C_2H_2$ test result in ppm
THC: Total hydrocarbons in ppm Duval Triangle method may be used to determine the severity of fault. In Duval triangle analysis, the three hydrocarbon gases may be mainly concerned, namely methane ($CH_4$), acetylene ($C_2H_2$) and ethylene ($C_2H_2$). The dissolved gas analysis by Duval triangle may convert the tested results in ppm to the percentages ($CH_4\%$, $C_2H_4\%$ and $C_2H_2\%$):

$$CH_4 \% = 100 \times \frac{x}{x + y + z} \quad \text{Formula 18}$$

$$C_2H_4 \% = 100 \times \frac{y}{x + y + z} \quad \text{Formula 19}$$

$$C_2H_2 \% = 100 \times \frac{z}{x + y + z} \quad \text{Formula 20}$$

Where,
x=[$CH_4$] in ppm, y=[$C_2H_4$] in ppm, z=[$C_2H_2$] in ppm

By using the above three readings, the Duval triangle method may have satisfied the fault diagnosis that is great than 95% accurate by following relatively simple procedures.

The Duval Triangle method may be represented in the form of ternary plots. Ternary plots may depict three variables (a, b and c) in a 2-D diagram. As there are only two degrees of freedom in a 2-D plane, c must be equal to K−a−b to reduce a degree of freedom. This is okay for the Duval Triangle analysis because the sum of the percentages of the three gases is always 100%.

Figure 17:
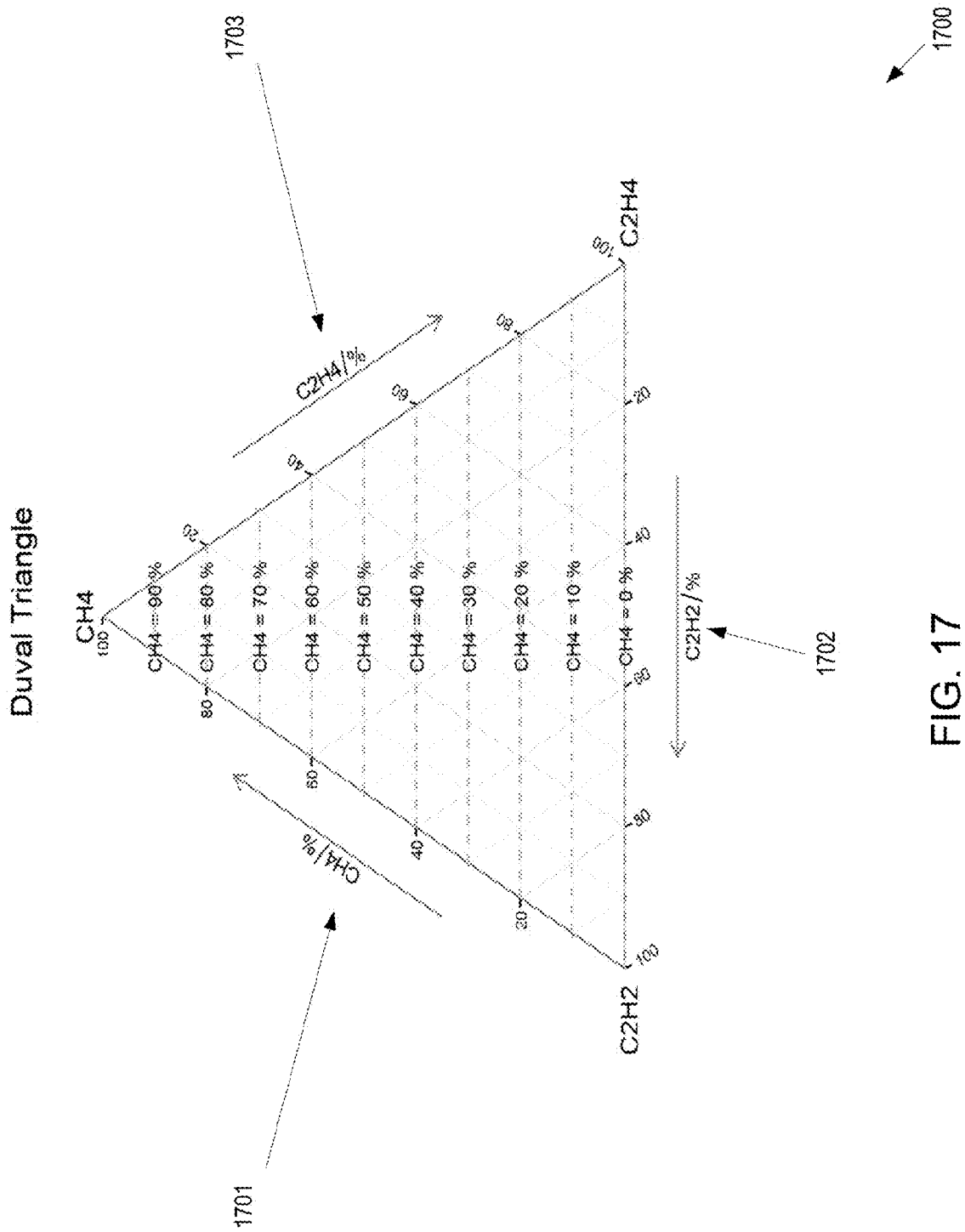
FIG. 17 shows an example of Duval Triangle ternary plots.

FIG. 17 shows an example of Duval Triangle ternary plots 1700. As shown in FIG. 17, the ratios of the three variables as positions in an equilateral triangle. The three apexes represent $CH_4\%$ 1701, $C_2H_4\%$ 1703 and $C_2H_2\%$ 1702. Take $CH_4$ 1701 for example, a point plotted at the top of the triangle indicates 100% $CH_4$ 1701, while a horizontal bar at the bottom of the line represents 0%. The same rule applies for $C_2H_2$ 1702 and $C_2H_4$ 1703.

Figure 18:
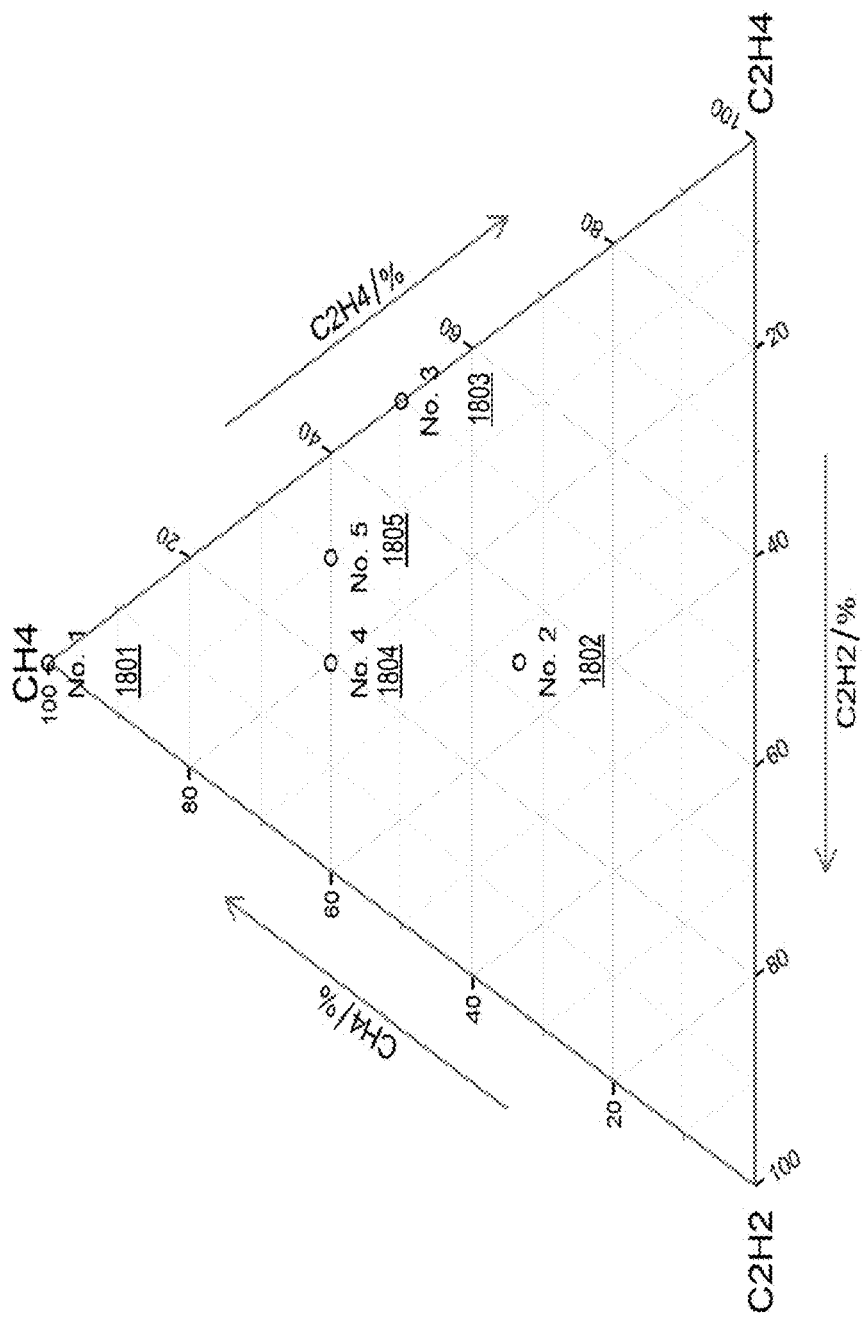
FIG. 18 shows an example of five sample points for Duval Triangle.

FIG. 18 shows an example of five sample points for Duval Triangle 1800. As shown in FIG. 18, No. 1 1801, No. 2 1802, No. 3 1803, No. 4 1804 and No. 5 1805 are sample points on the Duval Triangle. The values of $CH_4\%$, $C_2H_4\%$ and $C_2H_2\%$ for five sample points for Duval Triangle are shown in Table 15.

TABLE 15

| Sample | $CH_4$ (%) | $C_2H_2$ (%) | $C_2H_4$ (%) |
|---|---|---|---|
| No. 1 | 100 | 0 | 0 |
| No. 2 | 33.3 | 33.3 | 33.3 |
| No. 3 | 50 | 0 | 50 |
| No. 4 | 60 | 20 | 20 |
| No. 5 | 60 | 10 | 30 |

Figure 19:
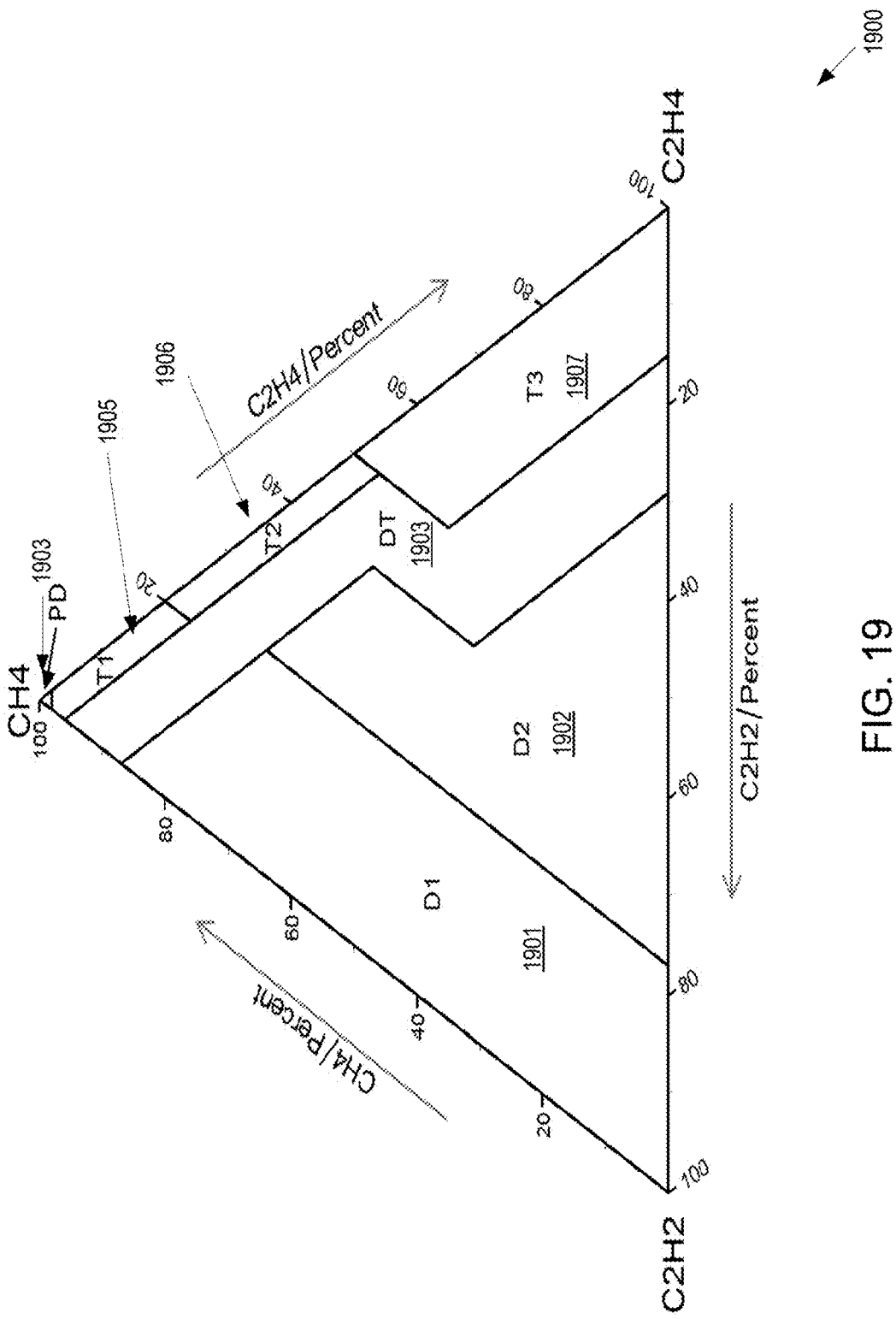
FIG. 19 shows an example of Duval triangle zones and interpretation.

FIG. 19 shows an example of Duval triangle zones and interpretation 1900. As shown in FIG. 19, there may be seven zones in Duval Triangle. D1 1901, D2 1902, DT 1903, PD 1904, T1 1905, T2 1906 and T3 1907. The meaning of each zone is shown in Table 16.

TABLE 16

| Zones | Faults | Examples |
|---|---|---|
| PD | Partial Discharges | Discharges of the cold plasma (corona) type in gas bubbles or voids, with the possible formation of X-wax in paper |
| D1 | Discharge of low energy | Partial discharges of the sparking type, including pinholes, carbonized punctures in paper |

TABLE 16-continued

| Zones | Faults | Examples |
|---|---|---|
| | | Low energy arcing inducing carbonized perforation or surface tracking of paper or the formation of carbon particles in oil |
| D2 | Discharge of high energy | Discharges in paper or oil, with power follow through, resulting in extensive damage to paper or large formation of carbon particles in oil, metal fusion, tripping of the equipment and gas alarms |
| DT | Thermal and electrical faults | Mixture of thermal and electrical faults |
| T1 | Thermal fault, T < 300° C. | Evidenced by paper turning brownish (>200° C.) or carbonized (>300° C.) |
| T2 | Thermal fault, 300 < T < 700° C. | Carbonization of paper, formation of carbon particles in oil |
| T3 | Thermal fault, T > 700° C. | Extensive formation of carbon particles in oil, metal coloration (800° C.) or metal fusion (>1000° C.) |

Figure 20:
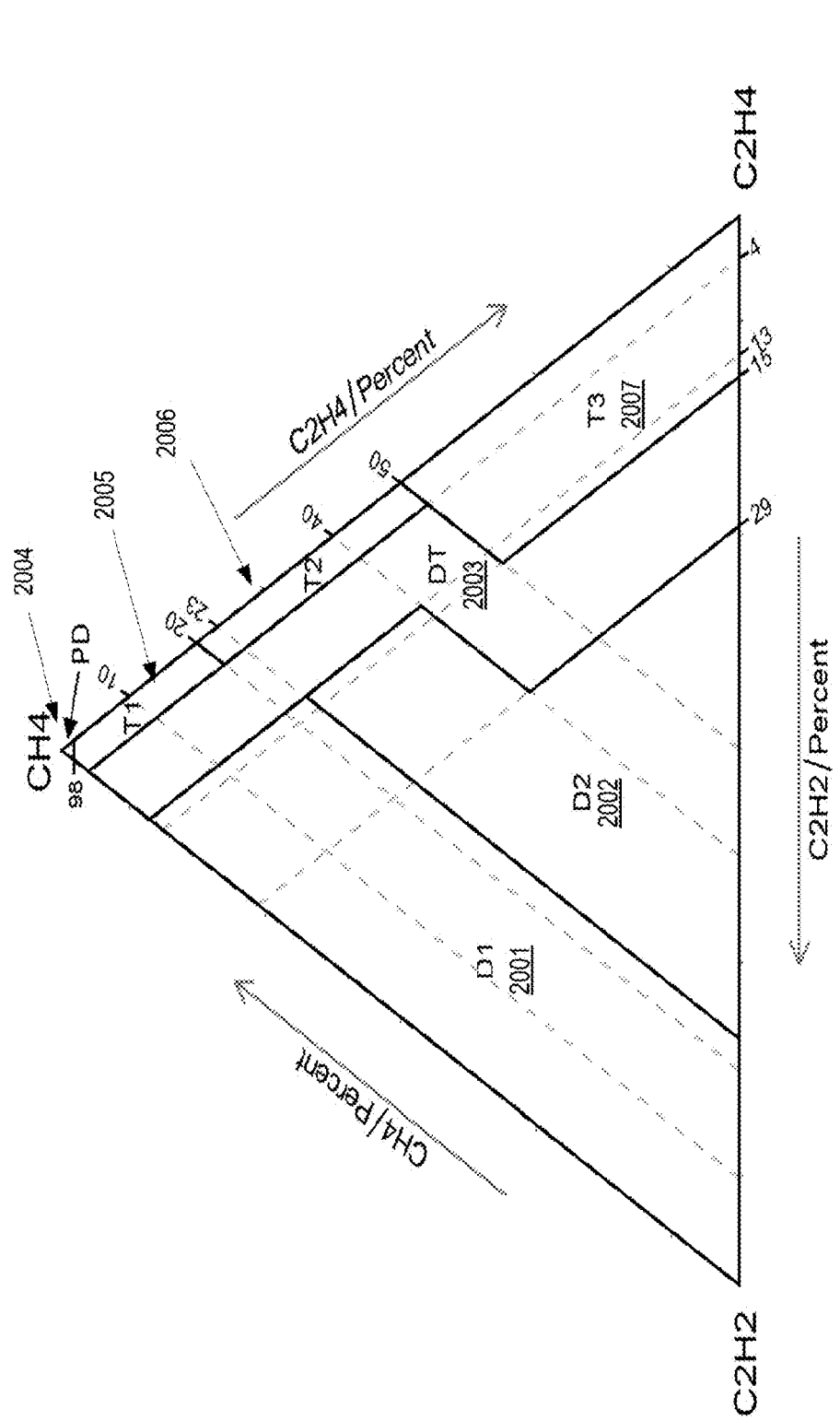
FIG. 20 shows an example of values of boundaries of zones of Duval Triangle.

FIG. 20 shows an example of values of boundaries of zones of Duval Triangle 2000. In FIG. 20, zones are shown as D1 2001, D2 2002, DT 2003, T1 2005, T2 2006, T3 2007 and PD 2004. The corresponding algorithm for FIG. 20 is shown in Table 17.

TABLE 17

| Zones | Criteria |
|---|---|
| PD | $CH_4 >= 98\%$ |
| D1 | $C_2H_4 < 23\%$ AND $C_2H_2 > 13\%$ |
| D2 | ($C_2H_4 >= 23\%$ AND $C_2H_2 > 13\%$ AND $C_2H_4 < 40\%$) OR ($C_2H_4 >= 40\%$ AND $C_2H_2 > 29\%$) |
| DT | ($C_2H_2 > 4\%$ AND $C_2H_2 <= 13\%$ AND $C_2H_4 < 50\%$) OR ($C_2H_2 > 13\%$ AND $C_2H_2 <= 15\%$ AND $C_2H_4 >= 40\%$ AND $C_2H_4 < 50\%$) OR ($C_2H_4 >= 40\%$ AND $C_2H_2 > 15\%$ AND $C_2H_2 <= 29\%$) |
| T1 | $CH_4 < 98\%$ AND $C_2H_2 <= 4\%$ AND $C_2H_4 <= 20\%$ |
| T2 | $C_2H_2 <= 4\%$ AND $C_2H_4 > 20\%$ AND $C_2H_4 < 50\%$ |
| T3 | $C_2H_2 <= 15\%$ AND $C_2H_4 >= 50\%$ |

After the faulted transformer is diagnosed by Duval triangle, the corresponding sub-risk index may be determined by a set of configurable parameters. Table 18 shows an example set of configurable parameters. The set of example values may be selected randomly to accommodate the following data simulation.

TABLE 18

| Zones | Sub risk index of DGA analysis | Example Values* |
|---|---|---|
| PD | RI_Duval_PD | 40 |
| D1 | RI_Duval_D1 | 45 |
| D2 | RI_Duval_D2 | 65 |
| DT | RI_Duval_DT | 60 |
| T1 | RI_Duval_T1 | 55 |
| T2 | RI_Duval_T2 | 75 |
| T3 | RI_Duval_T3 | 100 |

Figure 21:
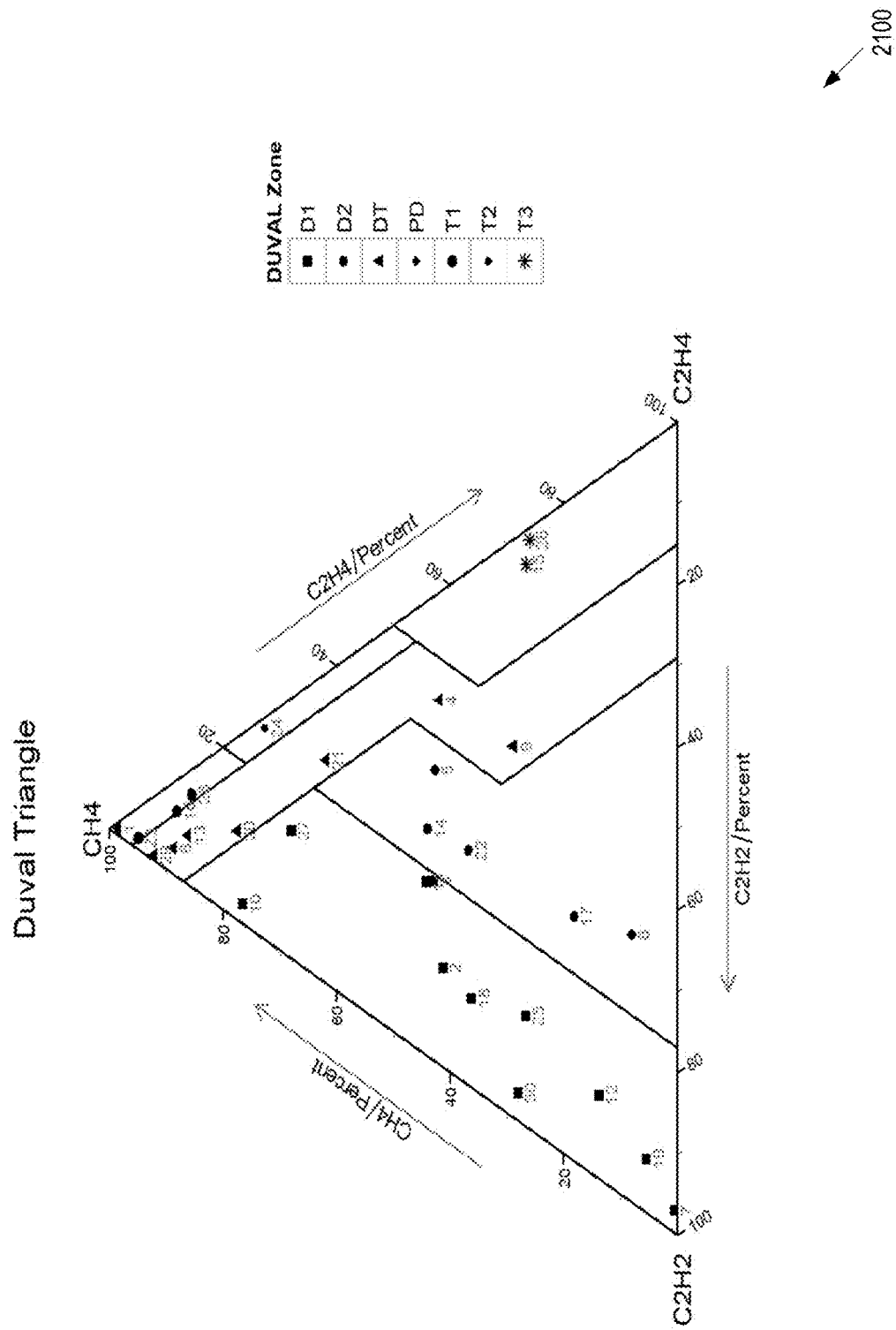
FIG. 21 shows Duval Triangle visualization of sub risk indices.

Table 19 shows a data simulation for thirty transformers that may have exceeded the normal operation condition in the Dissolved Gas Analysis (DGA) test. Table 19 shows data and diagnosed results. FIG. 21 shows Duval Triangle visualization of sub risk indices 2100 according to Table 19.

TABLE 19

| Number | CH4 (%) | C2H2 (%) | C2H4 (%) | DUVAL Zone | Sub Risk Index |
|---|---|---|---|---|---|
| 1 | 98.57 | 0.64 | 0.79 | PD | 40 |
| 2 | 41.26 | 46.44 | 12.30 | D1 | 45 |
| 3 | 42.95 | 34.91 | 22.13 | D1 | 45 |
| 4 | 41.92 | 13.18 | 44.90 | DT | 60 |
| 5 | 42.65 | 21.43 | 35.92 | D2 | 65 |
| 6 | 88.78 | 7.98 | 3.24 | DT | 60 |
| 7 | 0.61 | 96.57 | 2.82 | D1 | 45 |
| 8 | 8.12 | 58.96 | 32.92 | D2 | 65 |
| 9 | 28.87 | 25.44 | 45.70 | DT | 60 |
| 10 | 76.53 | 20.92 | 2.54 | D1 | 45 |
| 11 | 44.29 | 34.33 | 21.37 | D1 | 45 |
| 12 | 13.84 | 75.83 | 10.33 | D1 | 45 |
| 13 | 86.25 | 7.69 | 6.06 | DT | 60 |
| 14 | 43.99 | 27.93 | 28.08 | D2 | 65 |
| 15 | 26.67 | 4.17 | 69.16 | T3 | 100 |
| 16 | 88.13 | 3.72 | 8.15 | T1 | 55 |
| 17 | 18.21 | 51.66 | 30.13 | D2 | 65 |
| 18 | 36.28 | 52.69 | 11.03 | D1 | 45 |
| 19 | 5.55 | 87.82 | 6.63 | D1 | 45 |
| 20 | 77.52 | 11.49 | 10.99 | DT | 60 |
| 21 | 61.89 | 10.60 | 27.51 | DT | 60 |
| 22 | 36.83 | 34.22 | 28.94 | D2 | 65 |
| 23 | 94.89 | 3.63 | 1.48 | T1 | 55 |
| 24 | 72.66 | 1.26 | 26.08 | T2 | 75 |
| 25 | 26.70 | 59.63 | 13.67 | D1 | 45 |
| 26 | 85.55 | 2.94 | 11.51 | T1 | 55 |
| 27 | 67.98 | 16.20 | 15.82 | D1 | 45 |
| 28 | 26.05 | 1.49 | 72.45 | T3 | 100 |
| 29 | 92.21 | 7.16 | 0.63 | DT | 60 |
| 30 | 28.07 | 68.39 | 3.54 | D1 | 45 |

Insulation Resistance Analysis may utilize insulation resistance tests that may be done to determine insulation resistance from individual windings to ground or between individual windings. Insulation resistance tests may be commonly measured directly in MegaOhms (MΩ) or may be calculated from measurements of applied voltage and leakage current. By statistics, about 30% of large power transformer failures, after 15-20 years of operation, occur due to breakdown of insulation.

The input data for develop the ratios for insulation resistance analysis may include:

MIR: Insulation resistance tests may be done to determine insulation resistance from individual windings to ground or between individual windings. Insulation resistance tests may be commonly measured directly in megohms for each transformer.

IR: Based on industry reference or the nameplate, there may be a minimum acceptable IR value for 115 KV Transformer. For Example, 600 MΩ for transformers 66 KV to 132 KV.

The ratios for insulation resistance analysis may be computed as:

$$\text{ratio} = \frac{MIR}{IR} \quad \text{Formula 21}$$

Where,
MIR: the Latest Measured Insulation Resistance in MΩ.
IR: Minimum acceptable insulation resistance in MΩ

Figure 23:
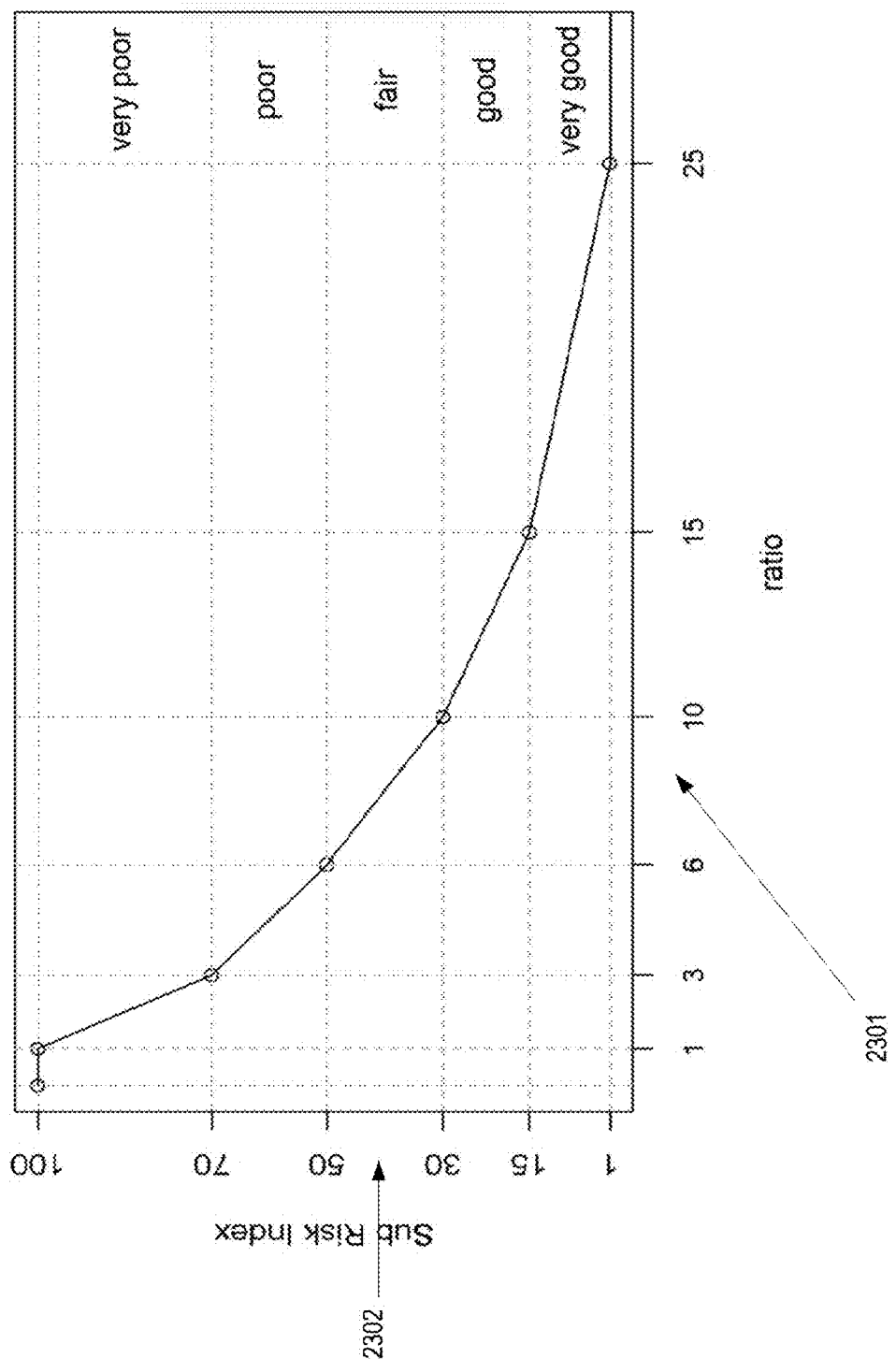
FIG. 23 shows an example to illustrate the conversion from the ratios to the sub risk index.

The Ratio may be converted into sub risk index [1, 100] with help of a function (f). The function may be a configurable piece-wise linear function. FIG. 23 shows an example to illustrate the conversion from the ratios to the sub risk index. As shown in FIG. 23, the ratio 2301 has a range of 1-25 and the sub risk index 2302 has a range of 1 to 100.

Other sub-indices including Emergency or off-plan work orders compared to the benchmark may also be developed. If data are available, the numbers of emergency or off-plan work orders in the last several years may be calculated. The weighted average of the ratios to industrial benchmark may be calculated using an equation similar to formula 21 and formula 22. The sub risk index may be calculated using an equation similar to Formula 12.

The last recorded condition rating may be developed. If an overall evaluation score would be given by the maintenance crew after the scheduled regular maintenance or the regular inspection. This evaluation score could also be used as a sub-index.

The weighted average could be used to sum all the sub-index scores by pre-set weightings.

$$RF = \sum_{i=1}^{N} W_i RI_i^{sub} \quad \text{Formula 24}$$

Where,
N: the total number of sub risk indices considered
RI: the Risk Index of condition
$RI_i^{sub}$: the sub Risk indices, including
   i=1, The DGA sub risk index
   i=2, The insulation resistance sub risk index
   i=3, The emergency or off-plan work order sub risk index
   i=4, The last recorded condition rating
$W_i$: the weight for sub risk index i, $\Sigma W_i = 100\%$ The Composite index (may also be called composite sequence) may be a weighted average of all risk indices (or may be called sub-sequences) associated with an asset.

$$\text{Composite} = \Sigma RI_i W_i \quad \text{Formula 24}$$

Where: $\Sigma W_i = 100\%$

Table 20 shows example weightings of risk indices (sub-sequences) for developing the composite index (composite sequence). Table 21 shows example interpretation of the composite score.

TABLE 20

| i | $RI_i$ | $W_i$ |
|---|---|---|
| 1 | Condition | 33% |
| 2 | Performance | 27% |
| 3 | Utilization | 13% |
| 4 | Demographics | 11% |
| 5 | Economics | 9% |
| 6 | Criticality | 7% |

TABLE 21

| Composite Score (0, 1-100) | Score Categories | Action | Recommended time frame for action (where applicable) |
|---|---|---|---|
| >=100 | Outliners - Very high risk, must review and address | Decide an equipment replacement or other effective solutions | At earliest and high priority |
| >70 to 100 | Very Poor - Very High Risk | Decide an equipment replacement | At earliest |
| >50 to 70 | Poor - High Risk | Plan Replacement or Refurbishment | 1 to 5 years |
| >30 to 50 | Fair - Fair Risk | Integrate into short/long term planning | 5 to 10 years |
| >15 to 30 | Good - Low Risk | Long term planning | 10 to 20 years |
| >1 to 15 | Very Good - Very Low Risk | Long term planning | >20 years |
| 0 | No data | Check data | At earliest |

The purpose of the asset investment simulation may be to support the annual decision-making processes as well as the long term planning for the Transmission and Distribution (T&D) asset management. The disclosed solution may include: a) the simulation methodology and the framework, and b) the design of the sub-models.

The disclosed solution may forecast the asset status over the given years based on the initial status and investment strategy. The disclosed solution may also be envisioned that the sub-models under this simulation framework could be improved by real data and the features could be enhanced to accommodate more diverse business needs.

Figure 22:
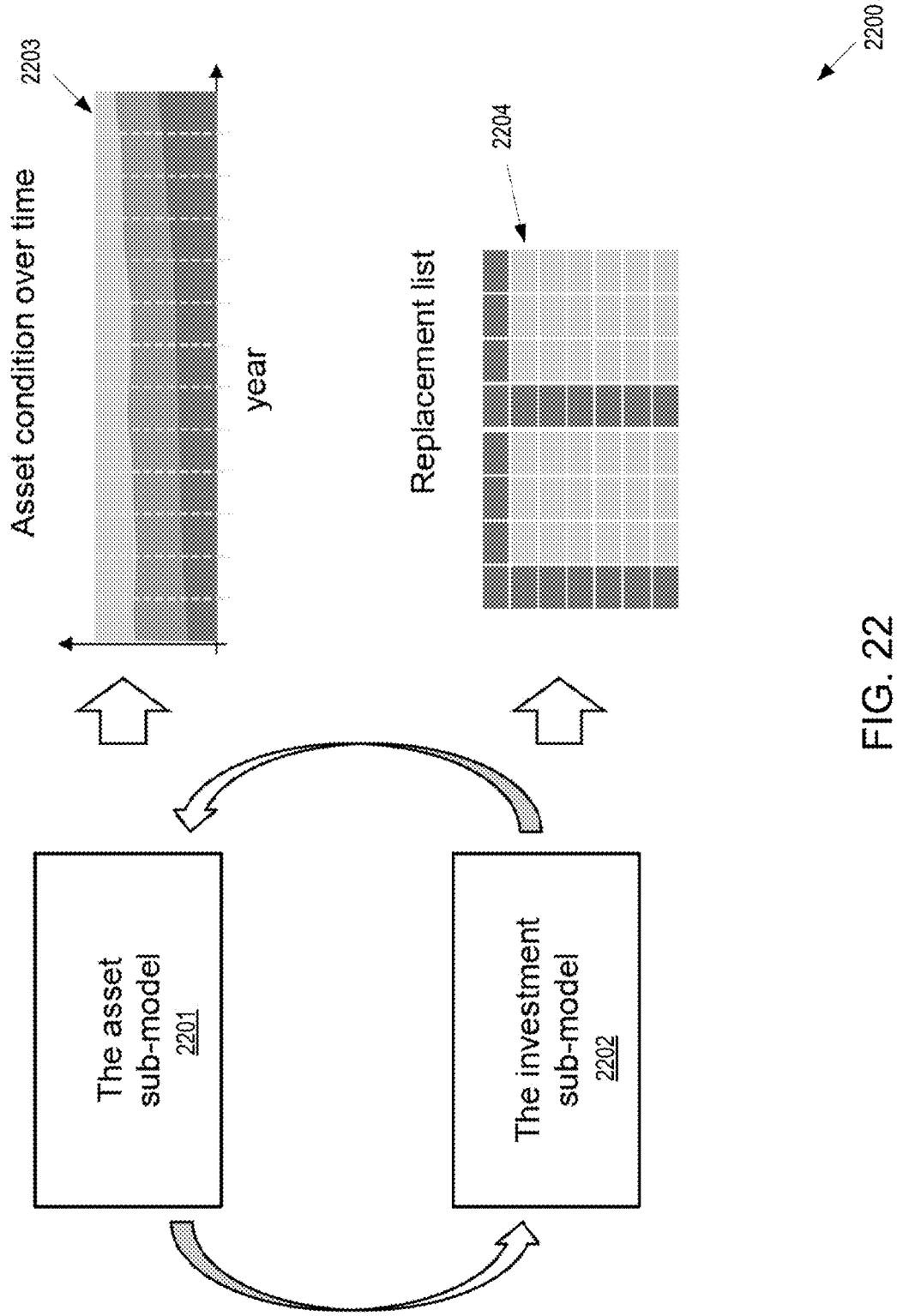
FIG. 22 illustrates a simplified asset investment simulation.

The methodology may be developed according to feedback control and dynamic simulation. Under this framework, the output of one sub-model is fed into other periodically, yielding the simulation results over a given time. FIG. 22 illustrates a simplified asset investment simulation 2200. As shown in FIG. 22, the investment simulation may include the first sub-model, e.g., an asset sub-model, 2201 and the second sub-model, e.g., an investment sub-model, 2202. The asset sub-model 2201 may output asset condition over time 2203 and the investment sub-model may output the replacement control scheme 2204 for asset over time. The asset sub-model 2201 and the investment sub-model 2202 may exchange information to each other.

The first sub-model may be an asset sub-model to calculate asset status based on given asset ages and related data. The second sub-model may be an investment sub-model to make investment decisions based on a strategy of choice. The Investment decision may be an investment action to be carried out on asset, e.g. replacement. The Asset status may be an indicator of asset status for investment decision, e.g. the asset age and risk index composite. The Asset risk index composite may be a weighted average of risk indices associated with an asset. The Asset status category may be discrete representation of asset status. The five possible values are very good, good, fair, poor, and very poor.

As the framework may contain an asset sub-model and an investment sub-model. A feedback loop may be designed to make annual forecasts over the given years. For example: 1) The asset sub-model may predict the asset status in the next period using the asset age and related data. 2) The investment sub-model may make an investment decision based on the asset status and the given strategy. 3) Asset age may be updated as: If the asset is not replaced, Asset Age=Asset Age+1. If the asset is replaced, Asset Age=1.

Figure 24:
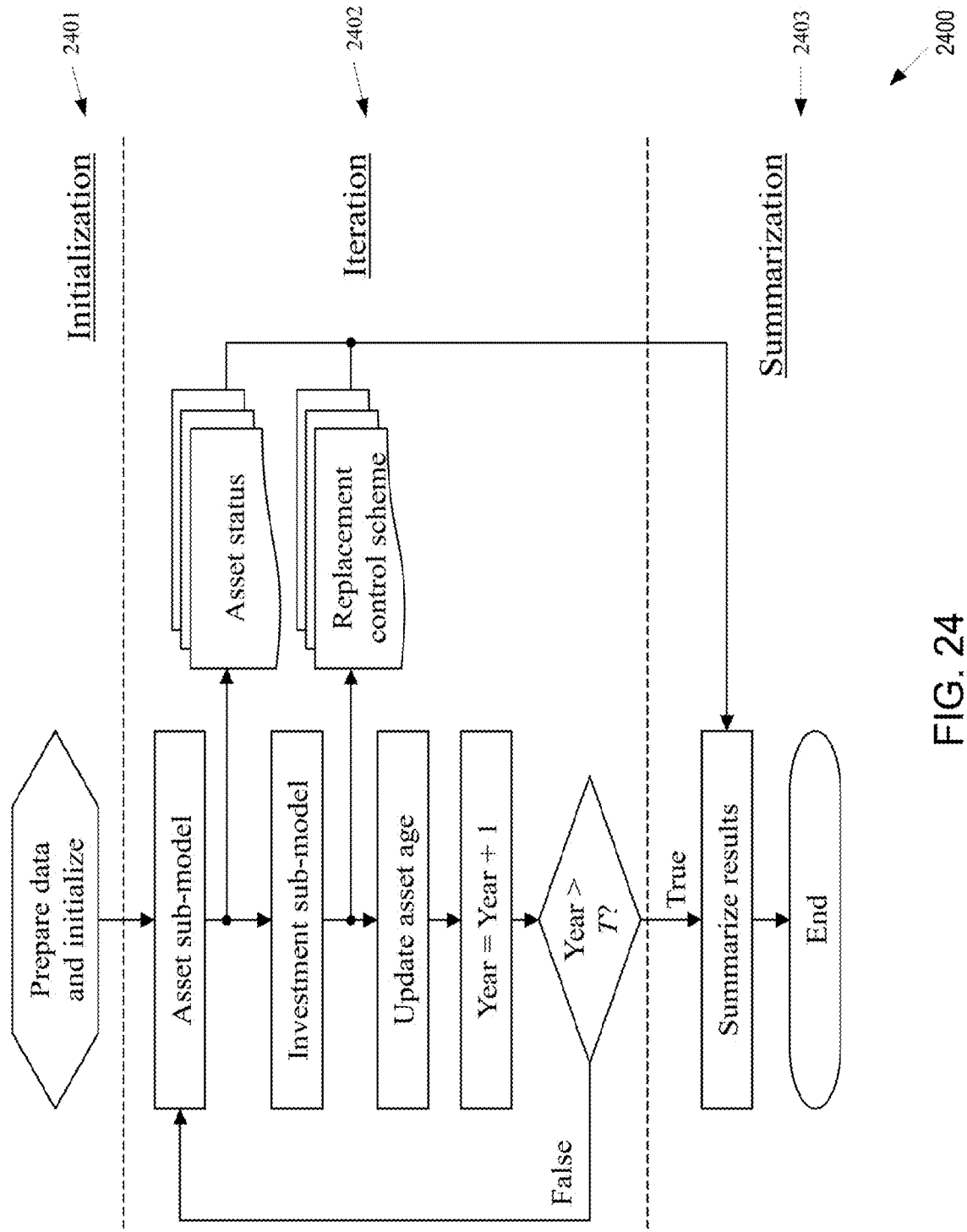
FIG. 24 illustrates process logic for the simulation framework.

FIG. 24 illustrates process logic for the simulation framework 2400. As shown in FIG. 24, Initialization includes: Prepare asset data, including asset initial status, age and etc. Configure investment strategy. Initialize 2401 prediction time T, and other variables.

Iteration 2402 includes:
for Year=1 to T do
Input asset status of Year to Asset sub-model
Predict asset status of (Year+1) and record results
Input asset status of Year to Investment sub-model
Make replacement decisions and record results
Update the asset age after replacement decisions
end for.

The summarization 2403 includes: Summarize asset status over time T, and summarize the replacement over time T.

The asset sub-model may be trained by data. However, according to the data availability, two cases may be developed to train the asset sub-model. Case 1 is a spine line function and case 2 is the statistical modeling.

Figure 25:
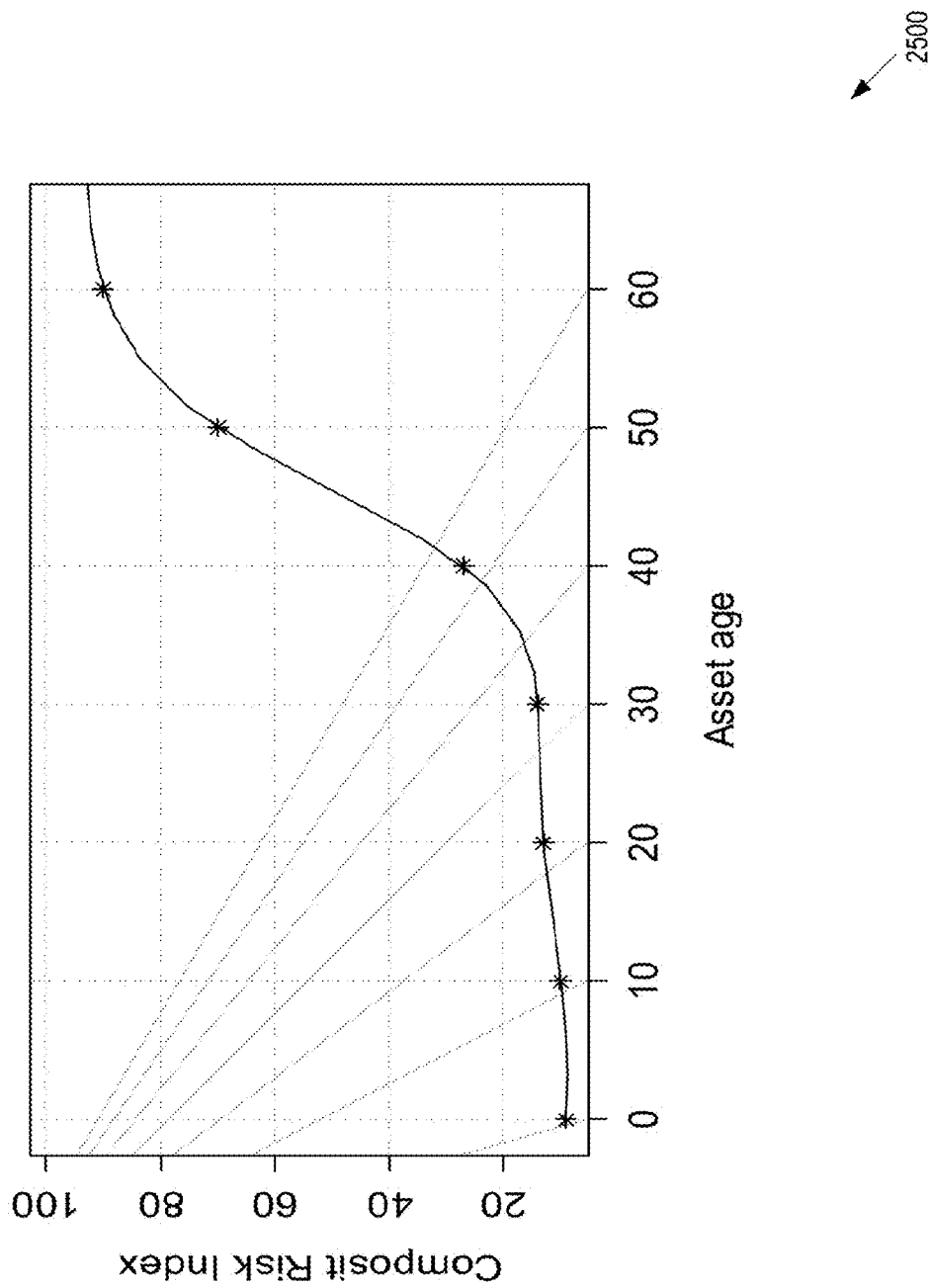
FIG. 25 shows an example of fitting a spine line function

FIG. 25 shows an example of fitting a spine line function 2500. When the risk index data are very limited at sample number, a very simple spline line function may be used to predict the risk Index. In this case, it is assumed no additional data other than asset ages may be available. Table 22 shows a limited data set (average index by age group) for fitting a spine line function as shown in FIG. 25, which include only ages of the utilities asset and the pre-determined risk indices for the ages.

TABLE 22

| Asset age | Comp. Risk Index |
| --- | --- |
| <1 | 9 |
| 10 | 10 |
| 20 | 13 |
| 30 | 14 |
| 40 | 27 |
| 50 | 70 |
| 60 | 90 |
| 70 | 93 |

Figure 26:
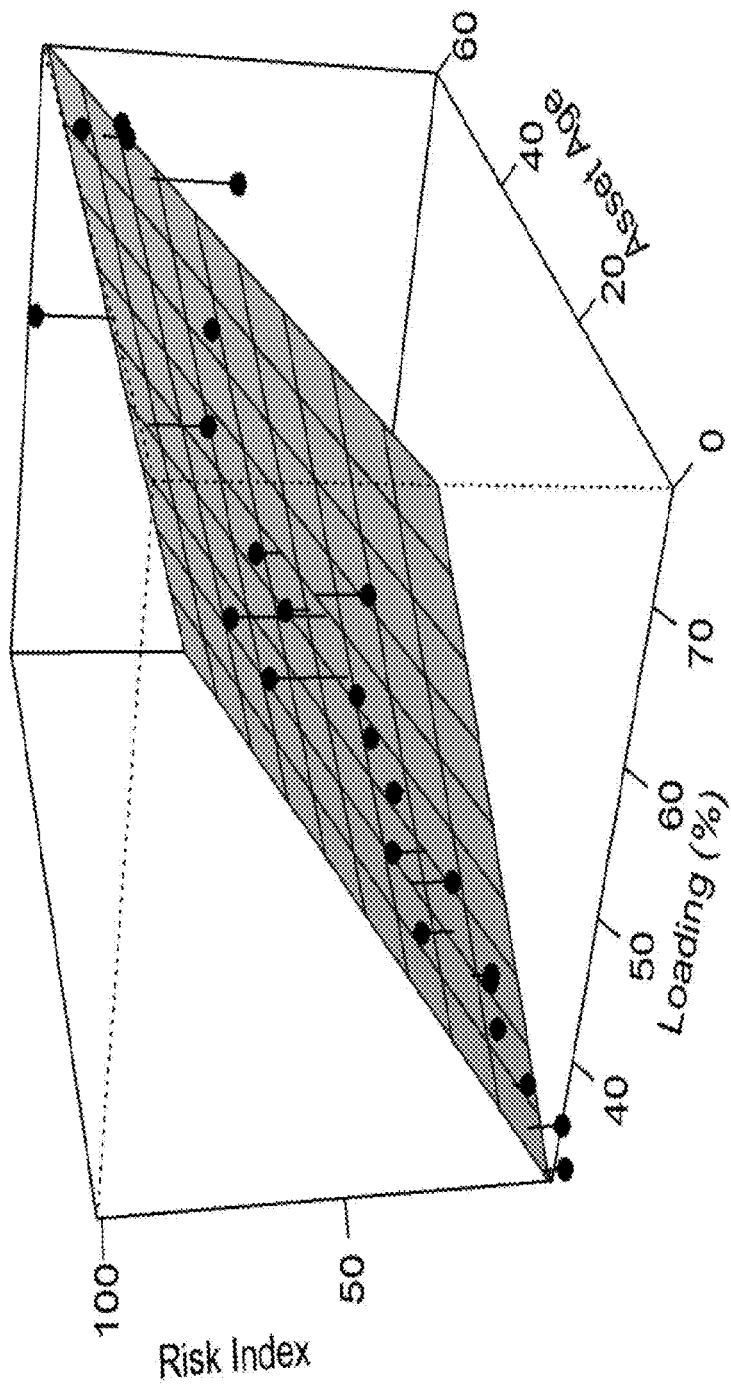
FIG. 26 shows an example of model training with comprehensive data sets

FIG. 26 shows an example of model training with comprehensive data sets 2600. As shown in FIG. 26, the loading percentages for utilities assets may be provided in addition asset ages and pre-determined risk indices for the ages. As such, when comprehensive data sets are available, statistical learning methods may be applied after identifying or calculating the following variables from data sets:

Dependent variable (Y): the composite Risk Index
Independent variable(s) $(X_1 \sim X_a)$: asset age and other optional predictor variables, such as loading levels, manufacturer, and etc.

Table 23 shows the example data set for model training as statistical learning.

TABLE 23

| No. | Comp. Risk Ind. | Loading | Age |
| --- | --- | --- | --- |
| TX001 | 1.0 | 31.00% | 1.0 |
| TX002 | 1.7 | 33.28% | 2.2 |
| TX003 | 9.5 | 35.55% | 3.4 |
| TX004 | 16.6 | 38.74% | 4.8 |
| TX005 | 18.0 | 41.02% | 6.3 |
| TX006 | 16.6 | 40.56% | 7.5 |
| TX007 | 31.4 | 42.39% | 9.4 |
| TX008 | 37.8 | 46.49% | 11.8 |
| TX009 | 37.1 | 49.22% | 14.1 |
| TX010 | 19.4 | 41.48% | 15.6 |
| TX011 | 39.9 | 50.58% | 17.9 |
| TX012 | 42.7 | 52.41% | 19.6 |
| TX013 | 61.1 | 52.86% | 21.0 |
| TX014 | 69.6 | 56.05% | 22.7 |
| TX015 | 38.5 | 56.50% | 24.4 |
| TX016 | 55.5 | 54.68% | 25.8 |
| TX017 | 60.4 | 56.50% | 29.6 |
| TX018 | 71.0 | 68.80% | 35.1 |
| TX019 | 63.9 | 75.63% | 41.5 |
| TX020 | 88.0 | 77.00% | 46.8 |
| TX021 | 84.4 | 74.72% | 50.4 |
| TX022 | 93.6 | 73.81% | 53.9 |
| TX023 | 56.9 | 51.95% | 55.6 |
| TX024 | 100.0 | 58.78% | 58.0 |

An example liner regression model may be trained and tested and expressed as:

$$\text{Risk\_index} = -24.8 + 0.832 * \text{Age} + 0.975 * \text{Load\_Percent}$$

In FIG. 26, a multivariate liner model may be established with utilities ages, loading percentages and risk indices calculated by using the utilities ages and loading percentages.

Table 24 shows the possible coefficients of the model.

TABLE 24

| | Coefficients: | | | | |
| --- | --- | --- | --- | --- | --- |
| | Estimate | Std. Error | t value | Pr(>|t|) | |
| (Intercept) | −24.8065 | 11.6495 | −2.129 | 0.04522 | * |
| age | 0.8320 | 0.2223 | 3.742 | 0.00120 | ** |
| load | 0.9749 | 0.2977 | 3.275 | 0.00362 | ** |

Figure 27:
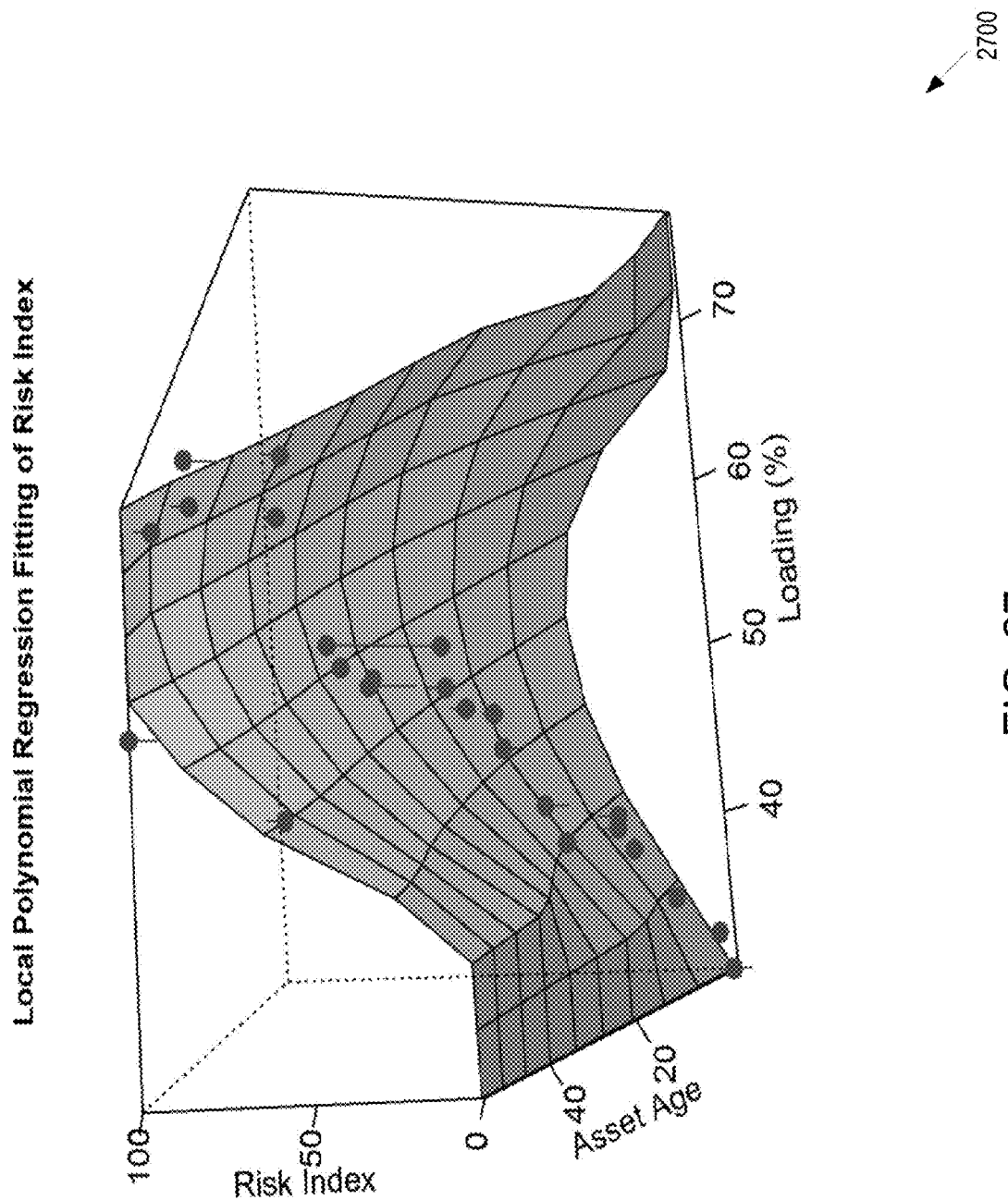
FIG. 27 shows an example of non-linear model

FIG. 27 shows an example of non-linear model 2700. When the linear model doesn't work well, other models may be used including: smoothing methods, tree based models or neutral network models. E.g., local regression (loess) is a non-parametric smoothing method. The method and variables for building the prediction model may vary with the properties of real data, such as the number of samples, the number of variables, the observed patterns, etc.

The asset status may be predicted by using the trained model. The trained model and variables may be used to predict the composite risk index when the input may include: the age of asset, and other variables used in modeling, such as loading, and the output may include: the estimated asset composite risk index and the converted predicted composite risk indices into the categories as shown in Table 25.

TABLE 25

| Category | Very good | Good | Fair | Poor | Very Poor |
| --- | --- | --- | --- | --- | --- |
| risk index | 1-15 | >15-30 | >30-50 | >50-70 | >70-100 |

Table 26 shows example logic for the investment sub-model. For the investment sub-model, the input may include asset Composite Risk Index and Constrains for replacement strategy. The constraints for replacement strategy may be one or multiple of the following constrains, including: annual quota in number of percentage, annual budget and unit price, and asset status threshold. The output of the investment sub-model may be list of asset(s) that need to be replaced.

TABLE 26

Constrain: Quota

1:  If quota is in number then
2:      Q = number of replacement
3:  else if option is quota in percentage then
4:      Q = floor(percentage * total number)
5:  end if Constrain: Budget 1:  B = floor(budget/unit price)

Constrain: Asset Status

1:  Count the number of assets that passed status threshold as S

Replacement

Figure 28:
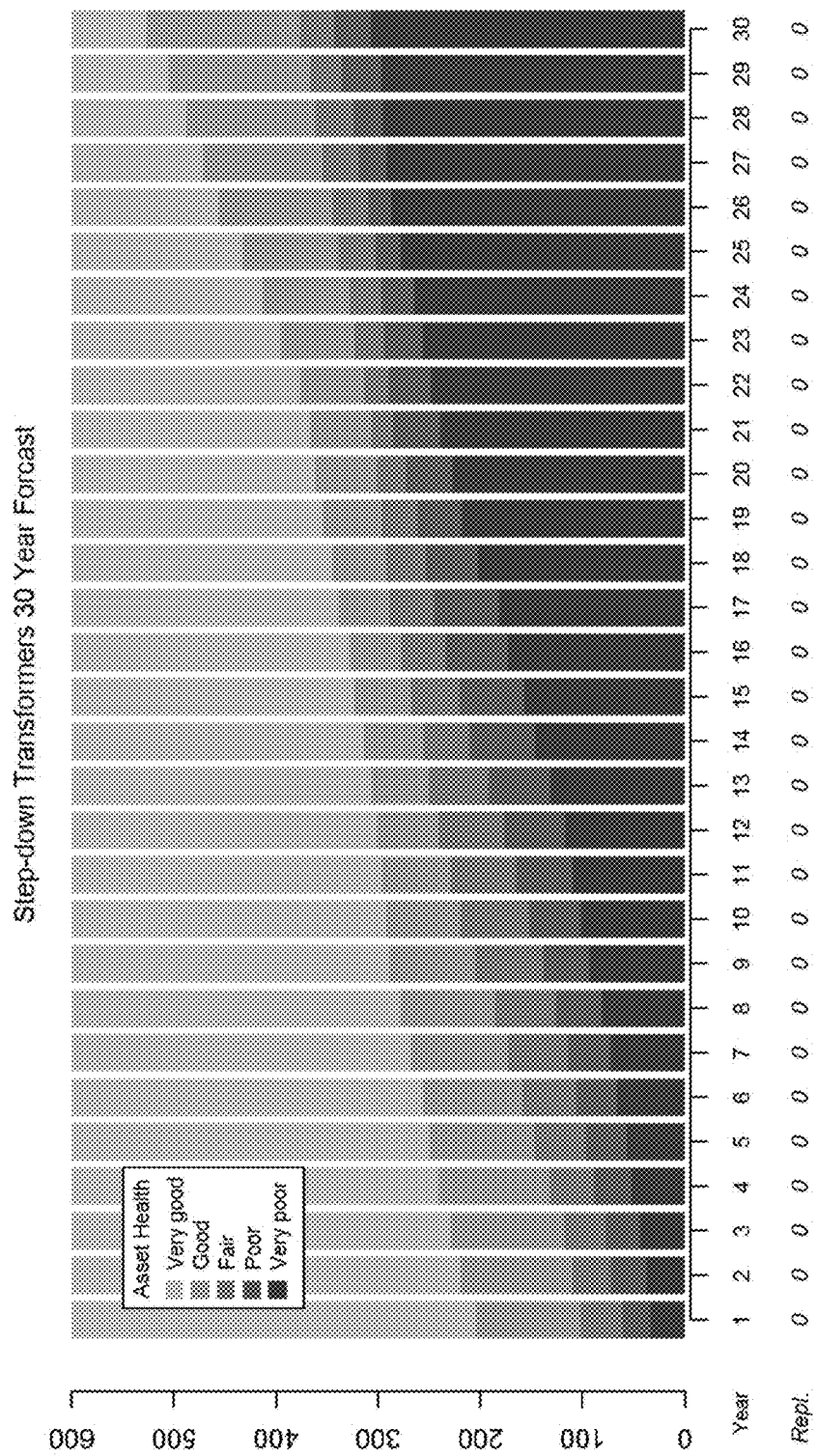
FIG. 28 shows an example of the simulation scenarios for no replacement for 25 years.
Figure 29:
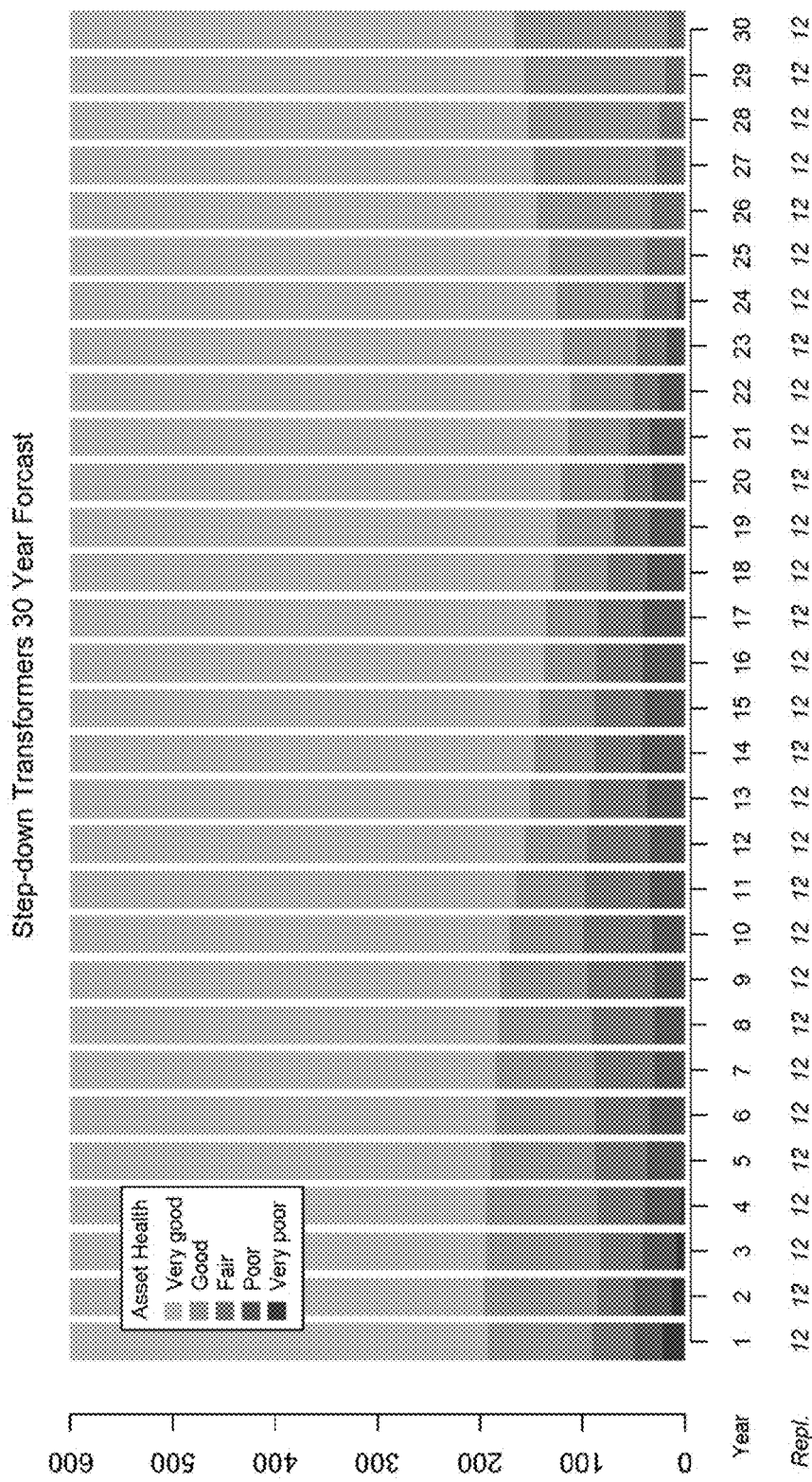
FIG. 29 shows an example of the simulation scenarios for replacing 12 assets with the worst condition each year for 25 years.
Figure 30:
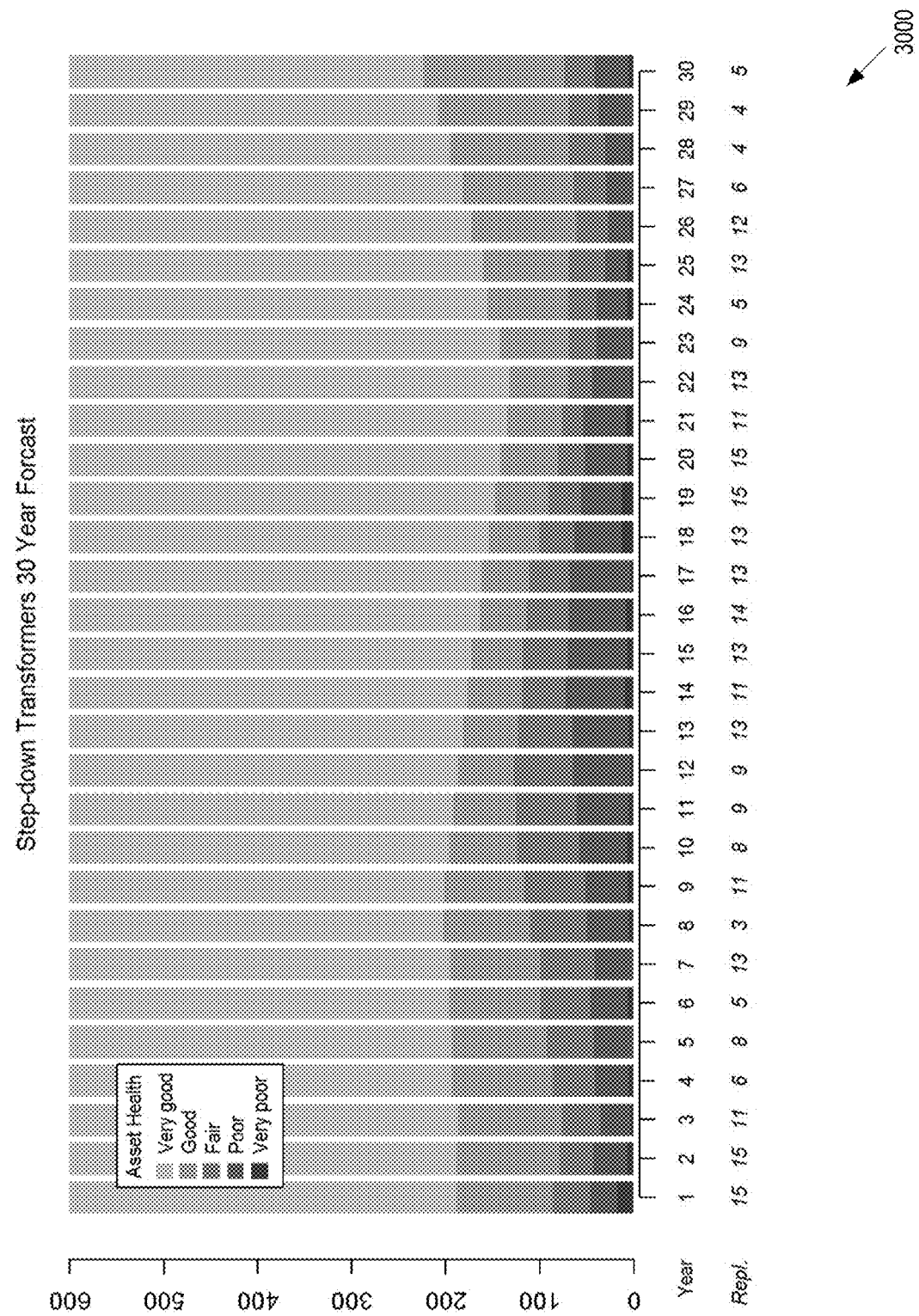
FIG. 30 shows an example of simulation scenarios for replacing assets with composite risk index that is greater than 72 but no more than 15 in a year (273 assets for 25 years).

1:  Set N is the minimum of the enabled constrains Q, B, and S
2:  Find the N assets with the worst Composite Risk Index and output FIGS. 28-30 show the three strategies of asset investment simulation that may be results of 600 transformers over 25 years. FIG. 28 shows an example of the simulation scenarios for no replacement for 25 years 2800. FIG. 29 may demonstrate simulation functionality and the asset status degradation. FIG. 29 shows an example of the simulation scenarios for replacing 12 assets with the worst condition each year for 25 years 2900. FIG. 29 may evaluate how the population evolves under a given replacement quota. FIG. 30 shows an example of simulation scenarios for replacing assets with composite risk index that is greater than 72 but no more than 15 in a year (273 assets for 25 years) 3000. FIG. 30 may evaluate how much cost is needed to keep a certain condition.

Figure 31:
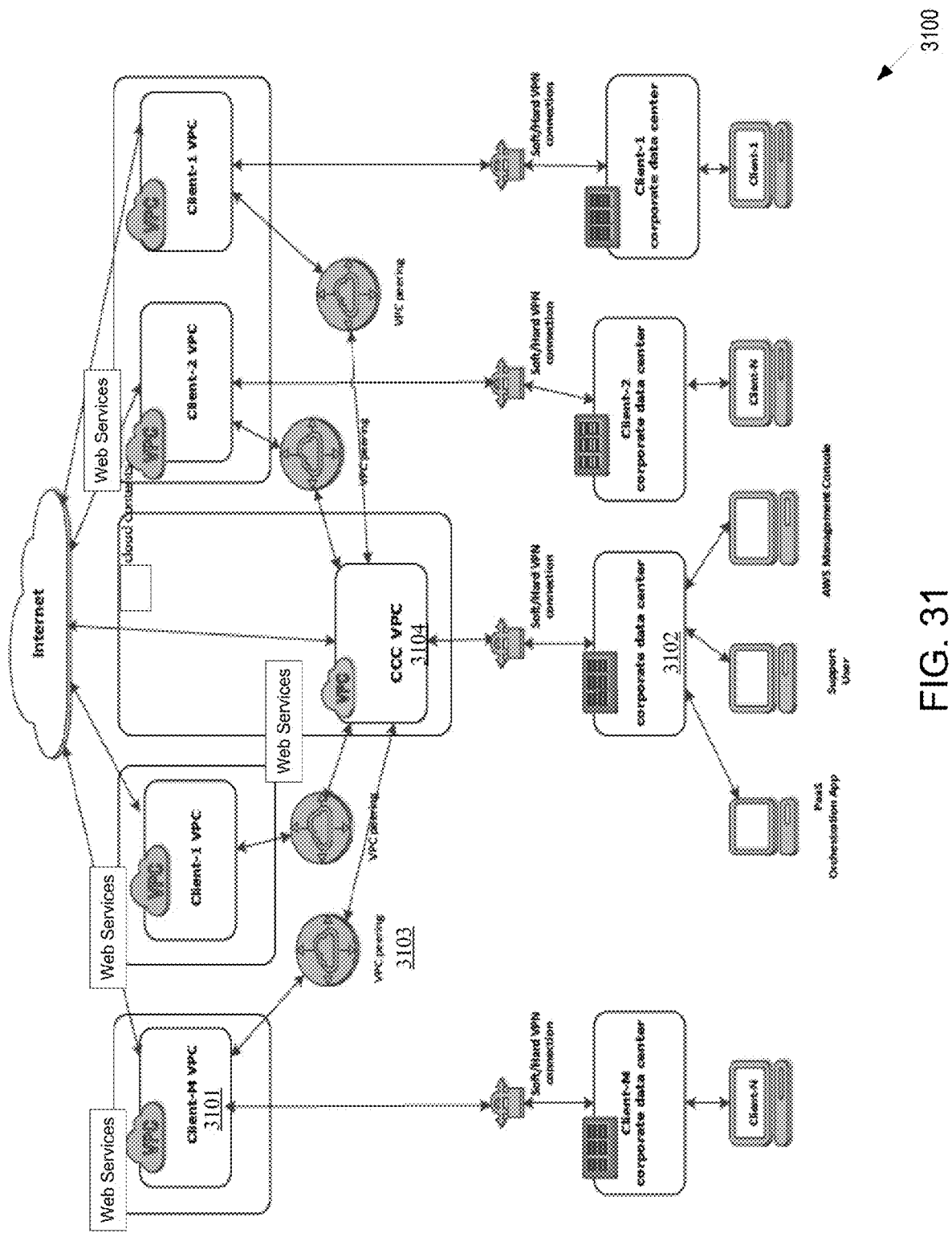
FIG. 31 shows an example of infrastructure architecture for the event sequencing for electrical power transmission and distribution equipment

FIG. 31 shows an example of infrastructure architecture for the event sequencing for electrical power transmission and distribution equipment 3100. As shown in FIG. 30, various client data point such as client-M Virtual Private Cloud (VPC) 3101 may connect with corporate data center 3102 via one or more intermedia relays such as VPC peering 3103 and Command Control Center (CCC) VPC 3104.

Figure 32:
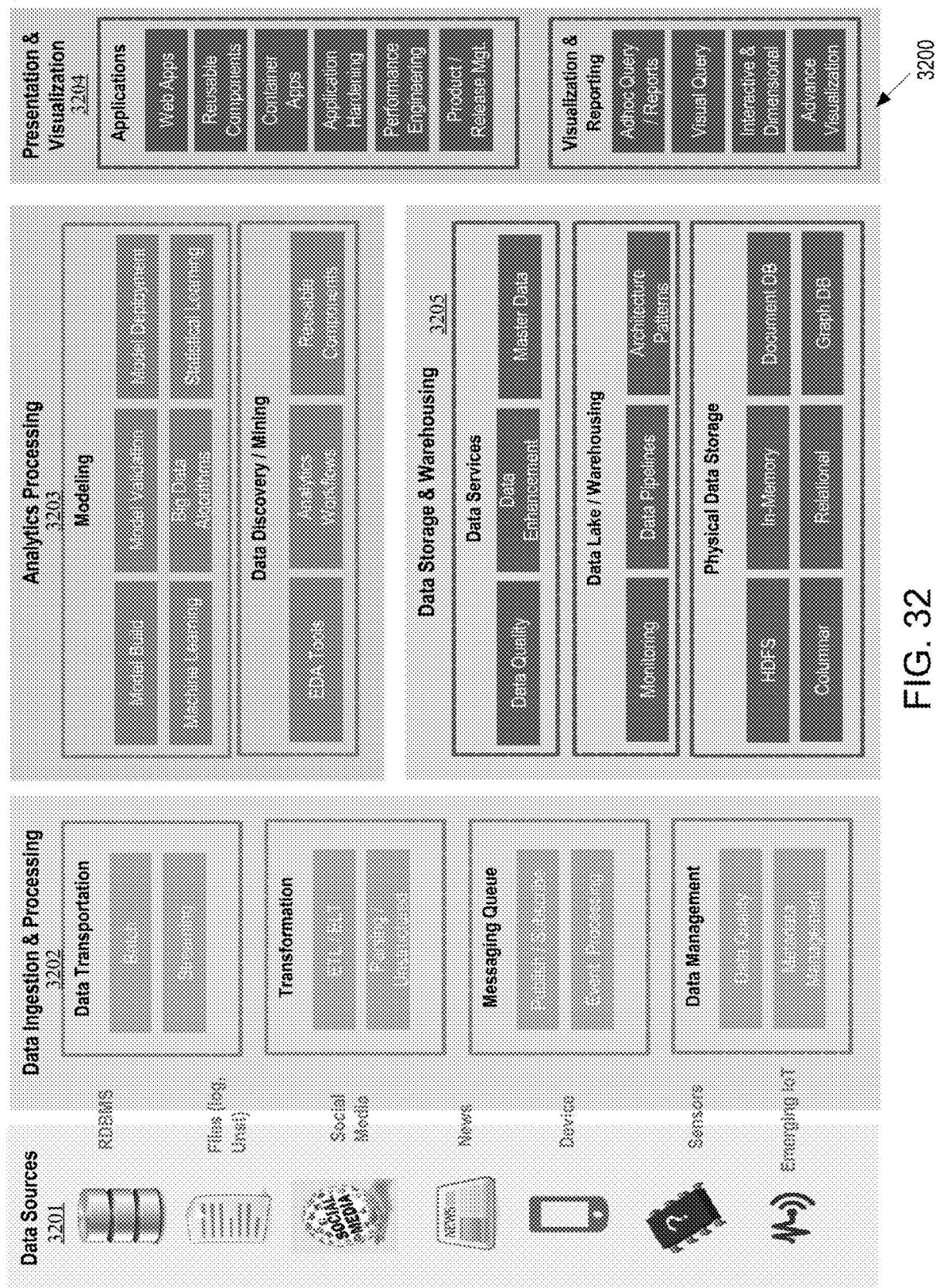
FIG. 32 shows an example of platform reference architecture for the event sequencing for electrical power transmission and distribution equipment.

FIG. 32 shows an example of platform reference architecture for the event sequencing for electrical power transmission and distribution equipment 3200. As shown in FIG. 32, the process of the event sequencing may include data sources 3201, data ingestion & processing 3202, analytics processing 3203, Data storage & warehousing 3205 and presentation & visualization 3204.

Figure 33:
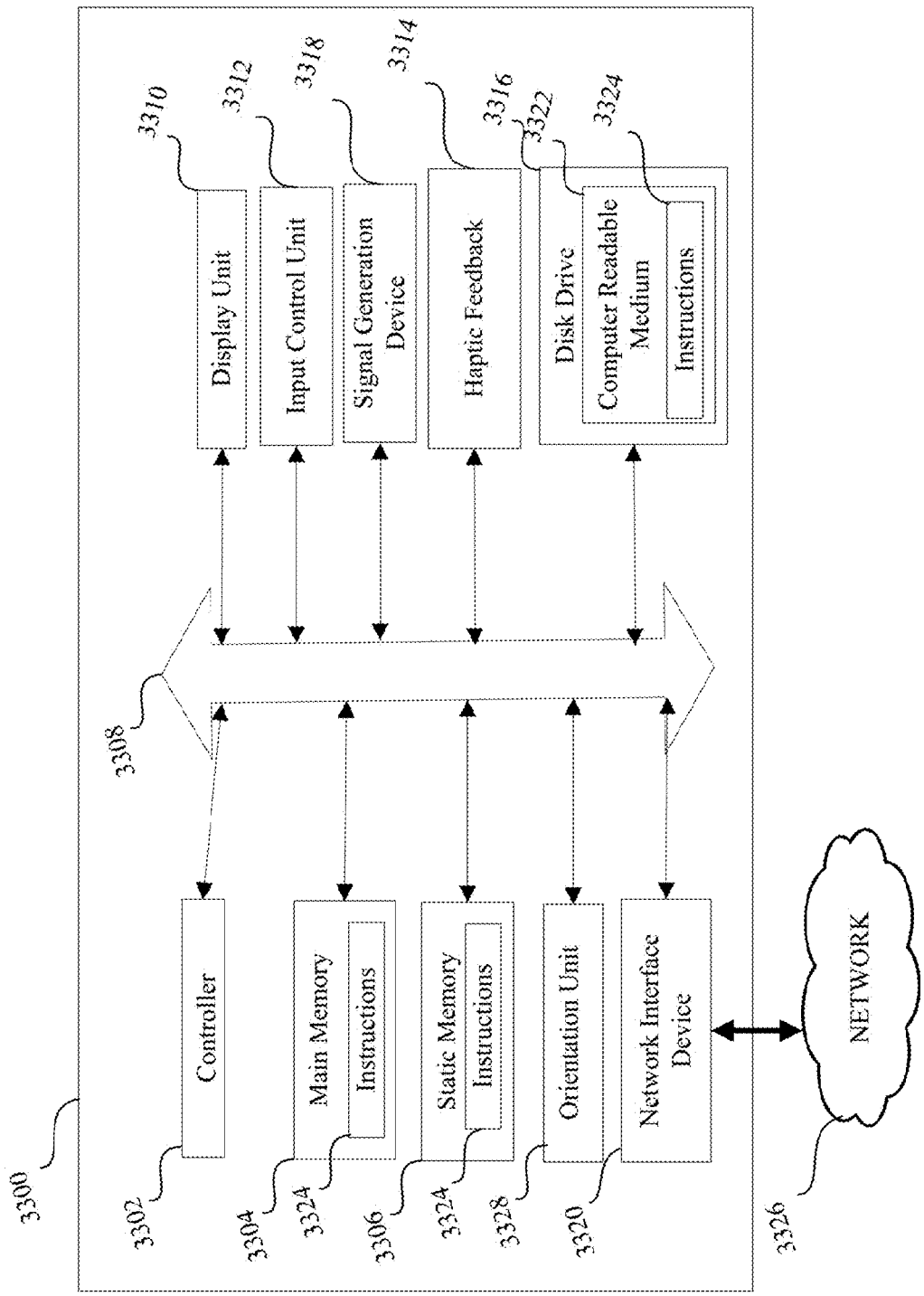
FIG. 33 illustrates an example of a computer system that may be used for the event sequencing for electrical power transmission and distribution equipment.

Referring to FIG. 33, an illustrative embodiment of a computer system that may be used for one or more of the components illustrated by the method and system in FIGS. 1-2, or in any other system configured to carry out the methods discussed in this disclosure herein, is shown and is designated 3300. Although the computer system 3300 is illustrated in FIG. 33 as including all of the components as illustrated, it is within the scope of this innovation for the computing system to be comprised of fewer, or more, components than just illustrated in FIG. 33.

The computer system 3300 can include a set of instructions 3324 that can be executed to cause the computer system 3300 to perform any one or more of the methods, processes or computer-based functions disclosed herein. For example, an event sequencing as described herein may be a program comprised of a set of instructions 3324 that are executed by the controller 3302 to perform any one or more of the methods, processes or computer-based functions described herein. Such a program may be stored in whole, or in any combination of parts, on one or more of the exemplary memory components illustrated in FIG. 33, such as the main memory 3304, static memory 3306, or disk drive 3316.

As described, the computer system 3300 may be mobile device. The computer system 3300 may also be connected using a network 3326, to other computer systems or peripheral devices. In a networked deployment, the computer system 3300 may operate in the capacity of a server or as a client user computer in a server-client user network environment, or as a peer computer system in a peer-to-peer (or distributed) network environment. In addition to embodiments in which the computer system 2600 is implemented, the computer system 3300 may also be implemented as, or incorporated into, various devices, such as a personal computer ("PC"), a tablet PC, a set-top box ("STB"), a personal digital assistant ("PDA"), a mobile device such as a smart phone or tablet, a palmtop computer, a laptop computer, a desktop computer, a network router, switch or bridge, or any other machine capable of executing a set of instructions (sequential or otherwise) that specify actions to be taken by that machine. In a particular embodiment, the computer system 3300 can be implemented using electronic devices that provide voice, video or data communication. Further, while a single computer system 3300 is illustrated, the term "system" shall also be taken to include any collection of systems or sub-systems that individually or jointly execute a set, or multiple sets, of instructions to perform one or more computer functions.

As illustrated in FIG. 33, the computer system 3300 may include a controller 3302, such as a central processing unit ("CPU"), a graphics processing unit ("GPU"), or both. Moreover, the computer system 3300 can include a main memory 3304, and additionally may include a static memory 3306. In embodiments where more than one memory components are included in the computer system 3300, the memory components can communicate with each other via a bus 3308. As shown, the computer system 3300 may further include a display unit 3310, such as a liquid crystal display ("LCD"), an organic light emitting diode ("OLED"), a flat panel display, a solid state display, or a cathode ray tube ("CRT"). Additionally, the computer system 3300 may include one or more input devices 3312, such as a keyboard, push button(s), scroll wheel, digital camera for image capture and/or visual command recognition, touch screen, touchpad or audio input device (e.g., microphone). The computer system 3300 can also include signal outputting components such as a haptic feedback component 3314 and a signal generation device 3318 that may include a speaker or remote control.

Although not specifically illustrated, the computer system 3300 may additionally include a GPS (Global Positioning System) component for identifying a location of the computer system 3300.

Additionally, the computer system 3300 may include an orientation unit 3328 that includes any combination of one or more gyroscope(s) and accelerometer(s).

The computer system 3300 may also include a network interface device 3320 to allow the computer system 3300 to communicate via wireless, or wired, communication channels with other devices. The network interface device 3320 may be an interface for communicating with another computer system via a Wi-Fi connection, Bluetooth connection, Near Frequency Communication connection, telecommunications connection, internet connection, wired Ethernet connection, or the like. The computer system 3300 may also optionally include a disk drive unit 3316 for accepting a computer readable medium 3322. The computer readable medium 3322 may include a set of instructions that are executable by the controller 3302, and/or the computer readable medium 3322 may be utilized by the computer system 3300 as additional memory storage.

In a particular embodiment, as depicted in FIG. 33, the disk drive unit 3316 may include a computer-readable medium 3322 in which one or more sets of instructions 3324, such as software, can be embedded. Further, the instructions 3324 may embody one or more of the methods, processes, or logic as described herein. In a particular embodiment, the instructions 3324 may reside completely, or at least partially, within the main memory 3304, the static memory 3306, and/or within the controller 3302 during execution by the computer system 3300. The main memory 3304 and the controller 3302 also may include computer-readable media.

In an alternative embodiment, dedicated hardware implementations, including application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present computer system 2600 may encompass software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium 3322 that includes instructions 3324 or receives and executes instructions 3324 responsive to a propagated signal; so that a device connected to a network 3326 can communicate voice, video or data over the network 3326. Further, the instructions 3324 may be transmitted or received over the network 3326 via the network interface device 3320.

While the computer-readable medium 3324 is shown to be a single medium, the term "computer-readable medium" includes a single medium or multiple media, such as a centralized or distributed database, and/or associated caches and servers that store one or more sets of instructions. The term "computer-readable medium" shall also include any tangible medium that is capable of storing, encoding or carrying a set of instructions for execution by a processor or that cause a computer system to perform any one or more of the methods or operations disclosed herein.

In a particular non-limiting, exemplary embodiment, the computer-readable medium 3322 can include a solid-state memory such as a memory card or other package that houses one or more non-volatile read-only memories, such as flash memory. Further, the computer-readable medium 3322 can be a random access memory or other volatile re-writable memory. Additionally, the computer-readable medium 3322 can include a magneto-optical or optical medium, such as a disk or tapes or other storage device to capture information communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium 3322 or a distribution medium and other equivalents and successor media, in which data or instructions may be stored. The computer readable medium may be either transitory or non-transitory.

Although the present specification describes components and functions that may be implemented in particular embodiments with reference to particular standards and protocols commonly used by power systems, the invention is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

The principles described herein may be embodied in many different forms. Not all of the depicted components may be required, however, and some implementations may include additional components. Variations in the arrangement and type of the components may be made without departing from the spirit or scope of the claims as set forth herein. Additional, different or fewer components may be provided.

Reference throughout this specification to "one example," "an example," "examples," "one embodiment," "an embodiment," "example embodiment," or the like in the singular or plural means that one or more particular features, structures, or characteristics described in connection with an embodiment or an example is included in at least one embodiment or one example of the present disclosure. Thus, the appearances of the phrases "in one embodiment," "in an embodiment," "in an example embodiment," "in one example," "in an example," or the like in the singular or plural in various places throughout this specification are not necessarily all referring to the same embodiment or a single embodiment. Furthermore, the particular features, structures, or characteristics may be combined in any suitable manner in one or more embodiments or examples.

The terminology used in the description herein is for the purpose of describing particular examples only and is not intended to be limiting. As used herein, the singular forms "a," "an," and "the" are intended to include the plural forms as well, unless the context clearly indicates otherwise. Also, as used in the description herein and throughout the claims that follow, the meaning of "in" includes "in" and "on" unless the context clearly dictates otherwise. It will also be understood that the term "and/or" as used herein refers to and encompasses any and all possible combinations of one or more of the associated listed items. It will be further understood that the terms "may include," "including," "comprises," and/or "comprising," when used in this specification, specify the presence of stated features, operations, elements, and/or components, but do not preclude the presence or addition of one or more other features, operations, elements, components, and/or groups thereof.

The exemplary environment may include a server, a client, and a communication network. The server and the client may be coupled through the communication network for information exchange, such as sending/receiving identification information, sending/receiving data files such as splash screen images, etc. Although only one client and one server are shown in the environment, any number of terminals or servers may be included, and other devices may also be included.

The described communication between devices may include any appropriate type of communication network for providing network connections to the server and client or among multiple servers or clients. For example, communication network may include the Internet or other types of computer networks or telecommunication networks, either wired or wireless. In embodiments, the disclosed methods and apparatus may be implemented, for example, in a wireless network that includes at least one client.

In some cases, the client may refer to any appropriate user terminal with certain computing capabilities, such as a personal computer (PC), a work station computer, a server computer, a hand-held computing device (tablet), a smart phone or mobile phone, or any other user-side computing device. In various embodiments, the client may include a network access device. The client may be stationary or mobile.

A server, as used herein, may refer to one or more server computers configured to provide certain server functionalities, such as database management and search engines. A server may also include one or more processors to execute computer programs in parallel.

It should be noticed that, the embodiments/examples and the features in the embodiments/examples may be combined with each other in a no conflict condition. The inventive aspects will become apparent from the detailed description when taken in conjunction with the accompanying drawings.

It should be noticed that, the steps illustrated in the flowchart of the drawings may be performed in a set of computer devices using executable program code. And the order of the steps may be different from that in the drawings under some status, although an example logic order is shown in the flowchart.

It is to be understood that, all examples provided above are merely some of the preferred examples of the present disclosure. For one skilled in the art, the present disclosure is intended to cover various modifications and equivalent arrangements included within the principle of the disclosure.

The invention claimed is:

1. A system for monitoring and controlling replacement of electrical power transmission and distribution equipment in a power system, comprising:
   a memory;
   a display;
   a communication interface;
   circuitry in communication with the memory, the communication interface and the display, the circuitry comprising:
   a monitoring subroutine for ingesting data received from monitored electrical power transmission and distribution equipment and storing said ingested data in the memory;
   a first sub-model configured to develop a future equipment sequence for the electrical power transmission and distribution equipment in the power system, wherein the condition sequence reflects a future condition of the electrical power transmission and distribution equipment, and the first sub-model is trained by using the ingested data that are received from monitoring the electrical power transmission and distribution equipment;
   a second sub-model configured to develop a replacement control scheme according to the trained first sub-model, wherein the replacement control scheme is executed to replace utilities assets comprising electrical power transmission and distribution equipment in the power system;
   wherein the second sub-model is constructed by using a plurality of future maintenance constraints for the electrical power transmission and distribution equipment; and
   wherein an input of the first sub-model is updated according to the constructed second model, and the developed condition sequence and an output from the developed replacement control scheme are displayed in a user interface on the display.

2. The system of claim 1, wherein the first sub-model is trained by using a subset of the ingested data comprising demographics data, utilization data, maintenance data, performance data and criticality data for the electrical power transmission and distribution equipment.

3. The system of claim 1, wherein the second sub-model is further updated according to the updated first sub-model.

4. The system of claim 3, wherein the first sub-model and the second sub-model are updated iteratively.

5. An event sequencing system for electrical power transmission and distribution equipment in a power system, comprising:
   a memory;
   a display;
   a communication interface configured to receive:
      demographics data representing an equipment parameter that correlates to a life expectancy of the electrical power transmission and distribution equipment,
      utilization data that is used to detect when the electrical power transmission and distribution equipment exceeds its design capability,
      maintenance data representing costs that are associated with maintaining the electrical power transmission and distribution equipment,
      performance data containing forced outages that reflect reliability of the electrical power transmission and distribution equipment,
      criticality data comprising a look-up table populated with the criticality data that reflect importance of the electrical power transmission and distribution equipment in the power system, and
      condition data comprising test result data of the electrical power transmission and distribution equipment in the power system;
   a sequencing database configured to store the demographics data, the utilization data, the maintenance data, the performance data, criticality data and the condition data from the communication interface;
   sequencing generation circuitry in communication with the sequencing database, the sequencing generation circuitry configured to:
      develop a demographics sub-sequence by using the demographics data,
      develop a utilization sub-sequence by using the utilization data,
      develop a maintenance sub-sequence by using the maintenance data,
      develop a performance sub-sequence by using the performance data,
      develop a criticality sub-sequence by using the criticality data,
      develop a condition sub-sequence by using the condition data, develop a composite sequence for a plurality of utilities assets comprising electrical power transmission and distribution equipment in the power system by using the demographics sub-sequence, the utilization sub-sequence, the maintenance sub-sequence, the performance sub-sequence, the criticality sub-sequence, and the condition sub-sequence, display the composite sequence in a first user interface of the display, and establish a first sub-model to predict a future equipment sequence by using the composite sequence, train the first sub-model by using a subset of the demographics data, the utilization data, the maintenance data, the performance data and the criticality data, construct a second sub-model by using a plurality of future maintenance constraints, develop a replacement control scheme of utilities assets comprising the electrical power transmission and distribution equipment in the power system according to the trained first sub-model and the second sub-model, display an output of the replacement control scheme in a second user interface of the display, and update an input of the first sub-model according to the constructed second sub-model.

6. The system of claim 5, wherein the communication interface is configured to further receive the condition data comprising dissolved gas data or insulation resistance data for the electrical power transmission and distribution equipment, and the sequencing generation circuitry is configured to develop a Duval Triangle by using the dissolved gas data and develop an insulation resistance sub-sequence by using the insulation resistance data, and develop the condition sub-sequence by using the Duval Triangle or the insulation resistance sub-sequence.

7. The system of claim 5, wherein the sequencing generation circuitry configured to develop the demographics sub-sequence determines a demographics raw score according to the life expectancy of the electrical power transmission and distribution equipment and converts the demographics raw score to a normalized demographics risk index according to a pre-determined demographics scale.

8. The system of claim 7, wherein the sequencing generation circuitry configured to develop the demographics sub-sequence displays a relationship between the demographics raw score and the normalized demographics score in a third user interface of the display according to a user input value.

9. The system of claim 5, wherein the sequencing generation circuitry configured to develop the utilization sub-sequence determines a utilization raw score according to occurrences of a heavy loading condition and an overloading condition of the electrical power transmission and distribution equipment, wherein the heavy loading condition has a rated capacity of 80%-100% and the overloading condition exceeds 100% of the rated capacity.

10. The system of claim 5, wherein the sequencing generation circuitry configured to develop the maintenance sub-sequence determines a maintenance raw score by using an emergency operation cost and a corrective operation cost and convert.

11. The system of claim 5, wherein the sequencing generation circuitry configured to develop the performance sub-sequence determines a performance raw score according to forced outage hours of the electrical power transmission and distribution equipment.

12. The system of claim 5, wherein the sequencing generation circuitry configured to develop the criticality sub-sequence determines a criticality raw score according to data availability of criticality of station and transformer, cost of transformer, relate capacity and average historical loading.

13. The system of claim 5, wherein the sequencing generation circuitry is further configured to update the replacement control scheme of utilities assets comprising the electrical power transmission and distribution equipment in the power system by using the updated first sub-model and the updated second model.

14. The system of claim 5, wherein the sequencing generation circuitry is further configured to generate a utilities asset condition for the utilities assets comprising the electrical power transmission and distribution equipment in the power system according to the first sub-model and the updated first sub-model, and displays the utilities asset condition in the second user interface of the display.

15. An event sequencing method for electrical power transmission and distribution equipment in a power system, comprising:

receiving, from a communication interface, demographics data representing an equipment parameter that correlates to a life expectancy of the electrical power transmission and distribution equipment;

receiving, from the communication interface, utilization data that is used to detect when the electrical power transmission and distribution equipment exceeds its design capability;

receiving, from the communication interface, maintenance data representing costs that are associated with maintaining the electrical power transmission and distribution equipment;

receiving, from the communication interface, performance data containing forced outages that reflect reliability of the electrical power transmission and distribution equipment;

receiving, from the communication interface, criticality data comprising a look-up table populated with the criticality data that reflect importance of the electrical power transmission and distribution equipment in the power system;

receiving, from the communication interface, condition data comprising test result data of the electrical power transmission and distribution equipment in the power system;

storing the demographics data, the utilization data, the maintenance data, the performance data, the criticality data and the condition data from the communication interface into a sequencing database;

developing, by sequencing generation circuitry, a demographics sub-sequence by using the demographics data;

developing, by the sequencing generation circuitry, a utilization sub-sequence by using the utilization data;

developing, by the sequencing generation circuitry, a maintenance sub-sequence by using the maintenance data;

developing, by the sequencing generation circuitry, a performance sub-sequence by using the performance data;

developing, by the sequencing generation circuitry, a criticality sub-sequence by using the criticality data;

developing, by the sequencing generation circuitry, a condition sub-sequence by using the condition data;

developing, by the sequencing generation circuitry, a composite sequence for a plurality of utilities assets comprising electrical power transmission and distribution equipment in the power system by using the demographics sub-sequence, the utilization sub-sequence, the maintenance sub-sequence, the performance sub-sequence, the criticality sub-sequence, and the condition sub-sequence;

displaying, by the sequencing generation circuitry, the composite sequence in a first user interface;

establishing, a first sub-model to predict a future equipment sequence by using the composite sequence;

training the first sub-model by using a subset of the demographics data, the utilization data, the maintenance data, the performance data, the criticality data, and the condition data;

constructing a second sub-model by using a plurality of future maintenance constraints;

developing a replacement control scheme of utilities assets comprising the electrical power transmission and distribution equipment in the power system according to the trained first sub-model and the second sub-model;

displaying an output of the replacement control scheme in a second user interface; and updating an input of the first sub-model according to the constructed second sub-model.

16. The method of claim 15, further comprising:

receiving, from the communication interface, condition data including dissolved gas data or insulation resistance data for the electrical power transmission and distribution equipment;

developing a Duval Triangle by using the dissolved gas data and developing an insulation resistance sub-sequence by using the insulation resistance data; and developing the condition sub-sequence by using the Duval Triangle or the insulation resistance sub-sequence.

17. The method of claim 15, further comprising:

determining a demographics raw score according to the life expectancy of the electrical power transmission and distribution equipment; and converting the demographics raw score to a normalized demographics risk index according to a pre-determined demographics scale.

18. The method of claim 17, further comprising:

displaying a relationship between the demographics raw score and the normalized demographics risk index in a third user interface according to a user input value.

19. The method of claim 15, further comprising:

determining a utilization risk index according to occurrences of a heavy loading condition and an overloading condition of the electrical power transmission and distribution equipment, wherein the heavy loading condition has a rated capacity of 80%-100% and the overloading condition exceeds 100% of the rated capacity.

20. The method of claim 15, further comprising:

determining a maintenance risk index by using an emergency operation cost and a corrective operation cost and convert.

21. The method of claim 15, further comprising:

determining a performance risk index according to forced outage hours of the electrical power transmission and distribution equipment.

22. The method of claim 15, further comprising:

determining a criticality risk index according to data availability of criticality of station and transformer, cost of transformer, relate capacity and average historical loading.

23. The method of claim 15, further comprising:

updating the replacement control scheme of utilities assets comprising the electrical power transmission and distribution equipment in the power system by using the updated first sub-model and the updated second model.

24. The method of claim 15, further comprising:

generating a utilities asset condition for the utilities assets comprising the electrical power transmission and distribution equipment in the power system according to the first sub-model and the updated first sub-model, and displays the utilities asset condition in the second user interface.

* * * * *